US012701787B2

(12) United States Patent
Hwang et al.

(10) Patent No.: US 12,701,787 B2
(45) Date of Patent: Aug. 4, 2026

(54) SEMICONDUCTOR DEVICE AND METHOD OF FABRICATING THE SAME

(71) Applicant: Samsung Electronics Co., Ltd., Suwon-si (KR)

(72) Inventors: Junsun Hwang, Suwon-si (KR); Sewoong Park, Suwon-si (KR); JeongHo Lee, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 382 days.

(21) Appl. No.: 18/504,479

(22) Filed: Nov. 8, 2023

(65) Prior Publication Data

US 2024/0178230 A1 May 30, 2024

(30) Foreign Application Priority Data

Nov. 28, 2022 (KR) ........................ 10-2022-0161297

(51) Int. Cl.
*H10D 84/90* (2025.01)

(52) U.S. Cl.
CPC ......... *H10D 84/907* (2025.01); *H10D 84/953* (2025.01); *H10D 84/975* (2025.01)

(58) Field of Classification Search
CPC ... H10D 84/907; H10D 84/953; H10D 84/975
USPC ....................................................... 257/208
See application file for complete search history.

(56) References Cited

U.S. PATENT DOCUMENTS

| | | | |
|---|---|---|---|
| 7,413,833 B2 | 8/2008 | Butt et al. | |
| 9,240,321 B2 | 1/2016 | Iida et al. | |
| 9,704,862 B2 * | 7/2017 | Park | H10D 84/853 |
| 10,192,968 B2 | 1/2019 | You et al. | |
| 11,264,482 B2 | 3/2022 | Kim et al. | |
| 2002/0110765 A1 | 8/2002 | Lai et al. | |
| 2011/0316165 A1 | 12/2011 | You et al. | |
| 2013/0087828 A1 | 4/2013 | Koshimizu et al. | |
| 2018/0358345 A1 * | 12/2018 | Qian | H10D 89/10 |
| 2019/0081160 A1 * | 3/2019 | Suh | H10D 30/0245 |
| 2019/0267366 A1 * | 8/2019 | Do | H10D 84/0188 |
| 2021/0028298 A1 | 1/2021 | Shin et al. | |
| 2021/0075406 A1 * | 3/2021 | Kim | H03K 3/0372 |
| 2021/0209287 A1 * | 7/2021 | Chen | H10D 89/10 |
| 2022/0139903 A1 | 5/2022 | Hung et al. | |

(Continued)

FOREIGN PATENT DOCUMENTS

| | | |
|---|---|---|
| KR | 100744659 B1 | 8/2007 |
| KR | 10-2008-0113839 A | 12/2008 |

(Continued)

*Primary Examiner* — Jami Valentine Miller
(74) *Attorney, Agent, or Firm* — Harness, Dickey & Pierce, P.L.C.

(57) ABSTRACT

Disclosed are a semiconductor device and a method of fabricating the same. The semiconductor device includes a substrate including a cell disposing region and a first block border region, a plurality of gate electrodes on the cell disposing region and extending to the first block border region in a first direction to be parallel to each other, the gate electrodes including a first and second gate electrode, which are adjacent to each other, and a first connection structure on the first block border region, wherein the first connection structure is configured to physically connect the first and second gate electrodes to each other.

20 Claims, 50 Drawing Sheets

(56)                    References Cited

U.S. PATENT DOCUMENTS

| | | | | |
|---|---|---|---|---|
| 2022/0384595 A1* | 12/2022 | Kang | ......................... | G03F 1/36 |
| 2023/0238459 A1* | 7/2023 | Müller-Meskamp | ....................... | H10D 30/657 |
| | | | | 257/339 |
| 2023/0268270 A1* | 8/2023 | Radhakrishna | ..... | H10W 20/493 |
| | | | | 327/525 |
| 2024/0030345 A1* | 1/2024 | Lee | ....................... | H10D 30/701 |
| 2024/0178230 A1* | 5/2024 | Hwang | ................ | H10D 84/907 |
| 2026/0060621 A1* | 3/2026 | Howard | ............... | A61B 5/7282 |

FOREIGN PATENT DOCUMENTS

| | | | |
|---|---|---|---|
| KR | 10-2011-0088942 A | 8/2011 | |
| KR | 10-2020-0124114 A | 11/2020 | |

* cited by examiner

SEMICONDUCTOR DEVICE AND METHOD OF FABRICATING THE SAME

CROSS-REFERENCE TO RELATED APPLICATIONS

This U.S. non-provisional patent application claims priority under 35 U.S.C. § 119 to Korean Patent Application No. 10-2022-0161297, filed on Nov. 28, 2022, in the Korean Intellectual Property Office, the entire contents of which are hereby incorporated by reference.

BACKGROUND

The present disclosure relates to semiconductor devices and/or methods of fabricating the same, and in particular, to semiconductor devices including a field effect transistor and methods of fabricating the same.

A semiconductor device includes an integrated circuit consisting of metal-oxide-semiconductor field-effect transistors (MOS-FETs). To meet an increasing demand for a semiconductor device with a small pattern size and a reduced design rule, the MOS-FETs are being aggressively scaled down. The scale-down of the MOS-FETs may lead to deterioration in operational properties of the semiconductor device. A variety of studies are being conducted to overcome technical limitations associated with the scale-down of the semiconductor device and to realize high-performance semiconductor devices.

SUMMARY

Some example embodiments of the inventive concepts provide semiconductor devices with improved reliability.

Some example embodiments of the inventive concepts provide methods of fabricating a semiconductor device with improved reliability.

According to an example embodiment of the inventive concepts, a semiconductor device may include a substrate including a cell disposing region and a first block border region, a plurality of gate electrodes, which are disposed on the cell disposing region and are extended to the first block border region in a first direction to be parallel to each other, the plurality of gate electrodes including a first gate electrode and a second gate electrode, which are adjacent to each other, and a first connection structure on the first block border region. The first connection structure may be configured to physically connect the first and second gate electrodes to each other. The first connection structure may include a rounded inner side surface and a rounded outer side surface, and the rounded outer side surface may include a first outer side surface, a second outer side surface, and a third outer side surface. The first outer side surface may extend in a second direction crossing the first direction, and the third outer side surface may extend in the first direction. The second outer side surface may connect the first outer side surface to the third outer side surface. The first outer side surface may have a first length, and a distance between the first and second gate electrodes may be a first pitch. A ratio of the first length to the first pitch may range from 0.87 to 1.

According to an example embodiment of the inventive concepts, a semiconductor device may include a substrate including a cell disposing region and a block border region, an active pattern on the cell disposing region, channel patterns and source/drain patterns on the active pattern, gate electrodes provided on the channel patterns, respectively, and extended from the cell disposing region to the block border region, and a connection structure on the block border region. The connection structure may be configured to physically connect the gate electrodes to each other, and the connection structure may include a rounded inner side surface and a rounded outer side surface. A curvature radius of the rounded outer side surface may be larger than a curvature radius of the rounded inner side surface.

According to an example embodiment of the inventive concepts, a semiconductor device may include a substrate including a cell disposing region and a block border region, the cell disposing region including a PMOSFET region and an NMOSFET region, a first active pattern on the PMOSFET region and a second active pattern on the NMOSFET region, a first channel pattern and a first source/drain pattern on the first active pattern, a second channel pattern and a second source/drain pattern on the second active pattern, a gate electrode extended in a first direction to cross the first and second channel patterns, a connection structure on the block border region, a gate insulating layer interposed between the gate electrode and the first and second channel patterns, gate spacers provided on opposite side surfaces of the gate electrode, respectively, a gate capping pattern on a top surface of the gate electrode, a gate cutting pattern penetrating the gate electrode, a gate contact electrically connected to the gate electrode, an active contact electrically connected to at least one of the first and second source/drain patterns, a first metal layer on the gate contact and the active contact, and a second metal layer on the first metal layer. The first metal layer may include first interconnection lines, which are connected to the gate contact and the active contact, respectively. And the second metal layer may include second interconnection lines, which are electrically connected to the first interconnection lines. The gate electrode may include a first gate electrode and a second gate electrode, which are adjacent to each other, and the connection structure may be configured to physically connect the first and second gate electrodes to each other. The connection structure may include a rounded inner side surface and a rounded outer side surface. The gate spacers may be extended along the first and second gate electrodes and may be provided on the rounded outer side surface and the rounded inner side surface, respectively.

According to an example embodiment of the inventive concepts, a method of fabricating a semiconductor device may include forming an active pattern on a substrate, forming a sacrificial pattern on the active pattern, the sacrificial pattern including a first sacrificial pattern, a second sacrificial pattern, and a preliminary connection structure connecting the first and second sacrificial patterns to each other, and replacing the first sacrificial pattern, the second sacrificial pattern, and the preliminary connection structure with a metal pattern to form a first gate electrode, a second gate electrode, and a connection structure, respectively. The first and second sacrificial patterns may be line-shaped patterns which are extended to be parallel to each other, and the preliminary connection structure may be provided to physically connect end portions of the first and second sacrificial patterns to each other. The forming of the sacrificial pattern may include forming a sacrificial layer on the substrate, forming a hard mask layer on the sacrificial layer, forming a hard mask pattern by patterning the hard mask layer using an EUV lithography process, and patterning the sacrificial layer using the hard mask pattern as an etch mask.

DETAILED DESCRIPTION

While the term "same," "equal" or "identical" is used in description of example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Figure 1:
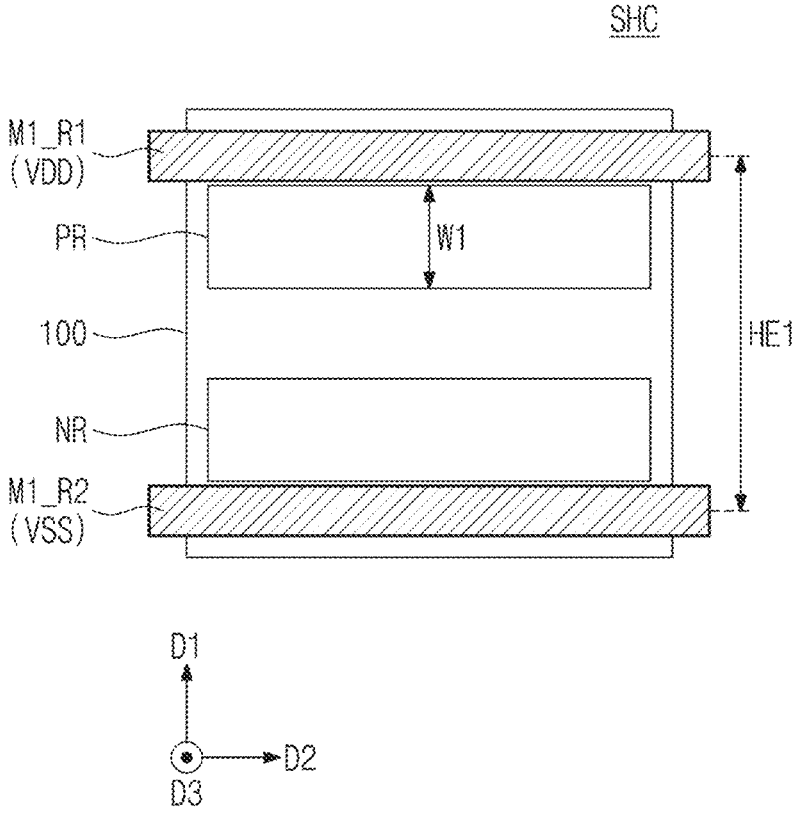
FIGS. 1 to 3 are conceptual diagrams illustrating logic cells in a semiconductor device according to an example embodiment of the inventive concepts.
Figure 2:
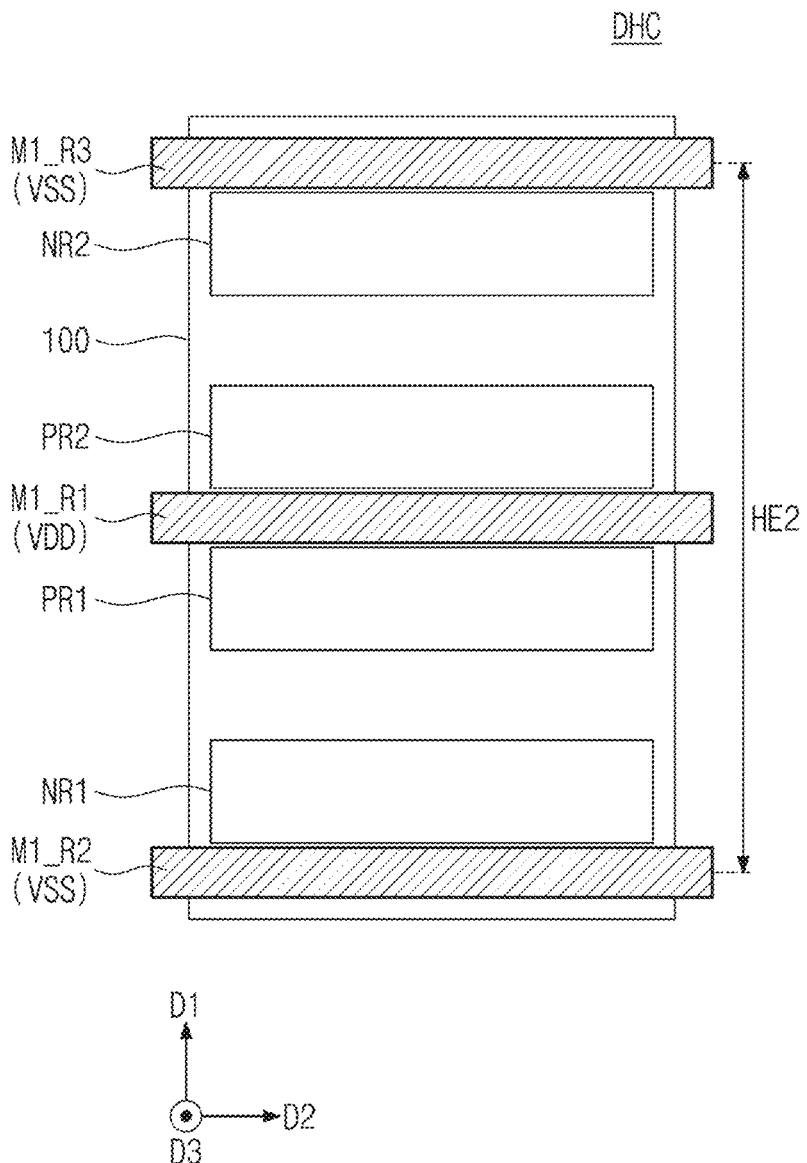
Figure 3:
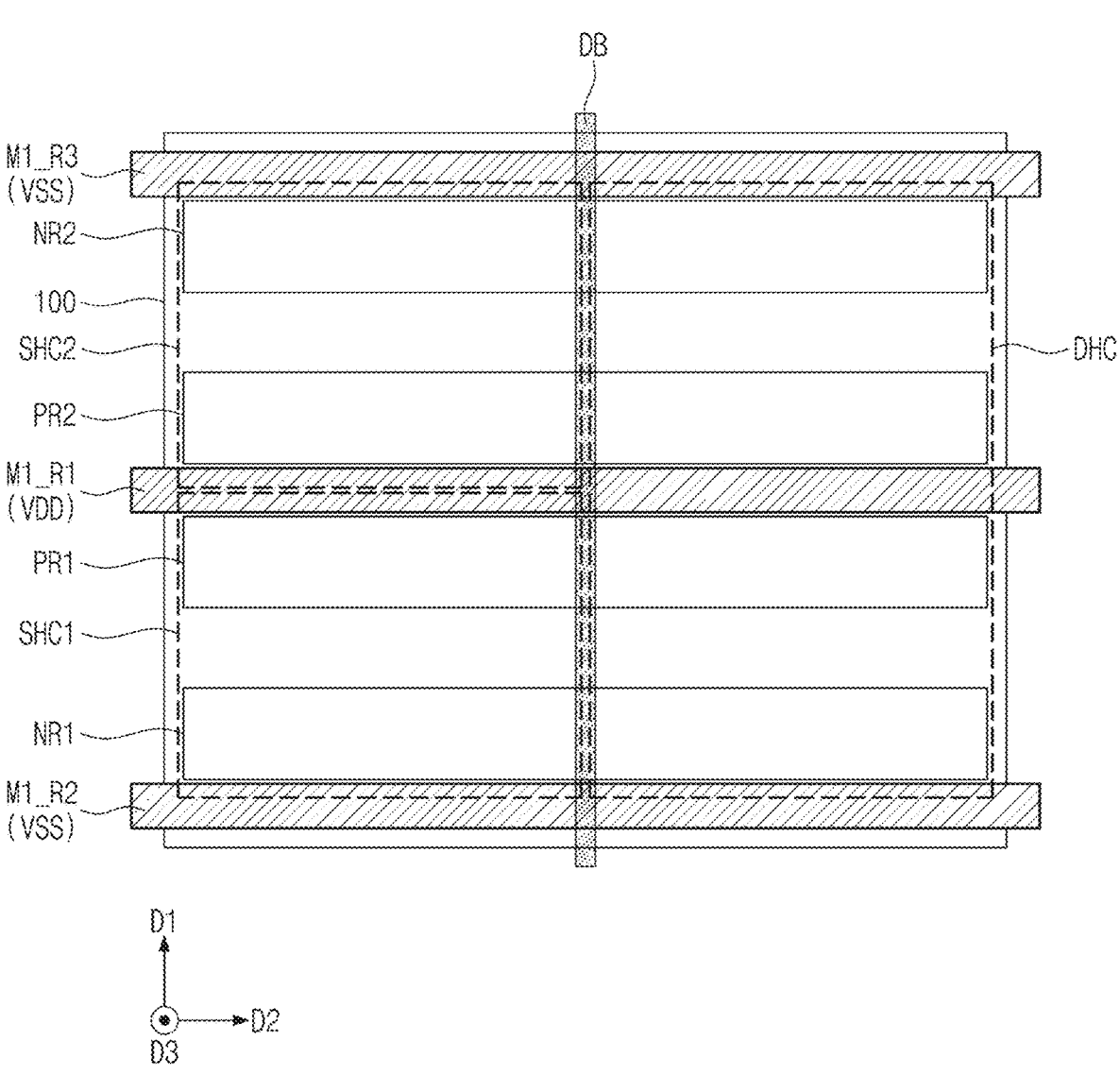

FIGS. 1 to 3 are conceptual diagrams illustrating logic cells in a semiconductor device according to an example embodiment of the inventive concepts.

Referring to FIG. 1, a single height cell SHC may be provided. For example, a first power line M1_R1 and a second power line M1_R2 may be provided on a substrate 100. The first power line M1_R1 may be a conduction path, to which a drain voltage VDD (e.g., a power voltage) is provided. The second power line M1_R2 may be a conduction path, to which a source voltage VSS (e.g., a ground voltage) is provided.

The single height cell SHC may be defined between the first power line M1_R1 and the second power line M1_R2. The single height cell SHC may include one PMOSFET region PR and one NMOSFET region NR. In other words, the single height cell SHC may have a CMOS structure provided between the first and second power lines M1_R1 and M1_R2.

Each of the PMOSFET and NMOSFET regions PR and NR may have a first width W1 in a first direction D1. A length of the single height cell SHC in the first direction D1 may be defined as a first height HEL. The first height HE1 may be substantially equal to a distance (e.g., a pitch) between the first and second power lines M1_R1 and M1_R2.

The single height cell SHC may constitute a single logic cell. In the present specification, the logic cell may mean a logic device (e.g., AND, OR, XOR, XNOR, inverter, and so forth), which is configured to execute a specific function. In other words, the logic cell may include transistors constituting the logic device and interconnection lines connecting transistors to each other.

Referring to FIG. 2, a double height cell DHC may be provided. For example, the first power line M1_R1, the second power line M1_R2, and a third power line M1_R3 may be provided on the substrate 100. The first power line M1_R1 may be disposed between the second power line M1_R2 and the third power line M1_R3. The first power line M1_R1 may be a conduction path, to which the drain voltage VDD is provided.

The double height cell DHC may be defined between the second power line M1_R2 and the third power line M1_R3. The double height cell DHC may include a first PMOSFET region PR1, a second PMOSFET region PR2, a first NMOSFET region NR1, and a second NMOSFET region NR2.

The first NMOSFET region NR1 may be adjacent to the second power line M1_R2. The second NMOSFET region NR2 may be adjacent to the third power line M1_R3. The first and second PMOSFET regions PR1 and PR2 may be adjacent to the first power line M1_R1. When viewed in a plan view, the first power line M1_R1 may be disposed between the first and second PMOSFET regions PR1 and PR2.

A length of the double height cell DHC in the first direction D1 may be defined as a second height HE2. The second height HE2 may be about two times the first height HE1 of FIG. 1. The first and second PMOSFET regions PR1 and PR2 of the double height cell DHC may be combined to serve as a single PMOSFET region.

Thus, a channel size of a PMOS transistor of the double height cell DHC may be greater than a channel size of a PMOS transistor of the single height cell SHC previously described with reference to FIG. 1. For example, the channel size of the PMOS transistor of the double height cell DHC may be about two times the channel size of the PMOS transistor of the single height cell SHC. In this case, the double height cell DHC may be operated at a higher speed than the single height cell SHC. In an example embodiment, the double height cell DHC shown in FIG. 2 may be defined as a multi-height cell. Although not shown, the multi-height cell may include a triple height cell whose cell height is about three times that of the single height cell SHC.

Referring to FIG. 3, a first single height cell SHC1, a second single height cell SHC2, and the double height cell DHC may be two-dimensionally disposed on the substrate 100. The first single height cell SHC1 may be disposed between the first and second power lines M1_R1 and M1_R2. The second single height cell SHC2 may be disposed between the first and third power lines M1_R1 and M1_R3. The second single height cell SHC2 may be adjacent to the first single height cell SHC1 in the first direction D1.

The double height cell DHC may be disposed between the second and third power lines M1_R2 and M1_R3. The double height cell DHC may be adjacent to the first and second single height cells SHC1 and SHC2 in a second direction D2.

A division structure DB may be provided between the first single height cell SHC1 and the double height cell DHC and between the second single height cell SHC2 and the double height cell DHC. The active region of the double height cell DHC may be electrically separated from the active region of each of the first and second single height cells SHC1 and SHC2 by the division structure DB.

Figure 4:
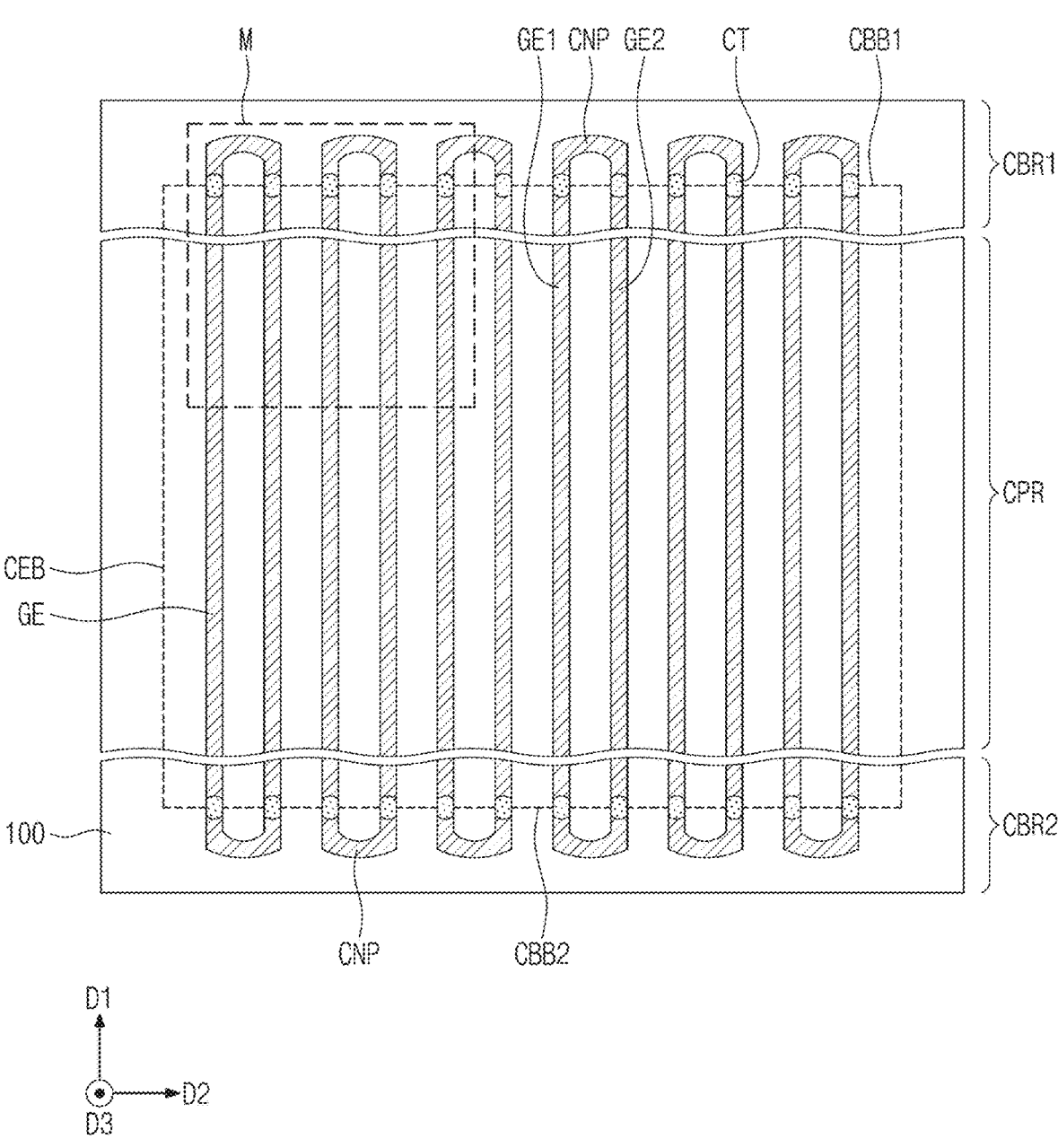
FIG. 4 is a plan view illustrating a semiconductor device according to an example embodiment of the inventive concepts.

FIG. 4 is a plan view illustrating a semiconductor device according to an example embodiment of the inventive concepts. Referring to FIG. 4, at least one cell block CEB may be provided on the substrate 100. The cell block CEB may be a region, in which the logic cells (e.g., SHC and DHC) previously described with reference to FIGS. 1 to 3 are disposed. The cell block CEB may include a cell disposing region CPR and first and second block border regions CBR1 and CBR2, which are provided at both sides of the cell disposing region CPR, respectively. The first and second block border regions CBR1 and CBR2 may be opposite to each other in the first direction D1, with the cell disposing region CPR interposed therebetween. The logic cells described above may be two-dimensionally disposed in the cell disposing region CPR.

A plurality of gate electrodes GE may be provided on the cell block CEB. The gate electrodes GE may be extended in the first direction D1 to be parallel to each other. The gate electrodes GE may be arranged at a specific pitch in the second direction D2. The gate electrodes GE may be extended from the first block border region CBR1 to the second block border region CBR2.

In an example embodiment, the gate electrodes GE may include a first gate electrode GE1 and a second gate electrode GE2, which are paired with each other and are adjacent to each other. A connection structure CNP may be provided on the first block border region CBR1 to connect the first and second gate electrodes GE1 and GE2 to each other. The connection structure CNP may connect an end of the first gate electrode GE1 to an end of the second gate electrode GE2. The connection structure CNP may have a clip shape.

A first block border CBB1 may be placed in the first block border region CBR1. Gate cutting patterns CT may be provided on the first block border CBB1 to penetrate the gate electrodes GE, respectively. The gate cutting patterns CT will be described in more detail below. The connection structure CNP may be placed outside the first block border CBB1. The connection structure CNP may connect an adjacent pair of the gate cutting patterns CT to each other.

The connection structure CNP may be provided on the second block border region CBR2 to connect the first and second gate electrodes GE1 and GE2 to each other. The connection structure CNP may connect an opposite end of the first gate electrode GE1 to an opposite end of the second gate electrode GE2. The connection structure CNP on the second block border region CBR2 may have the same shape as the connection structure CNP on the first block border region CBR1.

A second block border CBB2 may be placed in the second block border region CBR2. The gate cutting patterns CT may be provided on the second block border CBB2 to penetrate the gate electrodes GE, respectively. The connection structure CNP may be placed outside the second block border CBB2. The connection structure CNP may connect an adjacent pair of the gate cutting patterns CT to each other.

Because the gate electrode GE is a line-shaped pattern extending in the first direction D1, the risk of collapse of the gate electrode GE may increase as the linewidth of the gate electrode GE decreases. That is, as the linewidth of the gate electrode GE decreases, the structural stability of the gate electrode GE may decrease. In the present example embodiment, the connection structure CNP may be provided to connect the gate electrodes GE to each other and to mechanically support the gate electrodes GE, and thus, the gate electrodes GE may be mitigated or prevented from being collapsed. The connecting of the connection structure CNP to the gate electrodes GE may include the case in which an additional structure is placed between the connection structure CNP and the gate electrodes GE. For example, referring to FIG. 4, one of the gate electrodes GE may be physically connected to another one of the gate electrodes GE via the gate cutting pattern CT, the connection structure CNP, and the gate cutting pattern CT.

Figure 5:
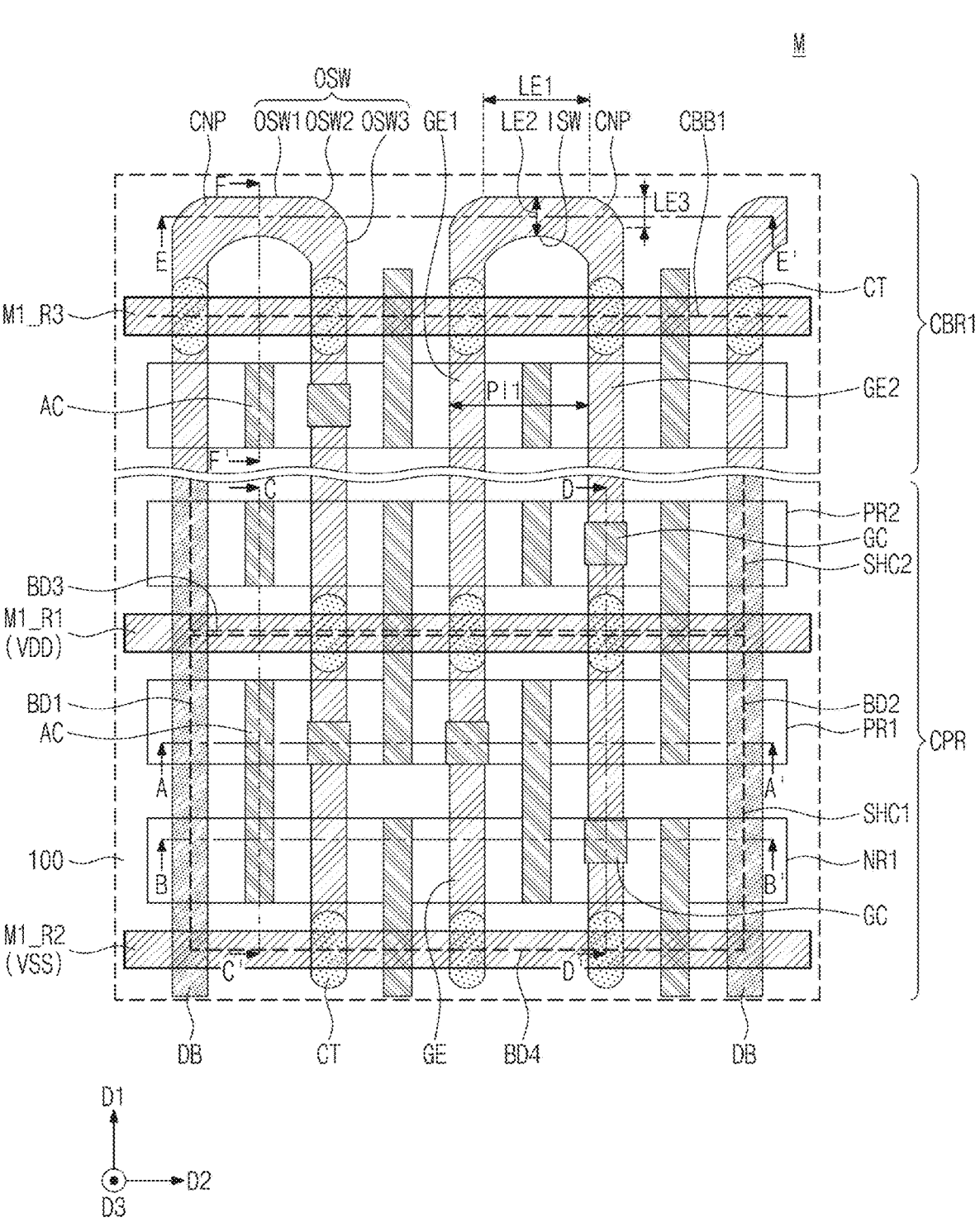
FIG. 5 is an enlarged sectional view illustrating a portion (e.g., 'M' of FIG. 4) of a semiconductor device according to an example embodiment of the inventive concepts.

FIG. 5 is an enlarged sectional view illustrating a portion (e.g., 'M' of FIG. 4) of a semiconductor device according to an example embodiment of the inventive concepts. FIGS. 6A to 6F are sectional views taken along lines A-A', B-B', C-C', D-D', E-E', and F-F', of FIG. 5, respectively. The semiconductor device of FIGS. 5 and 6A to 6D may be a concrete example of the first and second single height cells SHC1 and SHC2 of FIG. 3. The semiconductor device of FIGS. 5, 6E, and 6F may be a concrete example of the first block border region CBR1 of FIG. 4.

First, the cell disposing region CPR will be described in more detail with reference to FIGS. 5 and 6A to 6D. The first and second single height cells SHC1 and SHC2 may be provided on the substrate 100. Logic transistors constituting the logic circuit may be disposed on each of the first and second single height cells SHC1 and SHC2. The substrate 100 may be a semiconductor substrate that is formed of or includes silicon, germanium, silicon germanium, a compound semiconductor material, or the like. In an example embodiment, the substrate 100 may be a silicon wafer.

The substrate 100 may include the first NMOSFET region NR1, the first PMOSFET region PR1, and the second PMOSFET region PR2. The first NMOSFET region NR1, the first PMOSFET region PR1, and the second PMOSFET region PR2 may be extended in the second direction D2. The first single height cell SHC1 may include the first NMOSFET region NR1 and the first PMOSFET region PR1, and the second single height cell SHC2 may include the second PMOSFET region PR2.

A first active pattern AP1 and a second active pattern AP2 may be defined by a trench TR, which is formed in an upper portion of the substrate 100. The first active pattern AP1 may be provided on each of the first and second PMOSFET regions PR1 and PR2. The second active pattern AP2 may be provided on the first NMOSFET region NR1. The first and second active patterns AP1 and AP2 may be extended in the second direction D2. Each of the first and second active patterns AP1 and AP2 may be a vertically-protruding portion of the substrate 100.

A device isolation layer ST may be provided to fill the trench TR. The device isolation layer ST may include a silicon oxide layer. The device isolation layer ST may not cover first and second channel patterns CH1 and CH2 to be described below.

The first channel pattern CH1 may be provided on the first active pattern AP1. The second channel pattern CH2 may be provided on the second active pattern AP2. Each of the first and second channel patterns CH1 and CH2 may include a first semiconductor pattern SP1, a second semiconductor pattern SP2, and a third semiconductor pattern SP3, which are sequentially stacked. The first to third semiconductor patterns SP1, SP2, and SP3 may be spaced apart from each other in a vertical direction (e.g., a third direction D3).

Each of the first to third semiconductor patterns SP1, SP2, and SP3 may be formed of or include at least one of silicon (Si), germanium (Ge), or silicon germanium (SiGe). For example, each of the first to third semiconductor patterns SP1, SP2, and SP3 may be formed of or include crystalline silicon. The first to third semiconductor patterns SP1, SP2, and SP3 may be nanosheets, which are stacked.

A plurality of first source/drain patterns SD1 may be provided on the first active pattern AP1. A plurality of first recesses RS1 may be formed in an upper portion of the first active pattern AP1. The first source/drain patterns SD1 may be provided in the first recesses RS1, respectively. The first source/drain patterns SD1 may be impurity regions of a first conductivity type (e.g., p-type). The first channel pattern CH1 may be interposed between each pair of the first source/drain patterns SD1. In other words, each pair of the first source/drain patterns SD1 may be connected to each other by the stacked first to third semiconductor patterns SP1, SP2, and SP3.

A plurality of second source/drain patterns SD2 may be provided on the second active pattern AP2. A plurality of second recesses RS2 may be formed in an upper portion of the second active pattern AP2. The second source/drain patterns SD2 may be provided in the second recesses RS2, respectively. The second source/drain patterns SD2 may be impurity regions of a second conductivity type (e.g., n-type). The second channel pattern CH2 may be interposed between each pair of the second source/drain patterns SD2. In other words, each pair of the second source/drain patterns SD2 may be connected to each other by the stacked first to third semiconductor patterns SP1, SP2, and SP3.

The first and second source/drain patterns SD1 and SD2 may be epitaxial patterns, which are formed by a selective epitaxial growth (SEG) process. In an example embodiment, each of the first and second source/drain patterns SD1 and SD2 may have a top surface that is higher than a top surface of the third semiconductor pattern SP3. In another example embodiment, a top surface of at least one of the first and second source/drain patterns SD1 and SD2 may be located at substantially the same level as the top surface of the third semiconductor pattern SP3.

The first source/drain patterns SD1 may include a semiconductor material (e.g., SiGe) whose lattice constant is greater than that of the substrate 100. In this case, the pair of the first source/drain patterns SD1 may exert a compressive stress on the first channel patterns CH1 therebetween. The second source/drain patterns SD2 may be formed of or include the same semiconductor element (e.g., Si) as the substrate 100.

Each of the first source/drain patterns SD1 may include a buffer layer BFL and a main layer MAL on the buffer layer BFL. Hereinafter, a sectional shape of the first source/drain pattern SD1 in the second direction D2 will be described in more detail with reference to FIG. 6A.

The buffer layer BFL may cover an inner surface of the first recess RS1. In an example embodiment, the buffer layer BFL may have a decreasing thickness in an upward direction. For example, a thickness of the buffer layer BFL, which is measured in the third direction D3 on a bottom of the first recess RS1, may be larger than a thickness of the buffer layer BFL, which is measured in the second direction D2 at a top level of the first recess RS1. In addition, the buffer layer BFL may have a 'U'-shaped section along a profile of the first recess RS1.

The main layer MAL may fill most of an unfilled region of the first recess RS1 covered with the buffer layer BFL. A volume of the main layer MAL may be larger than a volume of the buffer layer BFL. That is, a ratio of the volume of the main layer MAL to a total volume of the first source/drain pattern SD1 may be greater than a ratio of the volume of the buffer layer BFL to a total volume of the first source/drain pattern SD1.

Each of the buffer and main layers BFL and MAL may be formed of or include silicon germanium (SiGe). For example, the buffer layer BFL may contain a relatively low concentration of germanium (Ge). In another example embodiment, the buffer layer BFL may contain only silicon (Si), without germanium (Ge). A germanium concentration of the buffer layer BFL may range from 0 at % to 10 at %. For example, the germanium concentration of the buffer layer BFL may range from 2 at % to 8 at %.

The main layer MAL may contain a relatively high concentration of germanium (Ge). As an example, a germanium concentration of the main layer MAL may range from 30 at % to 70 at %. The germanium concentration of the main layer MAL may increase in the third direction D3. For example, a portion of the main layer MAL, which is adjacent to the buffer layer BFL, may have a germanium concentration of about 40 at %, and an upper portion of the main layer MAL may have a germanium concentration of about 60 at %.

Each of the buffer and main layers BFL and MAL may contain an impurity (e.g., boron, gallium, or indium) that allows the first source/drain pattern SD1 to have a p-type conductivity. The impurity concentration of each of the buffer and main layers BFL and MAL may range from 1E18 atoms/cm3 to 5E22 atoms/cm3. An impurity concentration of the main layer MAL may be higher than an impurity concentration of the buffer layer BFL.

The buffer layer BFL may mitigate of prevent a stacking fault between the substrate 100 (e.g., the first active pattern AP1) and the main layer MAL and between the first to third semiconductor patterns SP1, SP2, and SP3 and the main layer MAL. The stacking fault may lead to an increase of a channel resistance. The stacking fault may easily occur on the bottom of the first recess RS1. Thus, to mitigate of prevent the stacking fault, the buffer layer BFL may be provided to have a relatively large thickness near the bottom of the first recess RS1.

The buffer layer BFL may protect the main layer MAL from a process of replacing sacrificial layers SAL, which will be described below, with the first to third inner electrodes PO1, PO2, and PO3 of the gate electrode GE. For example, the buffer layer BFL may block or prevent an etchant material, which is used to remove the sacrificial layers SAL, from entering and etching the main layer MAL.

Referring back to FIGS. 5 and 6A to 6D, the gate electrodes GE may extend in the first direction D1 and to cross the first and second channel patterns CH1 and CH2. The gate electrodes GE may be arranged at a first pitch in the second direction D2. Each of the gate electrodes GE may vertically overlap a corresponding one of the first and second channel patterns CH1 and CH2.

The gate electrode GE may include a first inner electrode PO1 interposed between the active pattern AP1 or AP2 and the first semiconductor pattern SP1, a second inner electrode PO2 interposed between the first and second semiconductor patterns SP1 and SP2, a third inner electrode PO3 interposed between the second and third semiconductor patterns SP2 and SP3, and an outer electrode PO4 on the third semiconductor pattern SP3.

Referring back to FIG. 6A, the first to third inner electrodes PO1, PO2, and PO3 of the gate electrode GE on the PMOSFET region PR may have different widths from each other. For example, the largest width of the third inner electrode PO3 in the second direction D2 may be larger than the largest width of the second inner electrode PO2 in the second direction D2. The largest width of the first inner electrode PO1 in the second direction D2 may be larger than the largest width of the third inner electrode PO3 in the second direction D2.

Referring back to FIG. 6D, the gate electrode GE may be provided on a top surface TS, a bottom surface BS, and opposite side surfaces SW of each of the first to third semiconductor patterns SP1, SP2, and SP3. That is, the transistor according to the present example embodiment may be a three-dimensional field effect transistor (e.g., Multi-Bridge-Channel FET (MBCFET) or Gate-All-Around FET (GAAFET)) in which the gate electrode GE is provided to three-dimensionally surround the channel pattern.

Referring back to FIGS. 5 and 6A to 6D, the first single height cell SHC1 may have a first border BD1 and a second border BD2, which are opposite to each other in the second direction D2. The first and second borders BD1 and BD2 may be extended in the first direction D1. The first single height cell SHC1 may have a third border BD3 and a fourth border BD4, which are opposite to each other in the first direction D1. The third and fourth borders BD3 and BD4 may be extended in the second direction D2.

Gate cutting patterns CT may be disposed on a border, which is parallel to (or extends in) the second direction D2, of each of the first and second single height cells SHC1 and SHC2. For example, the gate cutting patterns CT may be disposed on the third and fourth borders BD3 and BD4 of the first single height cell SHC1. The gate cutting patterns CT may be arranged at the first pitch along the third border BD3. The gate cutting patterns CT may be arranged at the first pitch along the fourth border BD4. When viewed in a plan view, the gate cutting patterns CT on the third and fourth borders BD3 and BD4 may overlap the gate electrodes GE, respectively. The gate cutting patterns CT may be formed of or include at least one of insulating materials (e.g., silicon oxide, silicon nitride, or combinations thereof).

The gate electrode GE on the first single height cell SHC1 may be separated from the gate electrode GE on the second single height cell SHC2 by the gate cutting pattern CT. The gate cutting pattern CT may be interposed between the gate electrodes GE on the first and second single height cells SHC1 and SHC2 which are aligned to each other in the first direction D1. That is, the gate electrode GE extending in the first direction D1 may be divided into a plurality of the gate electrodes GE by the gate cutting patterns CT.

A pair of gate spacers GS may be respectively disposed on opposite side surfaces of the fourth outer electrode PO4 of the gate electrode GE. The gate spacers GS may extend along the gate electrode GE and in the first direction D1. Top surfaces of the gate spacers GS may be higher than a top surface of the gate electrode GE. The top surfaces of the gate spacers GS may be coplanar with a top surface of a first interlayer insulating layer 110, which will be described below. In an example embodiment, the gate spacers GS may be formed of or include at least one of SiCN, SiCON, or SiN. In another example embodiment, the gate spacers GS may be a multi-layered structure, which is formed of or includes at least two different materials selected from SiCN, SiCON, and SiN.

A gate capping pattern GP may be provided on the gate electrode GE. The gate capping pattern GP may be extended along the gate electrode GE or in the first direction D1. The gate capping pattern GP may be formed of or include a material having an etch selectivity with respect to first and second interlayer insulating layers 110 and 120, which will be described below. For example, the gate capping pattern GP may be formed of or include at least one of SiON, SiCN, SiCON, or SiN.

A gate insulating layer GI may be interposed between the gate electrode GE and the first channel pattern CH1 and between the gate electrode GE and the second channel pattern CH2. The gate insulating layer GI may cover the top surface TS, the bottom surface BS, and the opposite side surfaces SW of each of the first to third semiconductor patterns SP1, SP2, and SP3. The gate insulating layer GI may cover a top surface of the device isolation layer ST below the gate electrode GE.

In an example embodiment, the gate insulating layer GI may include a silicon oxide layer, a silicon oxynitride layer, and/or a high-k dielectric layer. The high-k dielectric layer may be formed of or include at least one of high-k dielectric materials whose dielectric constants are higher than that of silicon oxide. For example, the high-k dielectric material may include at least one of hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, or lead zinc niobate.

In another example embodiment, the semiconductor device may include a negative capacitance (NC) FET using a negative capacitor. For example, the gate insulating layer GI may include a ferroelectric layer exhibiting a ferroelectric property and a paraelectric layer exhibiting a paraelectric property.

The ferroelectric layer may have a negative capacitance, and the paraelectric layer may have a positive capacitance. In the case where two or more capacitors are connected in series and each capacitor has a positive capacitance, a total capacitance may be reduced to a value that is less than a capacitance of each of the capacitors. By contrast, in the case where at least one of serially-connected capacitors has a negative capacitance, a total capacitance of the serially-connected capacitors may have a positive value and may be greater than an absolute value of each capacitance.

In the case where a ferroelectric layer having a negative capacitance and a paraelectric layer having a positive capacitance are connected in series, a total capacitance of the serially-connected ferroelectric and paraelectric layers may be increased. Due to such an increase of the total capacitance, a transistor including the ferroelectric layer may have a subthreshold swing (SS), which is less than 60 mV/decade, at the room temperature.

The ferroelectric layer may have the ferroelectric property. The ferroelectric layer may be formed of or include at least one of, for example, hafnium oxide, hafnium zirconium oxide, barium strontium titanium oxide, barium titanium oxide, and/or lead zirconium titanium oxide. Here, the hafnium zirconium oxide may be hafnium oxide that is doped with zirconium (Zr). In some example embodiments, the hafnium zirconium oxide may be a compound composed of hafnium (Hf), zirconium (Zr), and/or oxygen (O).

The ferroelectric layer may further include dopants. For example, the dopants may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and/or tin (Sn).

The kind of the dopants in the ferroelectric layer may vary depending on a ferroelectric material included in the ferroelectric layer.

In the case where the ferroelectric layer includes hafnium oxide, the dopants in the ferroelectric layer may include at least one of, for example, gadolinium (Gd), silicon (Si), zirconium (Zr), aluminum (Al), and/or yttrium (Y).

In the case where the dopants are aluminum (Al), a content of aluminum in the ferroelectric layer may range from 3 to 8 at % (atomic percentage). Here, the content of the dopants (e.g., aluminum atoms) may be a ratio of the number of aluminum atoms to the number of hafnium and aluminum atoms.

In the case where the dopants are silicon (Si), a content of silicon in the ferroelectric layer may range from 2 at % to 10 at %. In the case where the dopants are yttrium (Y), a content of yttrium in the ferroelectric layer may range from 2 at % to 10 at %. In the case where the dopants are gadolinium (Gd), a content of gadolinium in the ferroelectric layer may range from 1 at % to 7 at %. In the case where the dopants are zirconium (Zr), a content of zirconium in the ferroelectric layer may range from 50 at % to 80 at %.

The paraelectric layer may have the paraelectric property. The paraelectric layer may be formed of or include at least one of, for example, silicon oxide and/or high-k metal oxides. The metal oxides, which can be used as the paraelectric layer, may include at least one of, for example, hafnium oxide, zirconium oxide, and/or aluminum oxide, but the inventive concepts are not limited to these examples.

The ferroelectric layer and the paraelectric layer may be formed of or include the same material. The ferroelectric layer may have the ferroelectric property, but the paraelectric layer may not have the ferroelectric property. For example, in the case where the ferroelectric and paraelectric layers contain hafnium oxide, a crystal structure of the hafnium oxide in the ferroelectric layer may be different from a crystal structure of the hafnium oxide in the paraelectric layer.

The ferroelectric layer may exhibit the ferroelectric property, only when its thickness is in a specific range. In an example embodiment, the ferroelectric layer may have a thickness ranging from 0.5 to 10 nm, but the inventive concepts are not limited to this example. Because a critical thickness associated with the occurrence of the ferroelectric property varies depending on the kind of the ferroelectric material, the thickness of the ferroelectric layer may be changed depending on the kind of the ferroelectric material.

As an example, the gate insulating layer GI may include a single ferroelectric layer. As another example, the gate insulating layer GI may include a plurality of ferroelectric layers spaced apart from each other. The gate insulating layer GI may have a multi-layered structure, in which a plurality of ferroelectric layers and a plurality of paraelectric layers are alternately stacked.

Referring back to FIG. 6B, inner spacers IP may be provided on the first NMOSFET region NR1. That is, the inner spacers IP may be provided on the second active pattern AP2. The inner spacers IP may be respectively interposed between the first to third inner electrodes PO1, PO2, and PO3 of the gate electrode GE and the second source/drain pattern SD2. The inner spacers IP may be in direct contact with the second source/drain pattern SD2. Each of the first to third inner electrodes PO1, PO2, and PO3 of the gate electrode GE may be spaced apart from the second source/drain pattern SD2 by the inner spacer IP.

A first interlayer insulating layer 110 may be provided on the substrate 100. The first interlayer insulating layer 110 may cover the gate spacers GS and the first and second source/drain patterns SD1 and SD2. The first interlayer insulating layer 110 may have a top surface that is substantially coplanar with the top surface of the gate capping pattern GP and the top surface of the gate spacer GS. A second interlayer insulating layer 120 may be formed on the first interlayer insulating layer 110 to cover the gate capping pattern GP. A third interlayer insulating layer 130 may be provided on the second interlayer insulating layer 120. A fourth interlayer insulating layer 140 may be provided on the third interlayer insulating layer 130. In an example embodiment, at least one of the first to fourth interlayer insulating layers 110 to 140 may include a silicon oxide layer.

A pair of division structures DB may be provided at both sides of each of the first and second single height cells SHC1 and SHC2 to be opposite to each other in the second direction D2. For example, the pair of the division structures DB may be provided on the first and second borders BD1 and BD2 of the first single height cell SHC1, respectively. The division structure DB may be extended in the first direction D1 to be parallel to the gate electrodes GE. A pitch between the division structure DB and the gate electrode GE adjacent thereto or a pitch between adjacent gate electrodes GE may be equal to the first pitch.

The division structure DB may be provided to penetrate the first and second interlayer insulating layers 110 and 120 and may be extended into the first and second active patterns AP1 and AP2. The division structure DB may be provided to penetrate an upper portion of a corresponding one of the first and second active patterns AP1 and AP2. The division structure DB may electrically separate an active region of a corresponding one of the first and second single height cells SHC1 and SHC2 from an active region of a neighboring cell.

Active contacts AC may penetrate the first and second interlayer insulating layers 110 and 120 and to be electrically connected to the first and second source/drain patterns SD1 and SD2, respectively. A pair of the active contacts AC may be provided at both sides of the gate electrode GE, respectively. When viewed in a plan view, the active contact AC may be a bar-shaped pattern that is extended in the first direction D1.

The active contact AC may be a self-aligned contact. For example, the active contact AC may be formed by a self-alignment process using the gate capping pattern GP and the gate spacer GS. For example, the active contact AC may cover at least a portion of the side surface of the gate spacer GS. Although not shown, the active contact AC may cover a portion of the top surface of the gate capping pattern GP.

Metal-semiconductor compound layers SC (e.g., a silicide layer) may be interposed between the active contact AC and the first source/drain pattern SD1 and between the active contact AC and the second source/drain pattern SD2, respectively. The active contact AC may be electrically connected to a corresponding one of the source/drain pattern SD1 and SD2 through the metal-semiconductor compound layer SC. For example, the metal-semiconductor compound layer SC may be formed of or include at least one of titanium silicide, tantalum silicide, tungsten silicide, nickel silicide, or cobalt silicide.

Referring back to FIG. 6C, at least one active contact AC on the first single height cell SHC1 may electrically connect the first source/drain pattern SD1 of the first PMOSFET region PR1 to the second source/drain pattern SD2 of the first NMOSFET region NR1. The active contact AC may be extended from the second source/drain pattern SD2 of the first NMOSFET region NR1 to the first source/drain pattern SD1 of the first PMOSFET region PR1 in the first direction D1.

The active contact AC may include a barrier metal BM and a filler metal FM on the barrier metal BM. The barrier metal BM may be provided to enclose all surfaces of the filler metal FM except for a top surface. For example, the filler metal FM may be formed of or include at least one of molybdenum, tungsten, ruthenium, cobalt, or vanadium. In an example embodiment, the filler metal FM may be formed of or include molybdenum. The barrier metal BM may include a metal nitride layer. The metal nitride layer may be formed of or include at least one of titanium nitride (TiN), tantalum nitride (TaN), tungsten nitride (WN), nickel nitride (NiN), cobalt nitride (CoN), or platinum nitride (PtN).

Gate contacts GC may be provided to penetrate the third interlayer insulating layer 130, the second interlayer insulating layer 120, and the gate capping pattern GP and to be electrically connected to the gate electrodes GE, respectively. When viewed in a plan view, two gate contacts GC on the first single height cell SHC1 may overlap the first PMOSFET region PR1. That is, the two gate contacts GC on the first single height cell SHC1 may be provided on the first active pattern AP1 (e.g., see FIG. 6A). When viewed in a plan view, a single gate contact GC on the first single height cell SHC1 may overlap the first NMOSFET region NR1. In other words, the single gate contact GC on the first single height cell SHC1 may be provided on the second active pattern AP2 (e.g., see FIG. 6B).

The gate contact GC may be freely disposed on the gate electrode GE, without any limitation in its position. For example, the gate contacts GC on the second single height cell SHC2 may be disposed on the second PMOSFET region PR2, and the device isolation layer ST filling the trench TR (e.g., see FIG. 5), respectively.

Figure 6A:
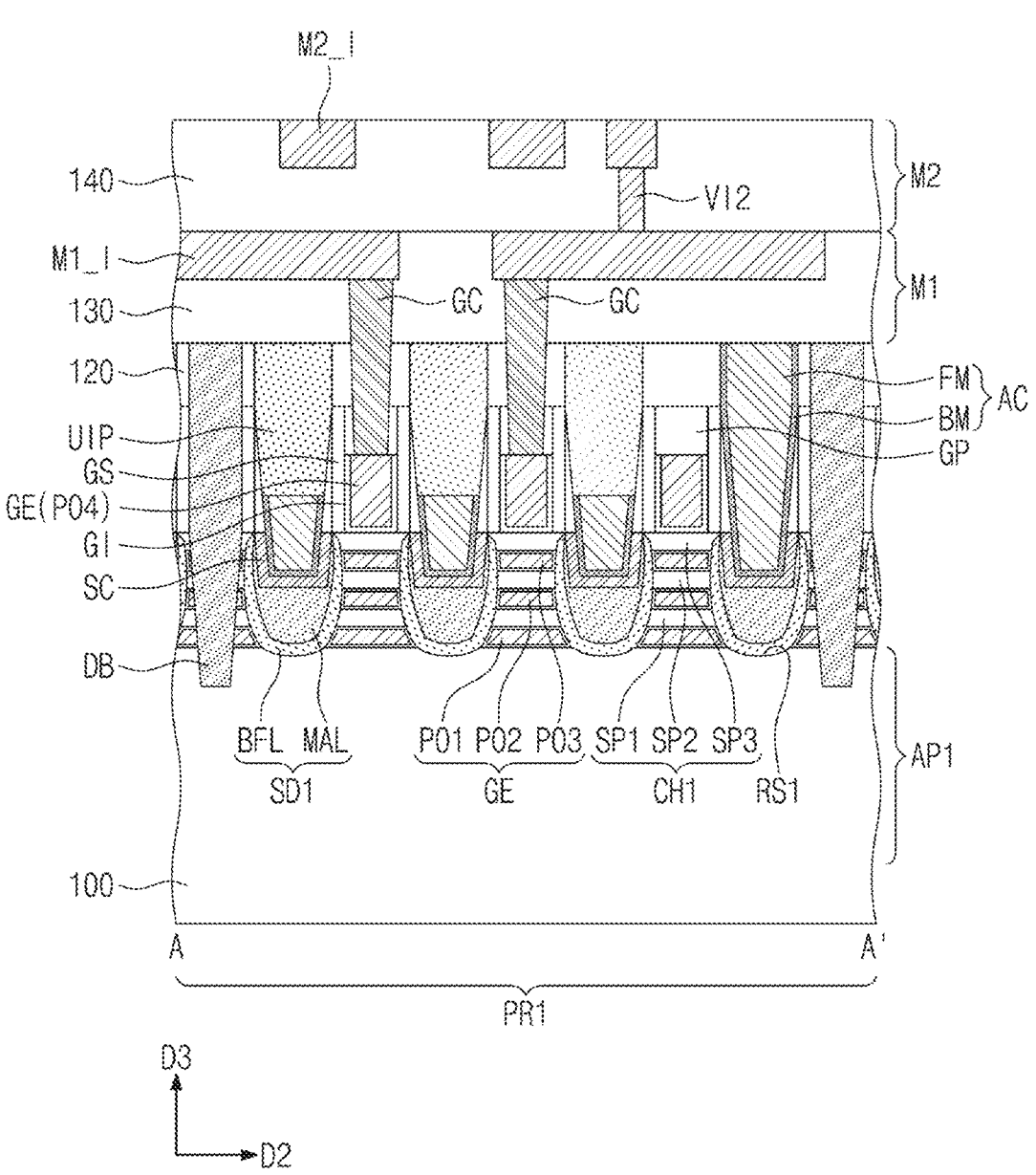
FIGS. 6A to 6F are sectional views taken along lines A-A', B-B', C-C', D-D', E-E', and F-F' of FIG. 5, respectively.
Figure 6B:
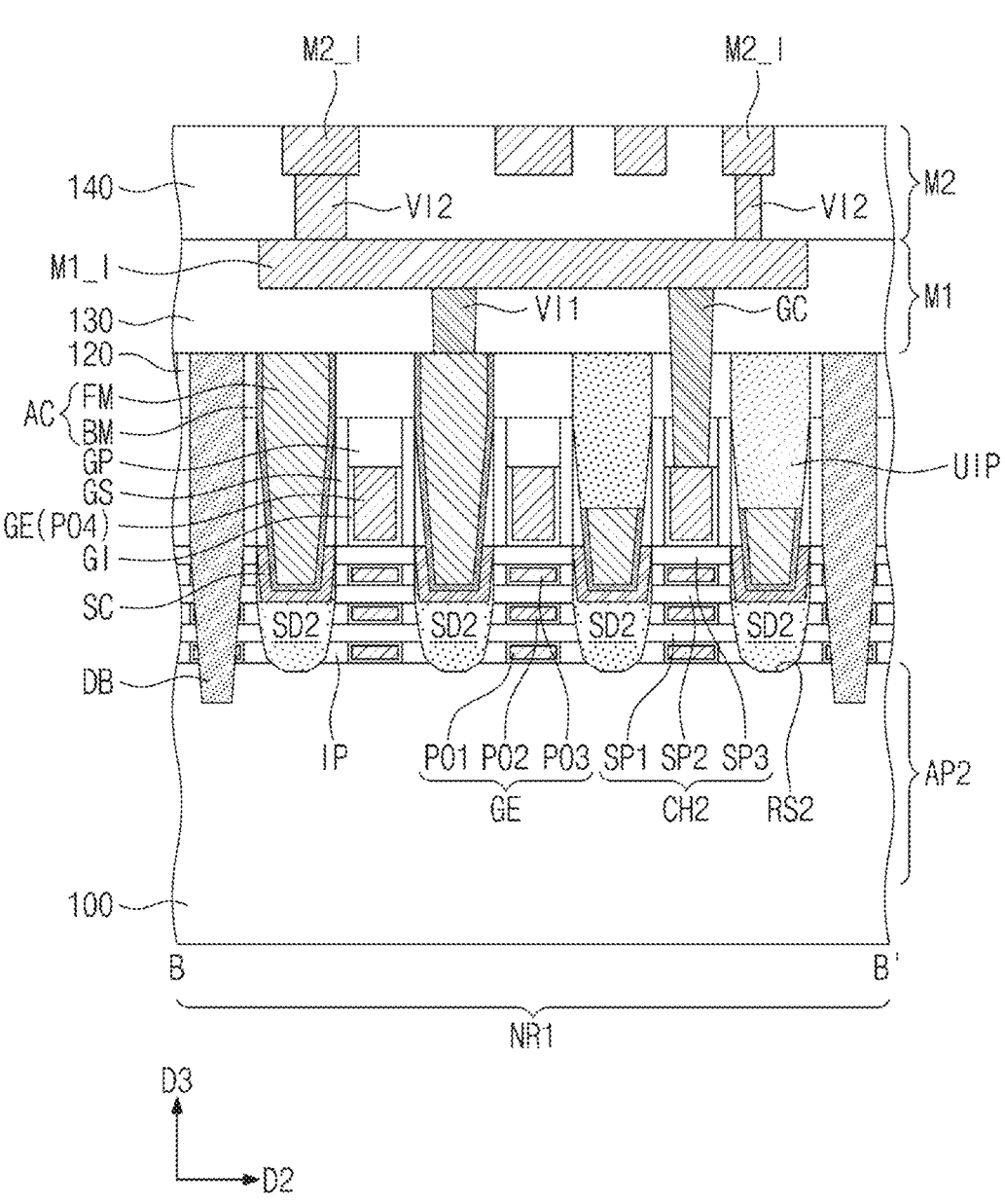
Figure 6C:
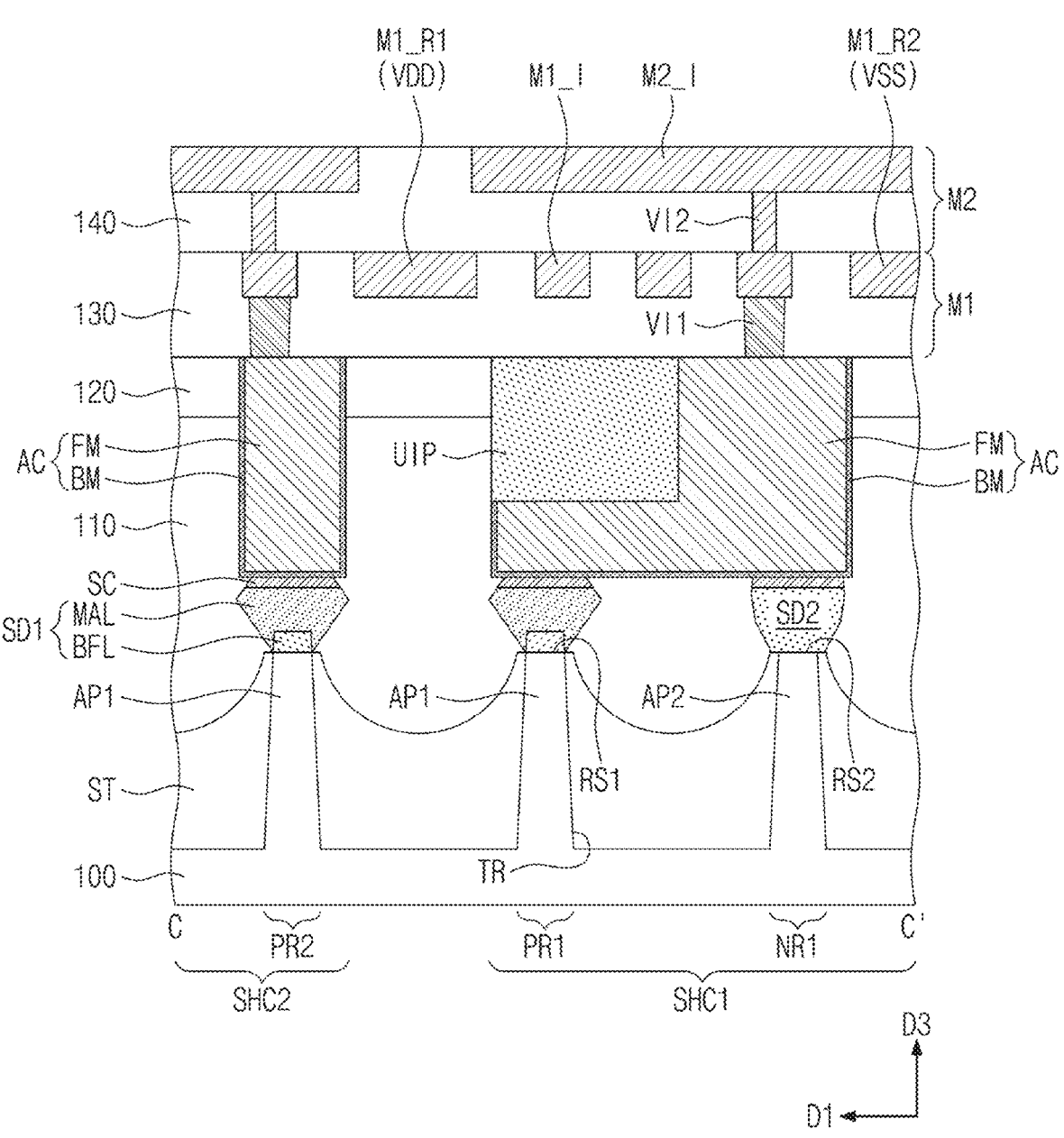
Figure 6D:
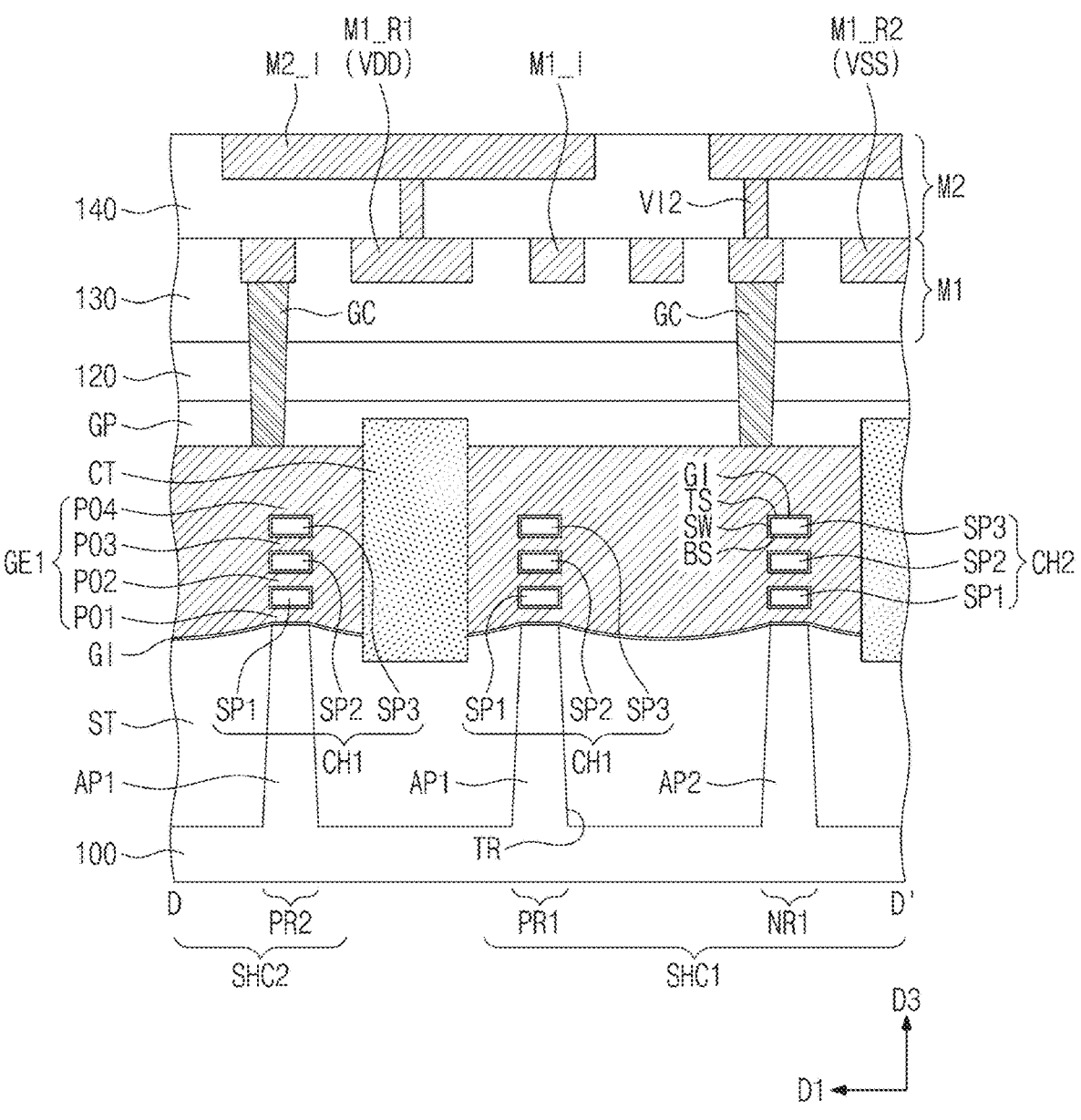

In an example embodiment, referring to FIGS. 6A and 6B, an upper portion of the active contact AC adjacent to the gate contact GC may be filled with an upper insulating pattern UIP. A bottom surface of the upper insulating pattern UIP may be lower than a bottom surface of the gate contact GC. In other words, a top surface of the active contact AC adjacent to the gate contact GC may be formed at a level, which is lower than the bottom surface of the gate contact GC, by the upper insulating pattern UIP. Accordingly, it may be possible to block or prevent the gate contact GC and the active contact AC, which are adjacent to each other, from being in contact with each other, and thereby mitigating or preventing a short circuit issue from occurring therebetween.

A first via VI1 may be provided on the active contact AC. The first via VI1 may have a top surface that is located at the same or substantial similar level as the top surface of the gate contact GC. In an example embodiment, the first via VI1 and the gate contact GC may be formed at the same time using the same process. The first via VI1 and the gate contact GC may be formed of or include the same material.

The gate contact GC may not have the barrier metal, unlike the active contact AC. The gate contact GC may be formed of a single metal layer. The gate contact GC may be formed of or include at least one of molybdenum, tungsten, ruthenium, cobalt, or vanadium. In an example embodiment, the gate contact GC may be formed of or include molybdenum. The first via VI1 may not have the barrier metal, like the gate contact GC. The first via VI1 may be formed of or include the same metallic material as the gate contact GC.

A first metal layer M1 may be provided in the third interlayer insulating layer 130. For example, the first metal layer M1 may include the first power line M1_R1, the second power line M1_R2, the third power line M1_R3, and first interconnection lines M1_I. The interconnection lines M1_R1, M1_R2, M1_R3, and M1_I of the first metal layer M1 may be extended in the second direction D2 to be parallel to each other.

For example, the first and second power lines M1_R1 and M1_R2 may be provided on the third and fourth borders BD3 and BD4 of the first single height cell SHC1, respectively. The first power line M1_R1 may be extended along the third border BD3 and in the second direction D2. The second power line M1_R2 may be extended along the fourth border BD4 and in the second direction D2.

The first interconnection lines M1_I of the first metal layer M1 may be arranged at a second pitch in the first direction D1. The second pitch may be smaller than the first pitch. A linewidth of each of the first interconnection lines M1_I may be smaller than a linewidth of each of the first to third power lines M1_R1, M_R2, and M1_R3.

The active contact AC and the interconnection line of the first metal layer M1 may be electrically connected to each other through the first via VI1. The gate electrode GE and the interconnection line of the first metal layer M1 may be electrically connected to each other through the gate contact GC.

The interconnection line of the first metal layer M1 and the first via VI1 thereunder may be formed by separate processes. For example, the interconnection line and the first via VI1 of the first metal layer M1 may be independently formed by respective single damascene processes. The semiconductor device according to the present example embodiment may be fabricated using a sub-20 nm process.

A second metal layer M2 may be provided in the fourth interlayer insulating layer 140. The second metal layer M2 may include a plurality of second interconnection lines M2_I. Each of the second interconnection lines M2_I of the second metal layer M2 may be a line- or bar-shaped pattern that is extended in the first direction D1. In other words, the second interconnection lines M2_I may be extended in the first direction D1 and parallel to each other.

The second metal layer M2 may further include second vias VI2, which are provided below the second interconnection lines M2_I, respectively. The interconnection lines of the first and second metal layers M1 and M2 may be electrically connected to each other through the second via VI2. The interconnection line of the second metal layer M2 and the second via VI2 thereunder may be formed together by a dual damascene process.

The interconnection lines of the first metal layer M1 may be formed of or include a conductive material that is the same as or different from those of the second metal layer M2. For example, the interconnection lines of the first and second metal layers M1 and M2 may be formed of or include at least one of metallic materials (e.g., copper, ruthenium, aluminum, tungsten, molybdenum, and cobalt). Although not shown, a plurality of metal layers (e.g., M3, M4, M5, and so forth) may be additionally stacked on the fourth interlayer insulating layer 140. Each of the stacked metal layers may include interconnection lines, which are used as routing paths between cells.

Figure 6E:
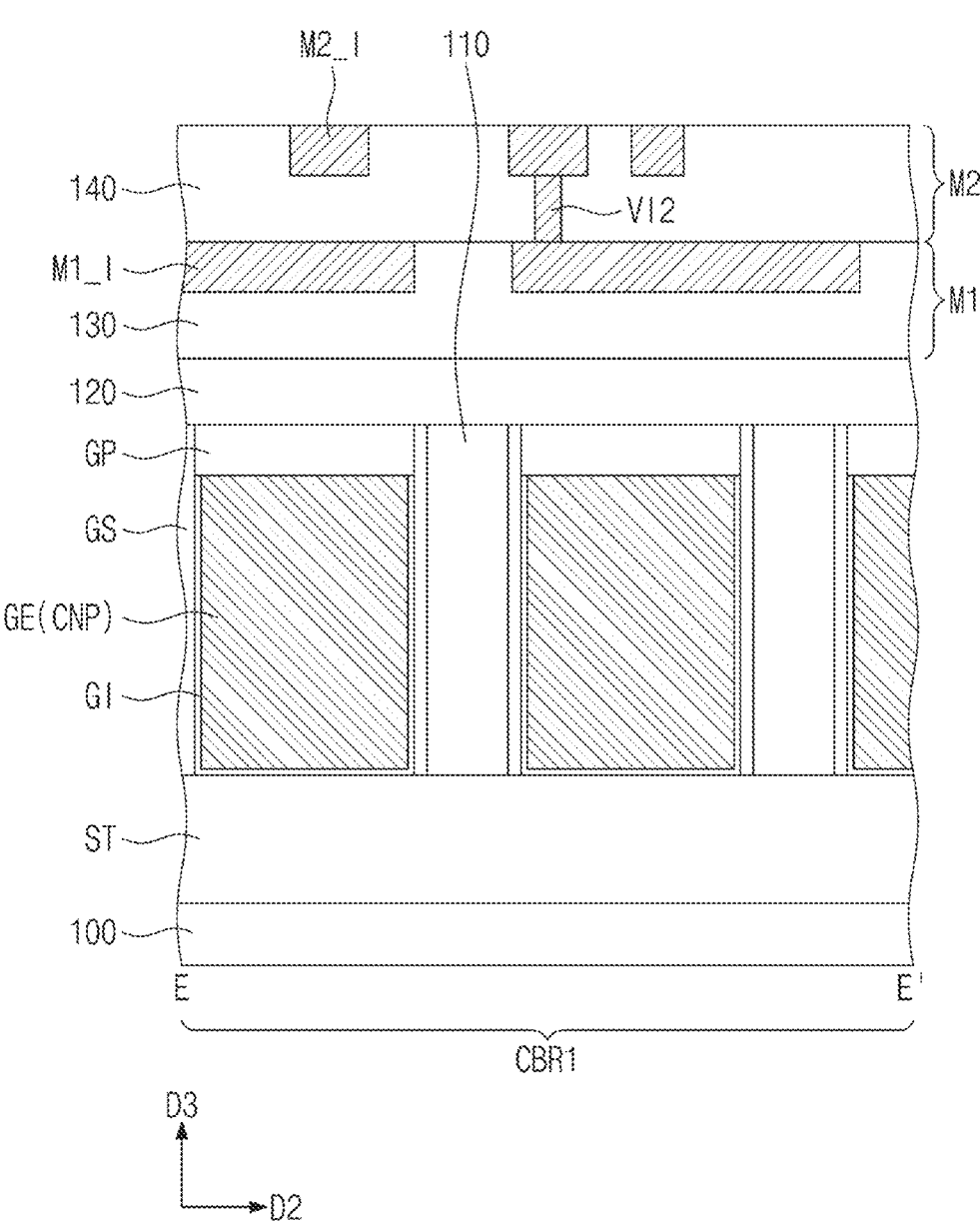
Figure 6F:
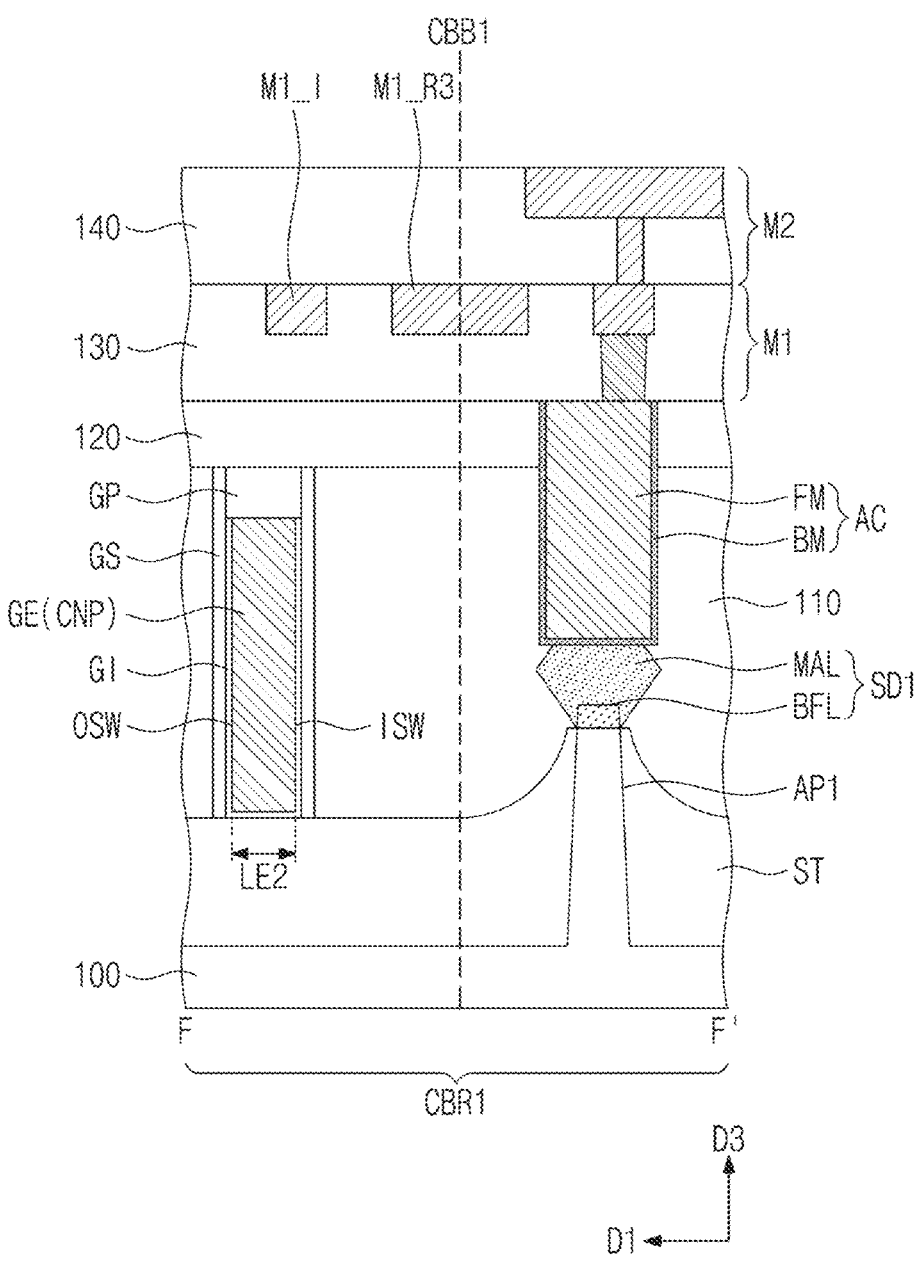

The first block border region CBR1 will be described in more detail with reference to FIGS. 5, 6E, and 6F. A plurality of connection structures CNP may be provided on the first block border region CBR1. Each of the connection structures CNP may connect the first gate electrode GE1 and the second gate electrode GE2, which are adjacent to each other, to each other.

The gate cutting patterns CT may be provided on the first block border CBB1 to penetrate the gate electrodes GE, respectively. The connection structure CNP may be electrically disconnected from the first and second gate electrodes GE1 and GE2 by the gate cutting pattern CT.

The connection structure CNP may be formed of or include the same metallic material as the gate electrode GE. The gate insulating layer GI may cover a surface of the connection structure CNP. The gate spacers GS may be provided on an inner side surface ISW and an outer side surface OSW of the connection structure CNP, respectively. The gate capping pattern GP may be provided on a top surface of the connection structure CNP.

The connection structure CNP may be a conductor but may not be electrically connected to the gate electrode GE by the gate cutting pattern CT. In addition, the gate contact GC may not be provided on the connection structure CNP. In other words, the connection structure CNP may be a conductor but may be used as a dummy structure mechanically supporting the gate electrode GE.

Referring back to FIG. 5, the connection structure CNP may have a rounded shape. The connection structure CNP may include the inner side surface ISW and the outer side surface OSW, which are opposite to each other. The inner side surface ISW may be close to the first block border CBB1, compared with the outer side surface OSW.

Each of the inner and outer side surfaces ISW and OSW may have a rounded profile. However, the inner side surface ISW may have a curvature different from that of the outer side surface OSW. In an example embodiment, the inner side surface ISW may have a first curvature radius, and the outer side surface OSW may have a second curvature radius that is larger than the first curvature radius.

The outer side surface OSW may include a first outer side surface OSW1, a second outer side surface OSW2, and a third outer side surface OSW3. The first outer side surface OSW1 may be extended in the second direction D2. The third outer side surface OSW3 may be extended in the first direction D1. The second outer side surface OSW2 may connect the first outer side surface OSW1 to the third outer side surface OSW3. The second outer side surface OSW2 may be rounded. The curvature of the outer side surface OSW described above may mean the curvature of the second outer side surface OSW2.

The first outer side surface OSW1 may have a first length LE1 in the second direction D2. For example, the first length LE1 may range from 47 nm to 53 nm. A ratio LE1/PI1 of the first length LE1 to a first pitch PI1 between the first and second gate electrodes GE1 and GE2 may range from 0.87 to 1.

A minimum distance between the first outer side surface OSW1 and the inner side surface ISW in the first direction D1 may be a second length LE2. In other words, a width of the connection structure CNP in the first direction D1 may be the second length LE2. The second length LE2 may be smaller than the first length LE1. For example, the second length LE2 may range from 32 nm to 36 nm. A length of the second outer side surface OSW2 in the first direction D1 may be a third length LE3. For example, the third length LE3 may range from 16 nm to 19 nm. A ratio LE3/LE2 of the third length LE3 to the second length LE2 may range from 0.44 to 0.49.

FIGS. 7A to 14D are sectional views illustrating a method of fabricating a semiconductor device according to an example embodiment of the inventive concepts. For example, FIGS. 7A, 8A, 9A, 10A, 11A, 12A, 13A, and 14A are sectional views corresponding to a line A-A' of FIG. 5.

FIGS. 9B, 10B, 11B, 12B, 13B, and 14B are sectional views corresponding to a line B-B' of FIG. 5. FIGS. 9C, 10C, 11C, 12C, 13C, and 14C are sectional views corresponding to a line C-C' of FIG. 5. FIGS. 7B, 8B, 9D, 10D, 11D, 12D, 13D, and 14D are sectional views corresponding to a line D-D' of FIG. 5. FIG. 8C is a sectional view corresponding to a line E-E' of FIG. 5.

Figure 7A:
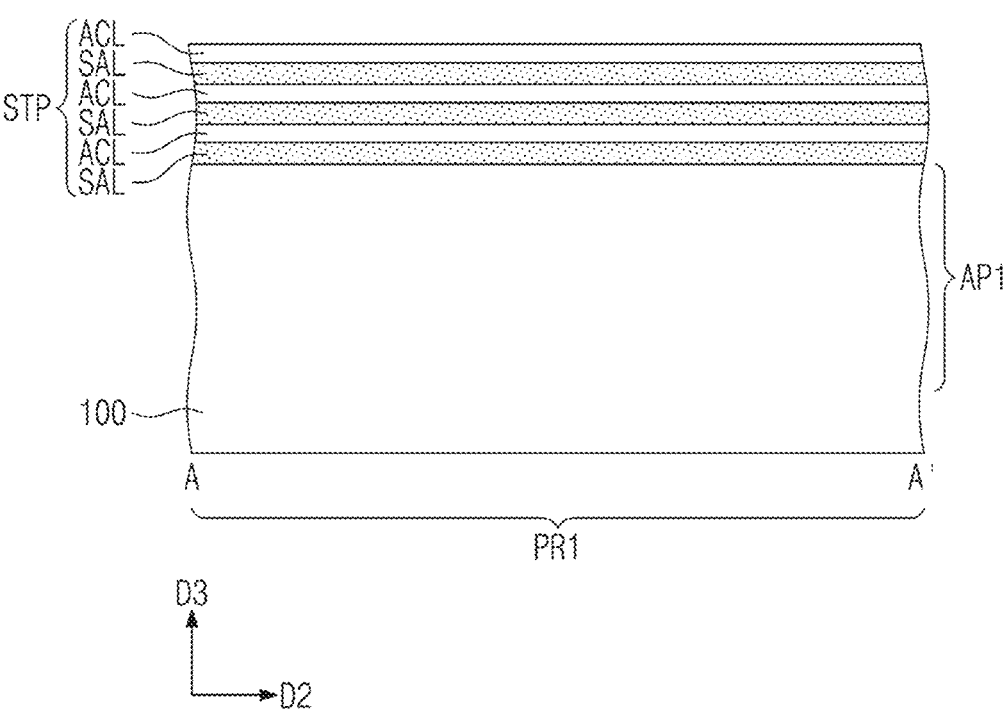
FIGS. 7A to 14D are sectional views illustrating a method of fabricating a semiconductor device, according to an example embodiment of the inventive concepts.
Figure 7B:
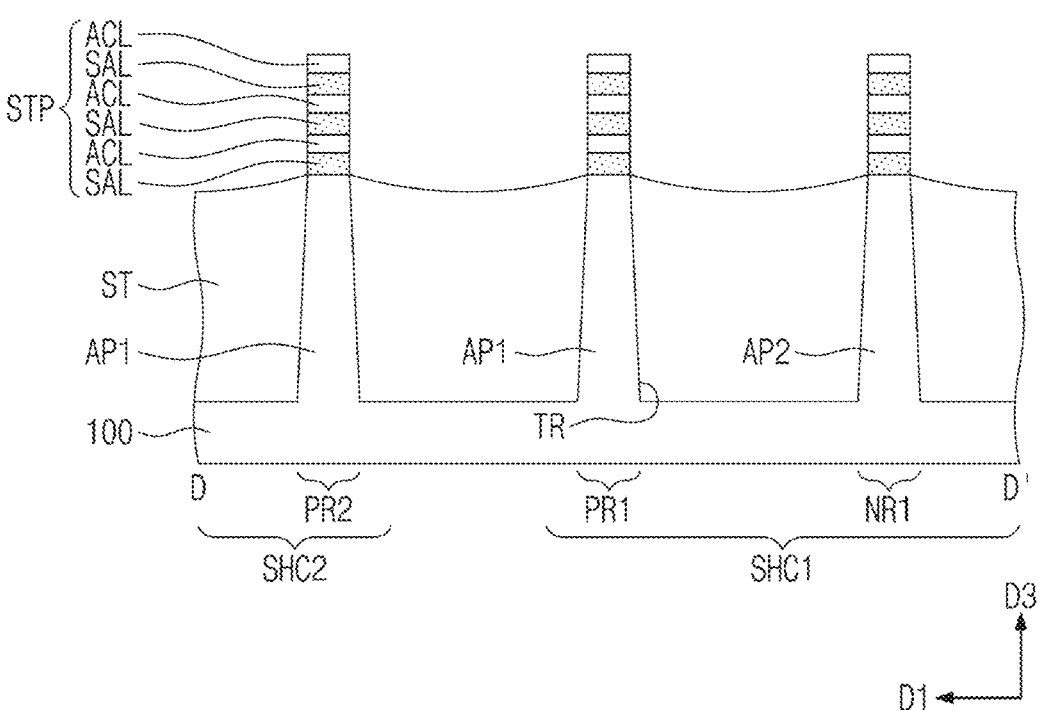

Referring to FIGS. 7A and 7B, the substrate 100 may be provided, and in an example embodiment, the substrate may include the first NMOSFET region NR1 and the first and second PMOSFET regions PR1 and PR2. Active layers ACL and the sacrificial layers SAL may be alternately stacked on the substrate 100. The active layers ACL may be formed of or include one of silicon (Si), germanium (Ge), and silicon germanium (SiGe), and the sacrificial layers SAL may be formed of or include another one of silicon (Si), germanium (Ge), and silicon germanium (SiGe).

The sacrificial layer SAL may be formed of or include a material having an etch selectivity with respect to the active layer ACL. For example, the active layers ACL may be formed of or include silicon (Si), and the sacrificial layers SAL may be formed of or include silicon germanium (SiGe). A germanium concentration of each of the sacrificial layers SAL may range from 10 at % to 30 at %.

Mask patterns may be respectively formed on the first NMOSFET region NR1 and the first and second PMOSFET regions PR1 and PR2 of the substrate 100. The mask pattern may be a line- or bar-shaped pattern that is extended in the second direction D2.

A patterning process using the mask patterns as an etch mask may be performed to form the trench TR defining the first and second active patterns AP1 and AP2. The first active pattern AP1 may be formed on each of the first and second PMOSFET regions PR1 and PR2. The second active pattern AP2 may be formed on the first NMOSFET region NR1.

A stacking pattern STP may be formed on each of the first and second active patterns AP1 and AP2. The stacking pattern STP may include the active layers ACL and the sacrificial layers SAL which are alternately stacked. The stacking pattern STP may be formed along with the first and second active patterns AP1 and AP2, during the patterning process.

The device isolation layer ST may be formed to fill the trench TR. For example, an insulating layer may be formed on the substrate 100 to cover the first and second active patterns AP1 and AP2 and the stacking patterns STP. The device isolation layer ST may be formed by recessing the insulating layer to expose the stacking patterns STP.

The device isolation layer ST may be formed of or include at least one of insulating materials (e.g., silicon oxide). The stacking patterns STP may be placed above the device isolation layer ST and may be exposed to the outside of the device isolation layer ST. In other words, the stacking patterns STP may protrude vertically above the device isolation layer ST.

Figure 8A:
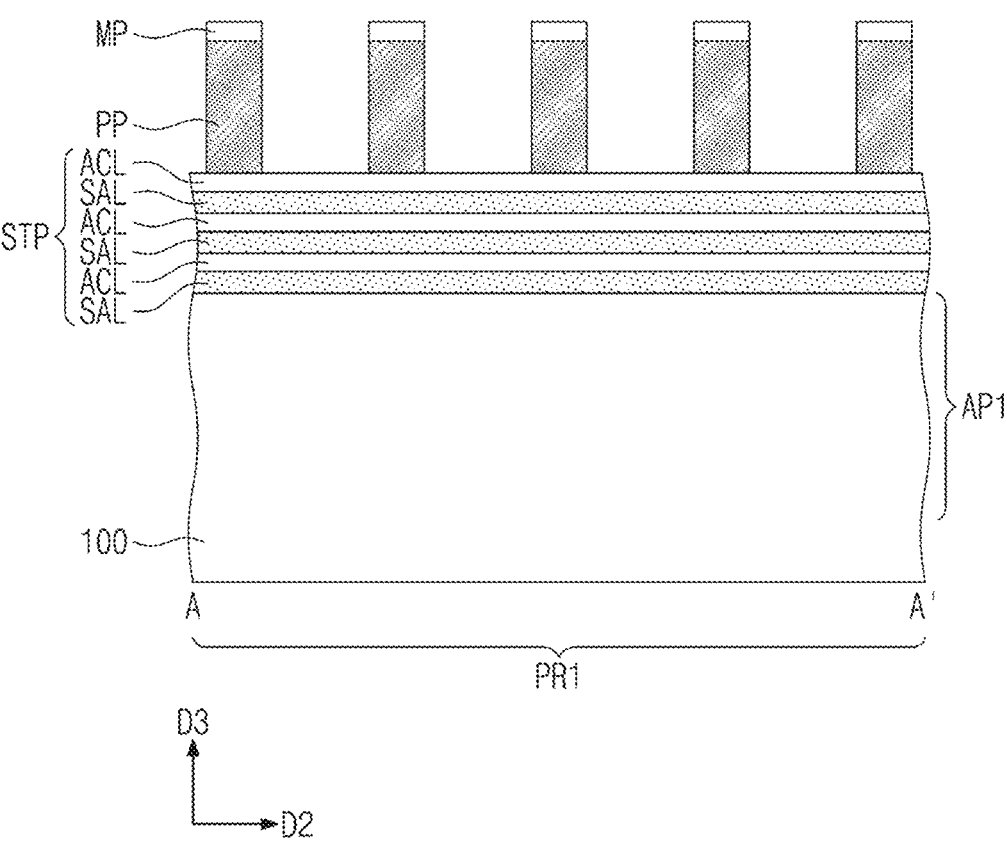
Figure 8B:
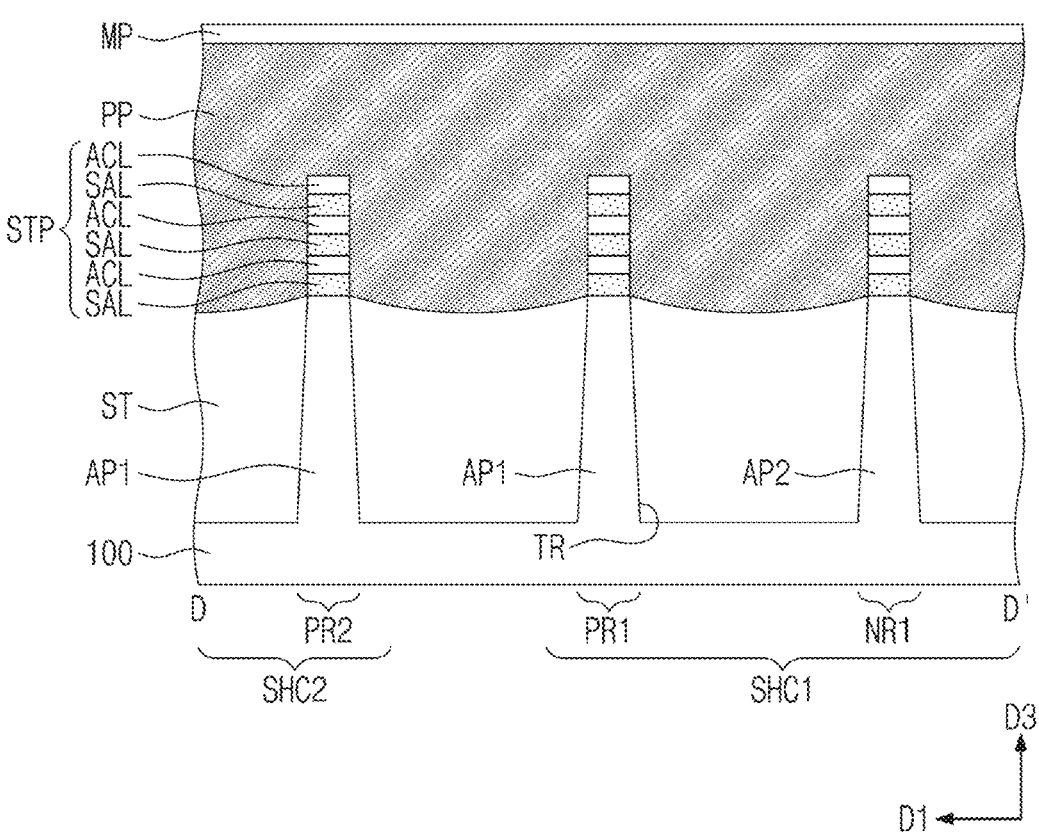
Figure 8C:
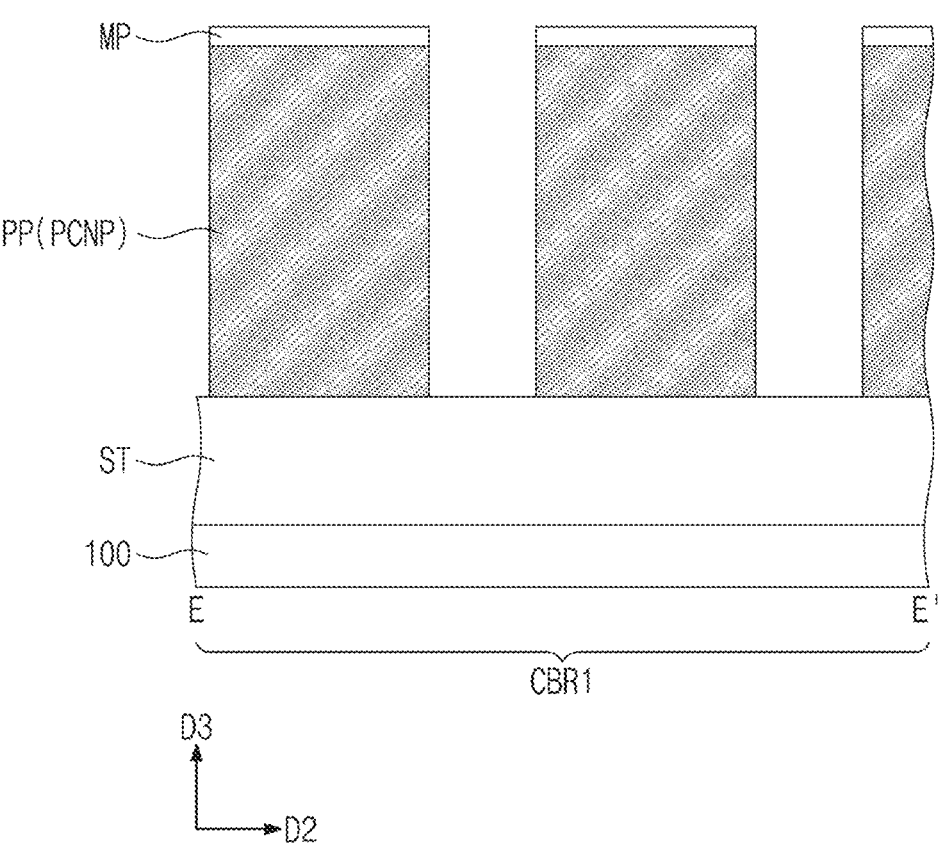
Figure 9A:
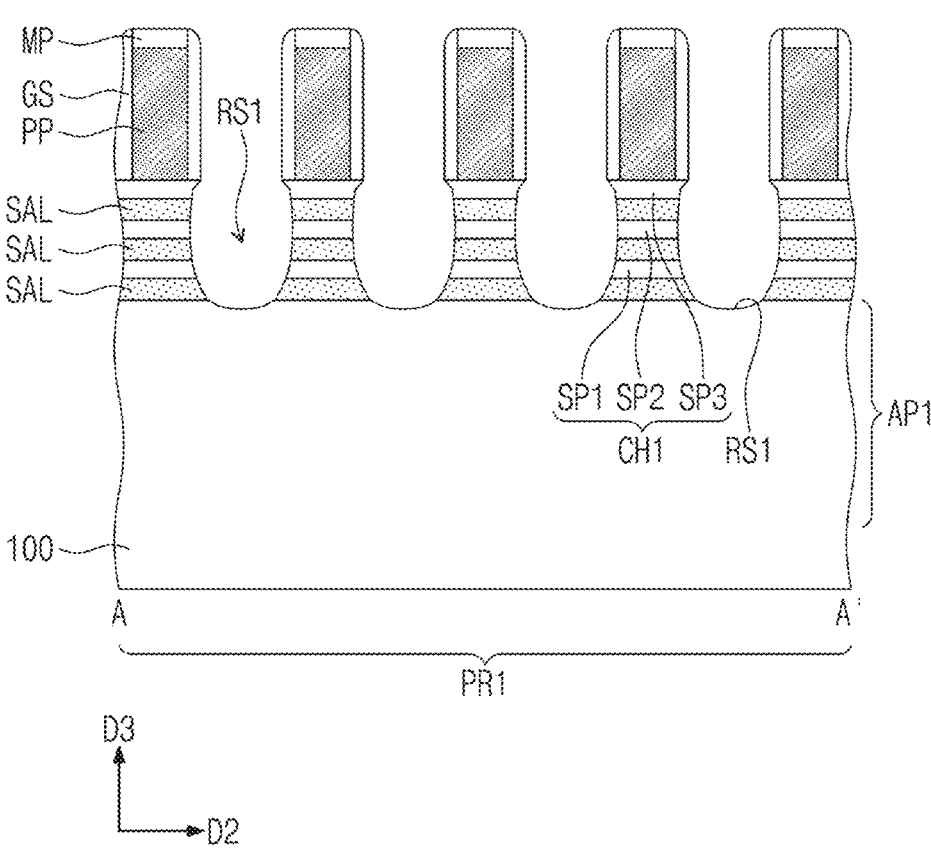
Figure 9B:
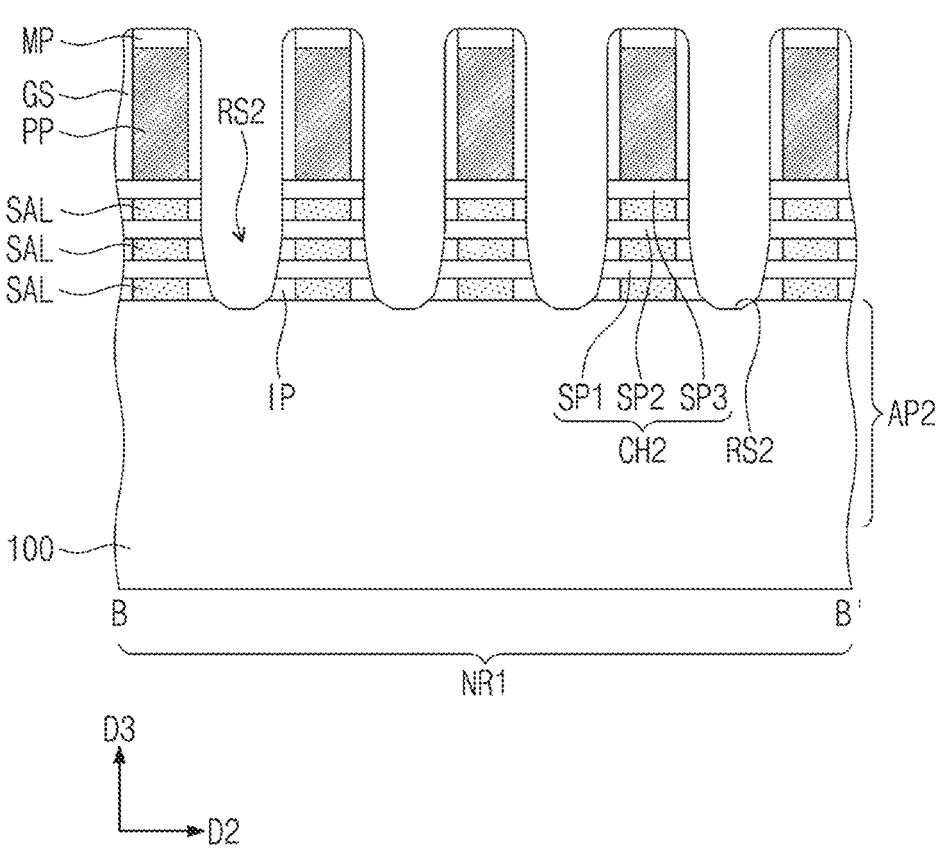
Figure 9C:
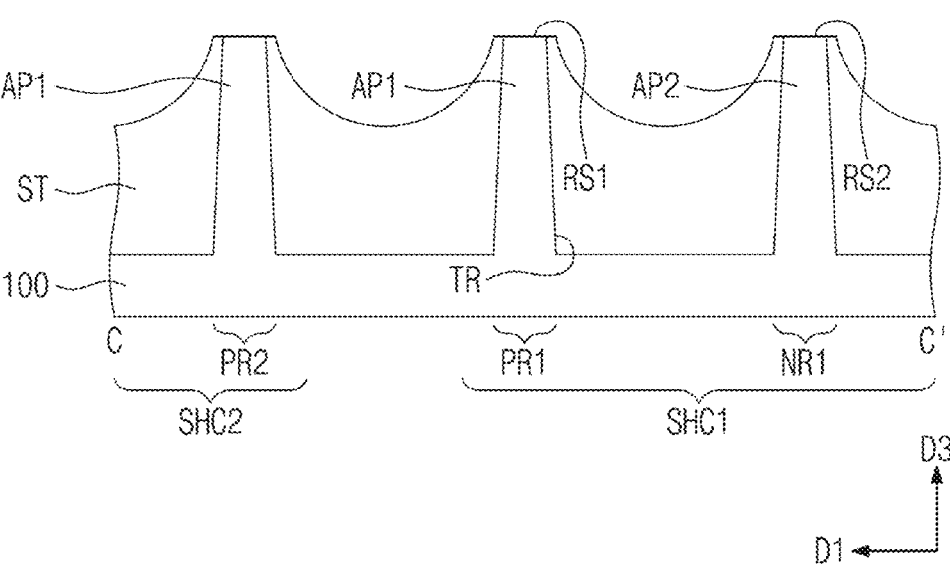
Figure 9D:
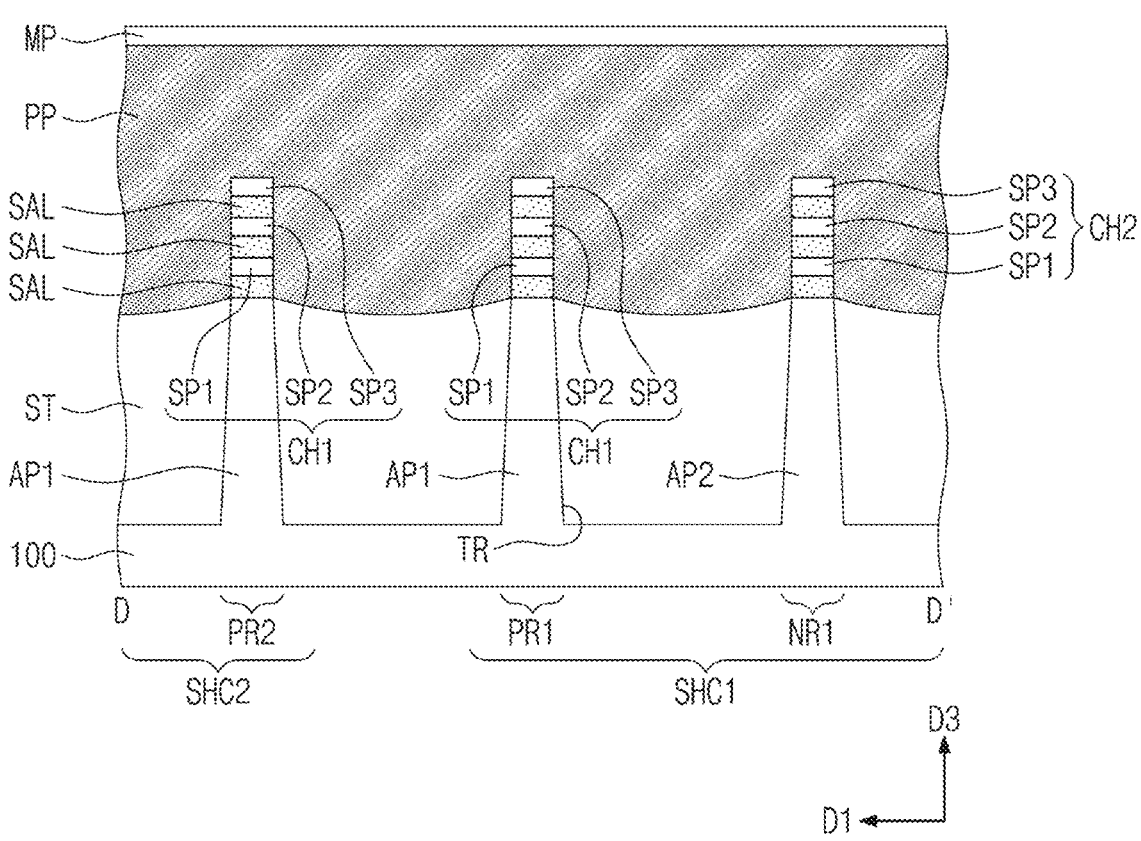
Figure 10A:
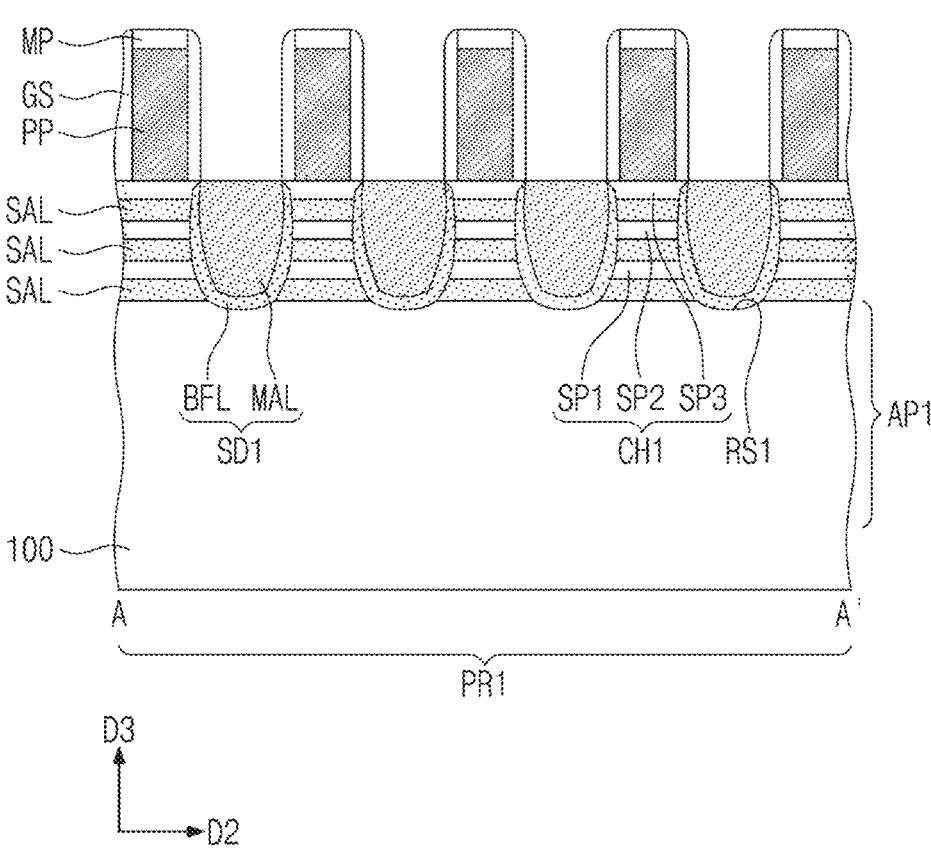
Figure 10B:
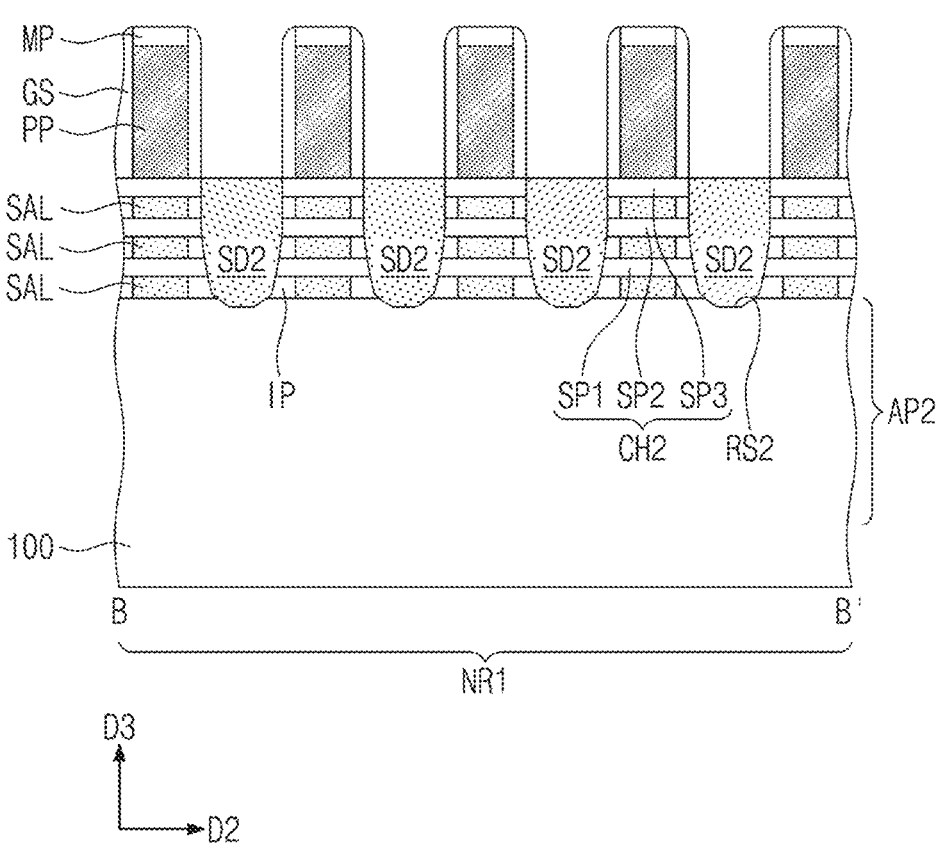
Figure 10C:
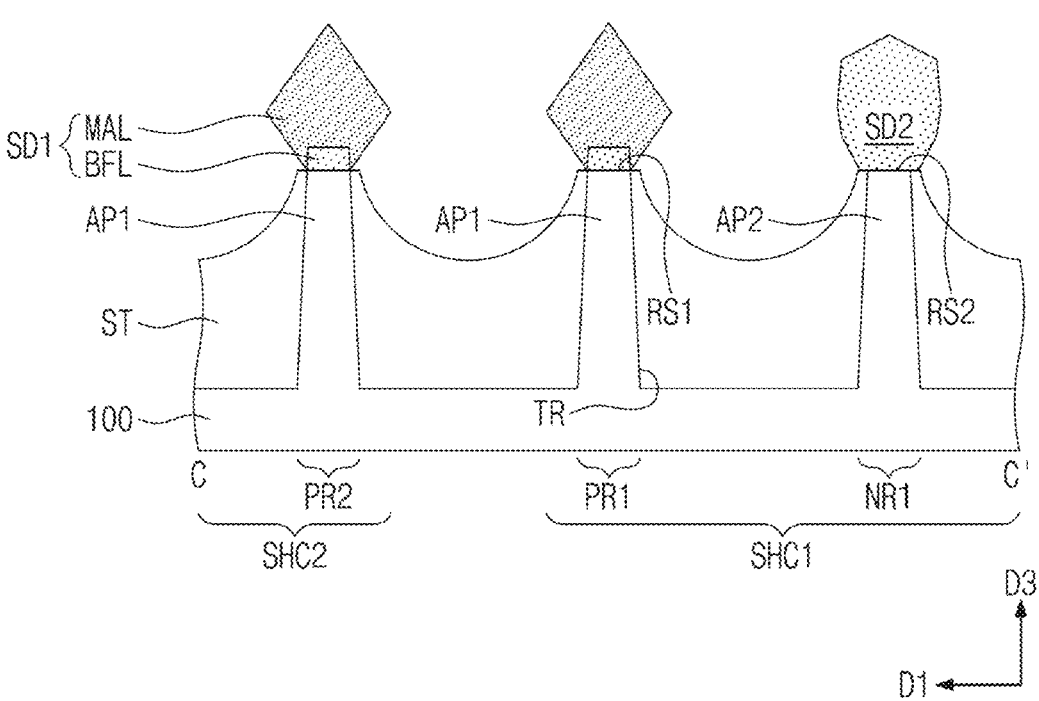
Figure 10D:
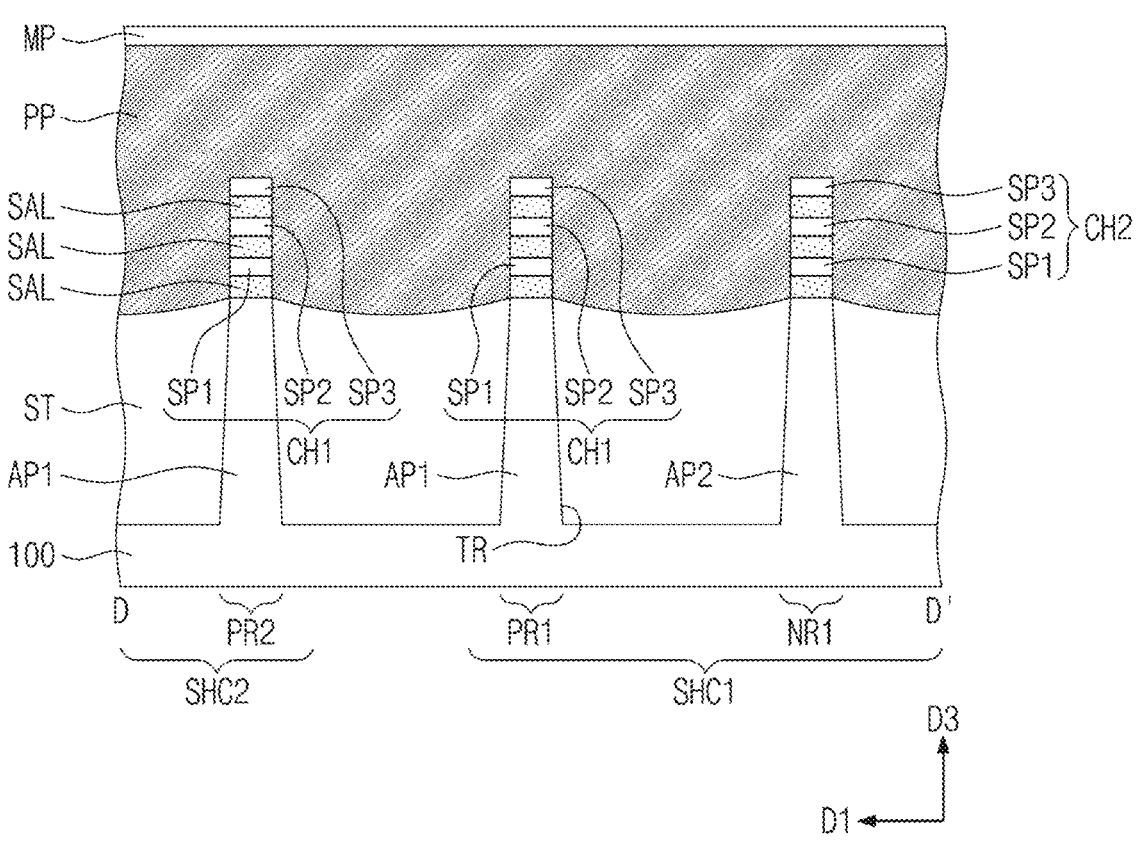
Figure 11A:
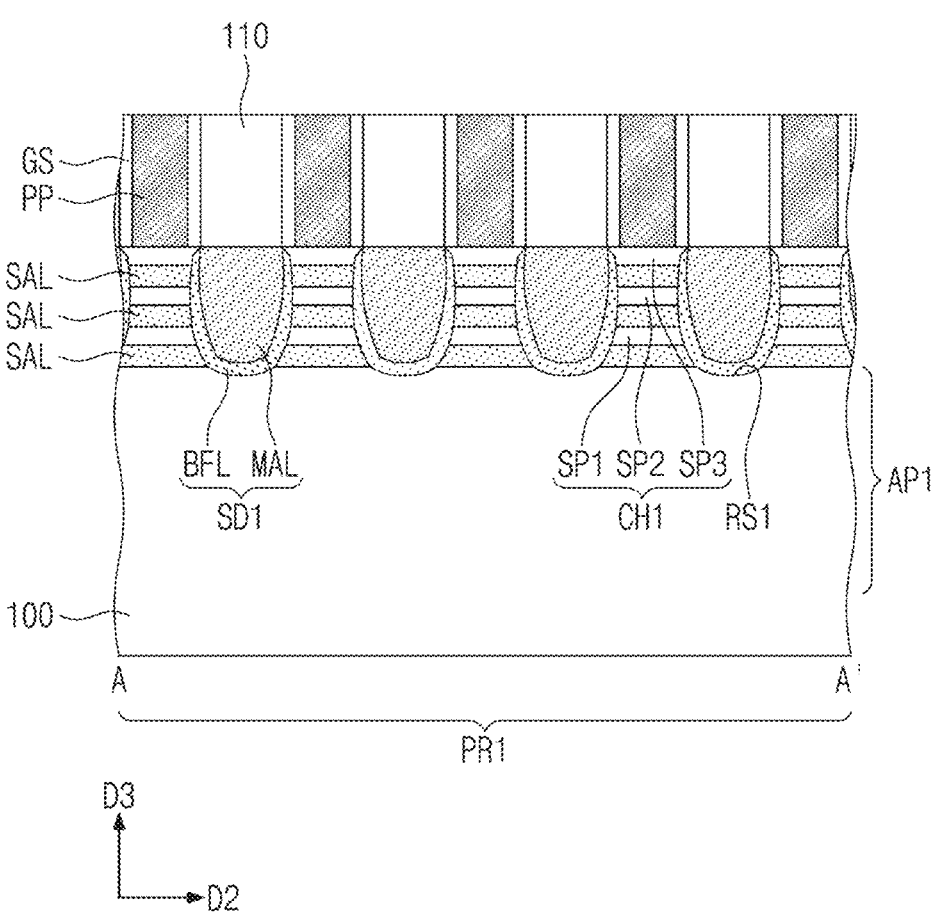
Figure 11B:
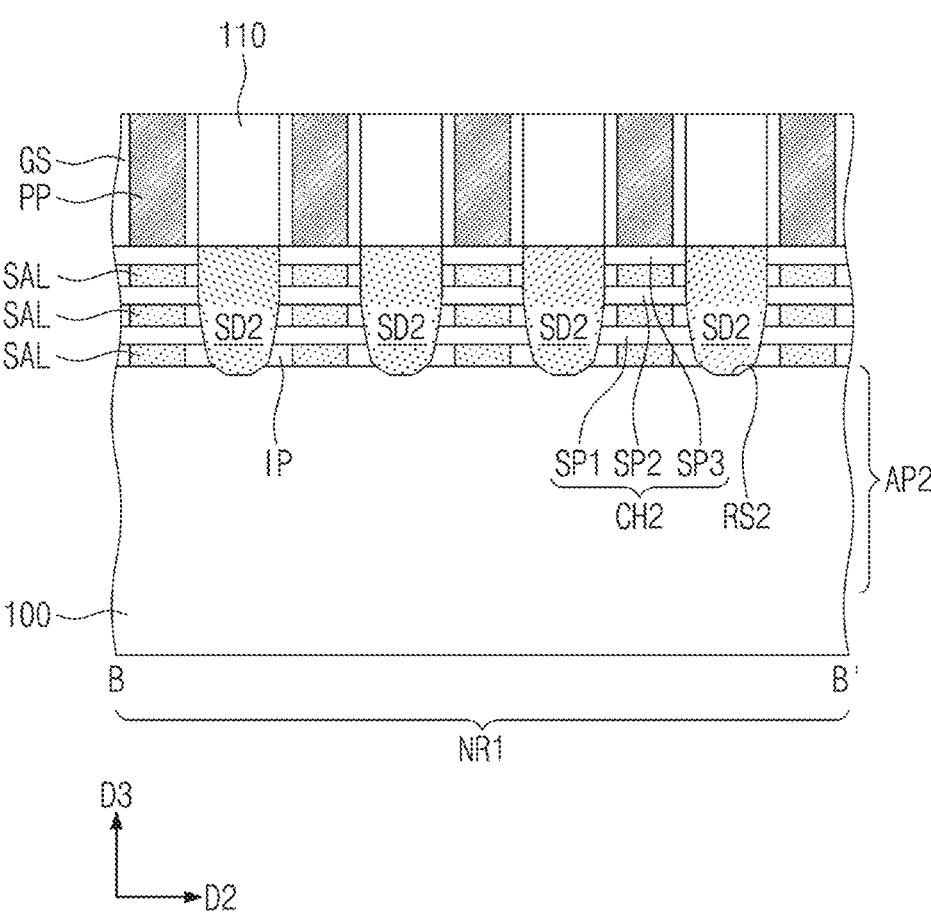
Figure 11C:
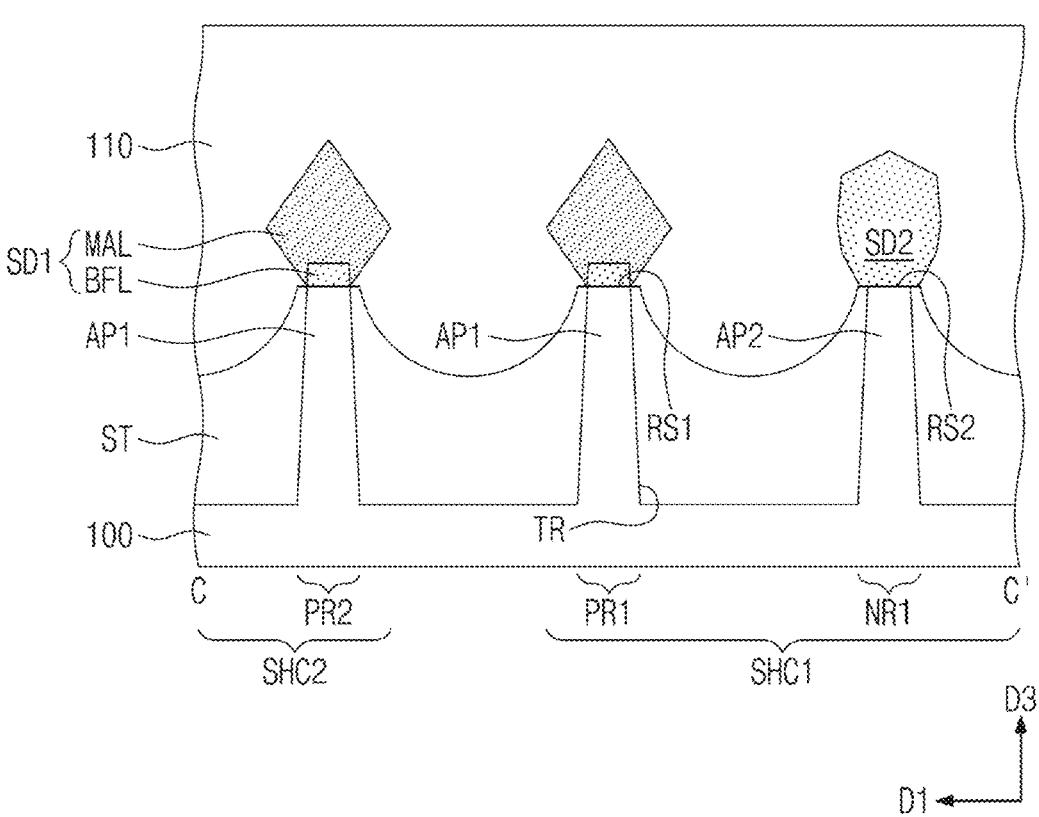
Figure 11D:
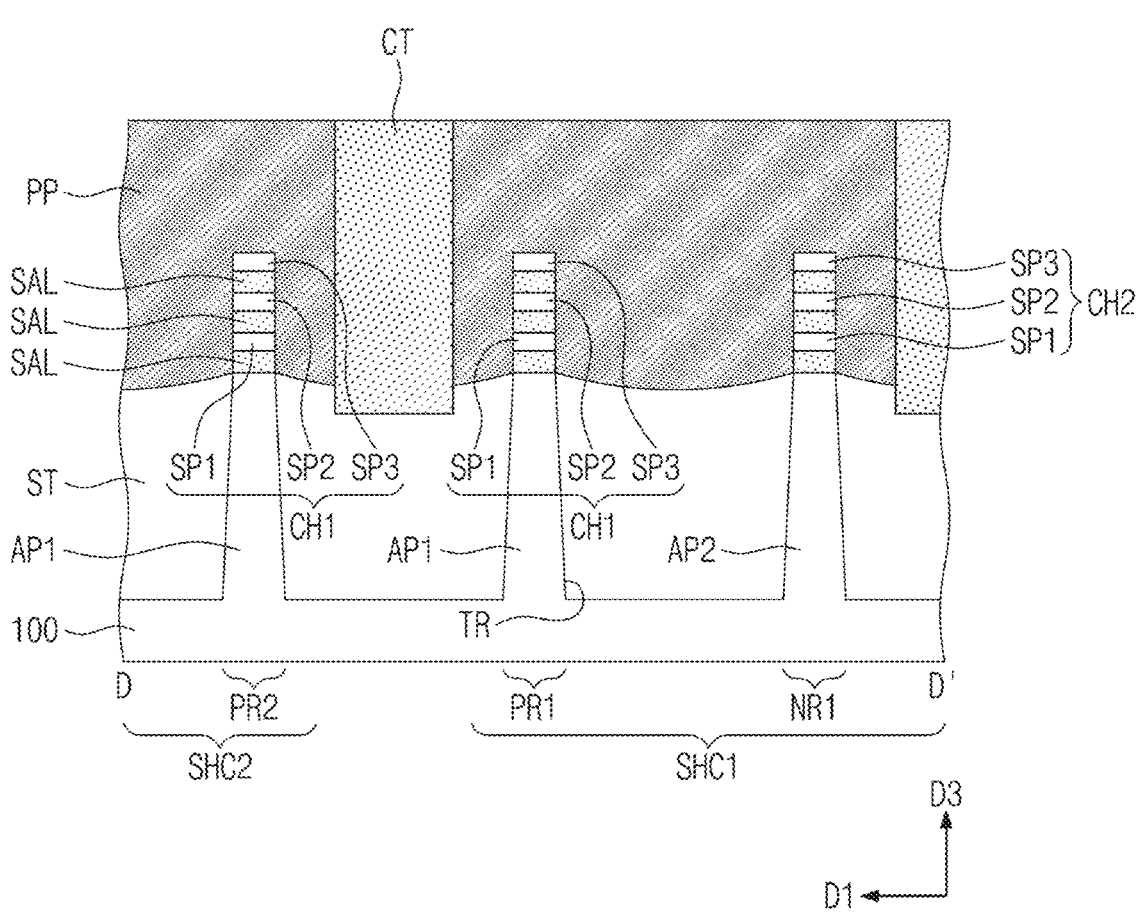
Figure 15:
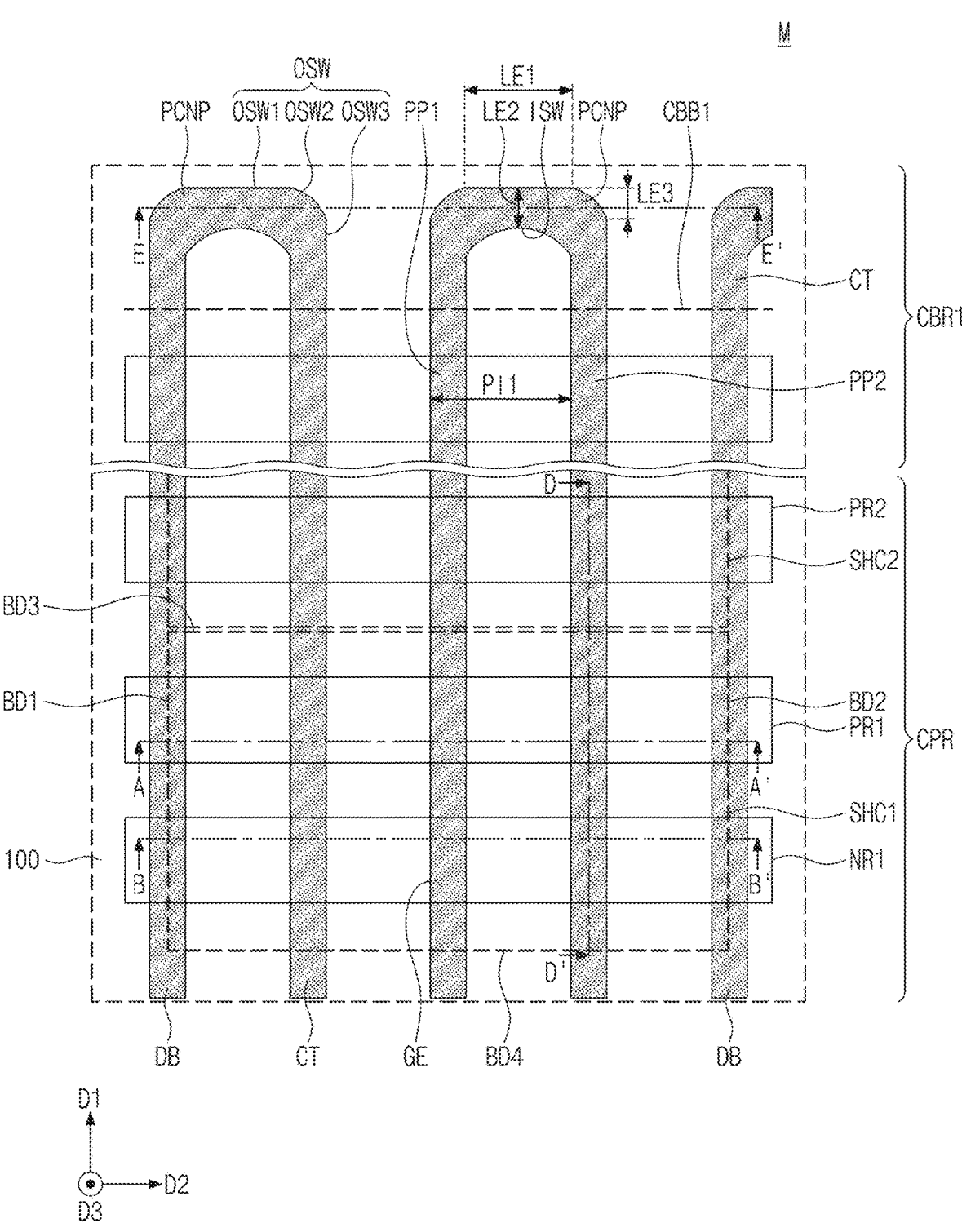
FIG. 15 is a plan view illustrating a step shown in FIGS. 8A to 8C.

FIG. 15 is a plan view illustrating a step shown in FIGS. 8A to 8C. Referring to FIGS. 15 and 8A to 8C, sacrificial patterns PP may be formed on the substrate 100 to cross the stacking patterns STP. Each of the sacrificial patterns PP may be a line-shaped pattern that is extended in the first direction D1. The sacrificial patterns PP may be arranged at the first pitch PI1 in the second direction D2.

For example, the formation of the sacrificial patterns PP may include forming a sacrificial layer on the substrate 100, forming hard mask patterns MP on the sacrificial layer, and patterning the sacrificial layer using the hard mask patterns MP as an etch mask. For example, the sacrificial layer may be formed of or include polysilicon.

The sacrificial patterns PP may include a first sacrificial pattern PP1 and a second sacrificial pattern PP2, which are adjacent to each other. The sacrificial patterns PP may further include a preliminary connection structure PCNP, which is provided to connect the first sacrificial pattern PP1 and the second sacrificial pattern PP2 to each other. The preliminary connection structure PCNP may be formed in the first block border region CBR1. The preliminary connection structure PCNP may be formed outside the first block border CBB1. A detailed planar structure of the preliminary connection structure PCNP may be the same as or substantially similar to the connection structure CNP of the gate electrode GE described above.

In an example embodiment, the sacrificial patterns PP may be formed by an EUV lithography process. In an example embodiment, the patterning process to form the sacrificial patterns PP may include a lithography process using an extreme ultraviolet (EUV) light. In the present specification, the EUV light may have a wavelength ranging from 4 nm and 124 nm and, in particular, from 4 nm and 20 nm and may be, for example, an ultraviolet light having a wavelength of 13.5 nm. The EUV light may have an energy range from 6.21 eV to 124 eV, specifically from 90 eV to 95 eV.

The EUV lithography process may include exposing a photoresist layer to the EUV light and developing the photoresist layer. As an example, the photoresist layer may be an organic photoresist layer containing an organic polymer (e.g., polyhydroxystyrene). The organic photoresist layer may further include a photosensitive compound which can be reacted with the EUV light. The organic photoresist layer may further contain a material having high EUV absorptivity (e.g., organometallic materials, iodine-containing materials, or fluorine-containing materials). As another example, the photoresist layer may be an inorganic photoresist layer containing an inorganic material (e.g., tin oxide).

The photoresist layer may be formed to have a relatively small thickness. Photoresist patterns may be formed by developing the photoresist layer, which is exposed to the EUV light. In the present example embodiment, the photoresist pattern may be formed to have a clip shape, as shown in FIGS. 4 and 15.

The hard mask patterns MP may be formed by patterning one or more mask layers, which are stacked below the photoresist patterns, using the photoresist patterns as an etch mask. The sacrificial patterns PP of a desired shape may be formed on the substrate 100 by patterning the sacrificial layer (e.g., poly-silicon layer) using the hard mask patterns MP as an etch mask.

In the present example embodiment, the sacrificial patterns PP may be formed through an EUV lithography using just one photomask. By contrast, in a comparative example, the sacrificial patterns PP may be formed by a multi patterning technique (MPT). For example, the sacrificial patterns PP may be formed by a double patterning technology (DPT) process. Concretely, in the double patterning process, two sacrificial patterns PP may be formed using one photoresist pattern as a mandrel. However, in the case where the sacrificial patterns PP are formed by the double patterning process, a distance (or pitch) between the sacrificial patterns PP may not be uniform, and this may lead to deterioration in electrical characteristics of the device.

By contrast, according to an example embodiment of the inventive concepts, an EUV lithography process may be used to directly form the first sacrificial pattern PP1, the second sacrificial pattern PP2, and the preliminary connection structure PCNP connecting them at a time. Accordingly, a distance between the sacrificial patterns PP (i.e., the first pitch PI1) may be relatively uniform.

According to an embodiment of the inventive concept, while the EUV lithography process may be used and the sacrificial patterns PP may be connected to each other using the preliminary connection structure PCNP. Thus, it may be possible to prevent a process failure (e.g., collapsing) of the sacrificial pattern PP from occurring. In other words, according to an embodiment of the inventive concept, the preliminary connection structure PCNP may serve as a supporter of increasing the structural stability of the sacrificial pattern PP.

The preliminary connection structure PCNP may include the inner side surface ISW and the outer side surface OSW, which are opposite to each other. A curvature radius of the outer side surface OSW may be larger than a curvature radius of the inner side surface ISW. In the case where an EUV lithography is used, a curvature of a pattern corner may be relatively small, compared with that by the afore-described double patterning process. Thus, the outer side surface OSW of the preliminary connection structure PCNP, which is formed using the EUV lithography process, may have a relatively small curvature. Accordingly, the preliminary connection structure PCNP may be formed to have a linewidth that is larger than a linewidth of the sacrificial pattern PP, and thus, the physical stability of the preliminary connection structure PCNP may be improved.

Referring to FIGS. 9A to 9D, a pair of the gate spacers GS may be formed on opposite side surfaces of each of the sacrificial patterns PP. The formation of the gate spacers GS may include conformally forming a gate spacer layer on the substrate 100 and anisotropically etching the gate spacer layer. In an embodiment, the gate spacer GS may be a multi-layered structure including at least two layers.

The first recesses RS1 may be formed in the stacking pattern STP on the first active pattern AP1. The second recesses RS2 may be formed in the stacking pattern STP on the second active pattern AP2. During the formation of the first and second recesses RS1 and RS2, the device isolation layer ST may also be recessed at both sides of each of the first and second active patterns AP1 and AP2 (e.g., see FIG. 9C).

For example, the first recesses RS1 may be formed by etching the stacking pattern STP on the first active pattern AP1 using the hard mask patterns MP and the gate spacers GS as an etch mask. The first recess RS1 may be formed between a pair of the sacrificial patterns PP.

The second recesses RS2 in the stacking pattern STP on the second active pattern AP2 may be formed by the same method as that for the first recesses RS1. The formation of the second recess RS2 may further include forming the inner spacers IP in recessed regions that are formed by selectively etching the sacrificial layer SAL.

The first to third semiconductor patterns SP1, SP2, and SP3, which are sequentially stacked between adjacent ones of the first recesses RS1, may be respectively formed from the active layers ACL. The first to third semiconductor patterns SP1, SP2, and SP3, which are sequentially stacked between adjacent ones of the second recesses RS2, may be respectively formed from the active layers ACL. The first to third semiconductor patterns SP1, SP2, and SP3 between the adjacent ones of the first recesses RS1 may constitute the first channel pattern CH1. The first to third semiconductor patterns SP1, SP2, and SP3 between the adjacent ones of the second recesses RS2 may constitute the second channel pattern CH2.

Referring to FIGS. 10A to 10D, the first source/drain patterns SD1 may be formed in the first recesses RS1, respectively. For example, the buffer layer BFL may be formed by a first SEG process using an inner surface of the first recess RS1 as a seed layer. The buffer layer BFL may be grown using the first to third semiconductor patterns SP1, SP2, and SP3 and the substrate 100, which are exposed through the first recess RS1, as a seed layer. In an embodiment, the first SEG process may include a chemical vapor deposition (CVD) process or a molecular beam epitaxy (MBE) process.

The buffer layer BFL may contain a semiconductor material (e.g., SiGe) whose lattice constant is larger than that of a semiconductor material of the substrate 100. The buffer layer BFL may contain a relatively low concentration of germanium (Ge). In an embodiment, the buffer layer BFL may contain only silicon (Si) without germanium (Ge). The germanium concentration of the buffer layer BFL may range from 0 at % to 10 at %.

A second SEG process may be performed on the buffer layer BFL to form the main layer MAL. The main layer MAL may be formed to fully fill the first recess RS1. The main layer MAL may contain a relatively high concentration of germanium. In an embodiment, the germanium concentration of the main layer MAL may range from 30 at % to 70 at %.

The first source/drain pattern SD1 may be doped in-situ with p-type impurities (e.g., boron, gallium, or indium) during the formation of the buffer and main layers BFL and MAL. Alternatively, impurities may be injected into the first source/drain pattern SD1, after the formation of the first source/drain pattern SD1.

The second source/drain patterns SD2 may be formed in the second recesses RS2, respectively. For example, the second source/drain pattern SD2 may be formed by a third SEG process, in which an inner surface of the second recess RS2 is used as a seed layer. In an embodiment, the second source/drain pattern SD2 may be formed of or include the same semiconductor material (e.g., Si) as the substrate 100.

During the formation of the second source/drain pattern SD2, the second source/drain pattern SD2 may be doped in-situ with n-type impurities (e.g., phosphorus, arsenic, or antimony). Alternatively, impurities may be injected into the second source/drain pattern SD2, after the formation of the second source/drain pattern SD2.

Referring to FIGS. 11A to 11D, the first interlayer insulating layer 110 may be formed to cover the first and second source/drain patterns SD1 and SD2, the hard mask patterns MP, and the gate spacers GS. As an example, the first interlayer insulating layer 110 may include a silicon oxide layer.

The first interlayer insulating layer 110 may be planarized to expose the top surfaces of the sacrificial patterns PP. The planarization of the first interlayer insulating layer 110 may be performed using an etch-back or chemical-mechanical polishing (CMP) process. All of the hard mask patterns MP may be removed during the planarization process. Accordingly, the first interlayered insulating layer 110 may have a top surface that is coplanar with the top surfaces of the sacrificial patterns PP and the top surfaces of the gate spacers GS.

A photolithography process may be performed to selectively open a region of the sacrificial pattern PP. For example, a region of the sacrificial pattern PP on the third and fourth borders BD3 and BD4 of the first single height cell SHC1 may be selectively opened. The opened region of the sacrificial pattern PP may be selectively etched and removed. The gate cutting pattern CT may be formed by filling a space, which is formed by removing the sacrificial pattern PP, with an insulating material.

Referring to FIGS. 12A to 12D, the exposed sacrificial patterns PP may be selectively removed. As a result of the removal of the sacrificial patterns PP, an outer region ORG exposing the first and second channel patterns CH1 and CH2 may be formed (e.g., see FIG. 12D). The removal of the sacrificial patterns PP may include a wet etching process which is performed using an etching solution capable of selectively etching polysilicon.

Figure 12A:
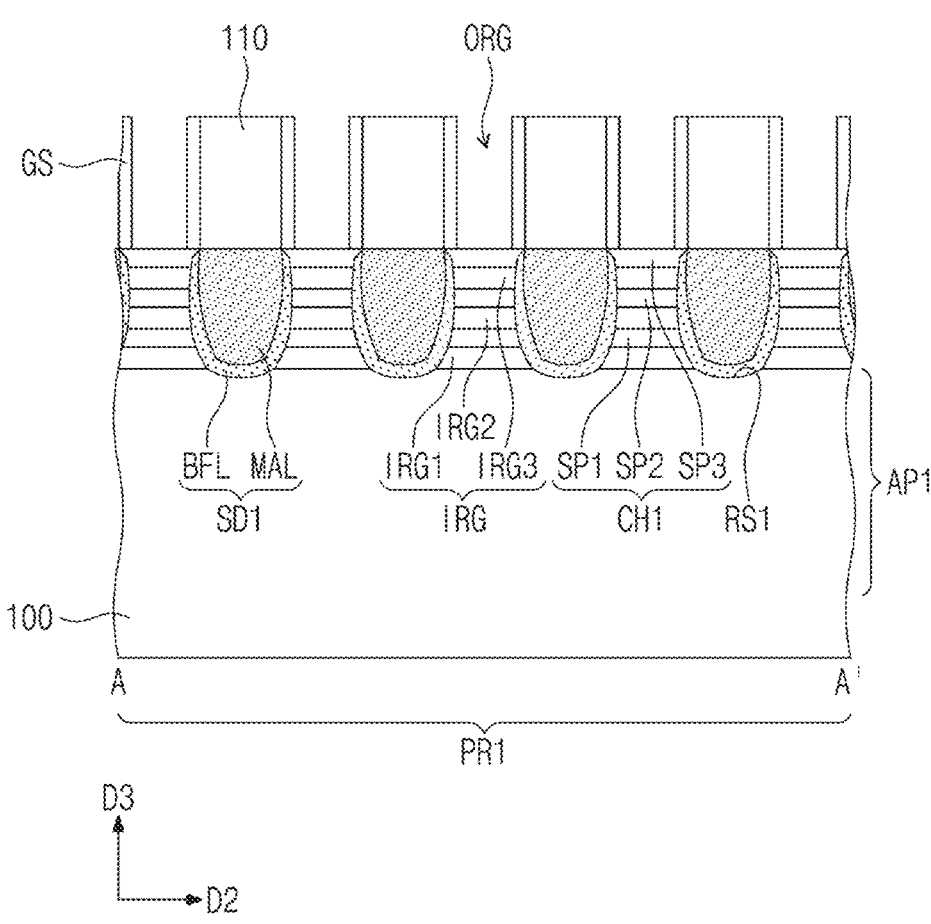
Figure 12B:
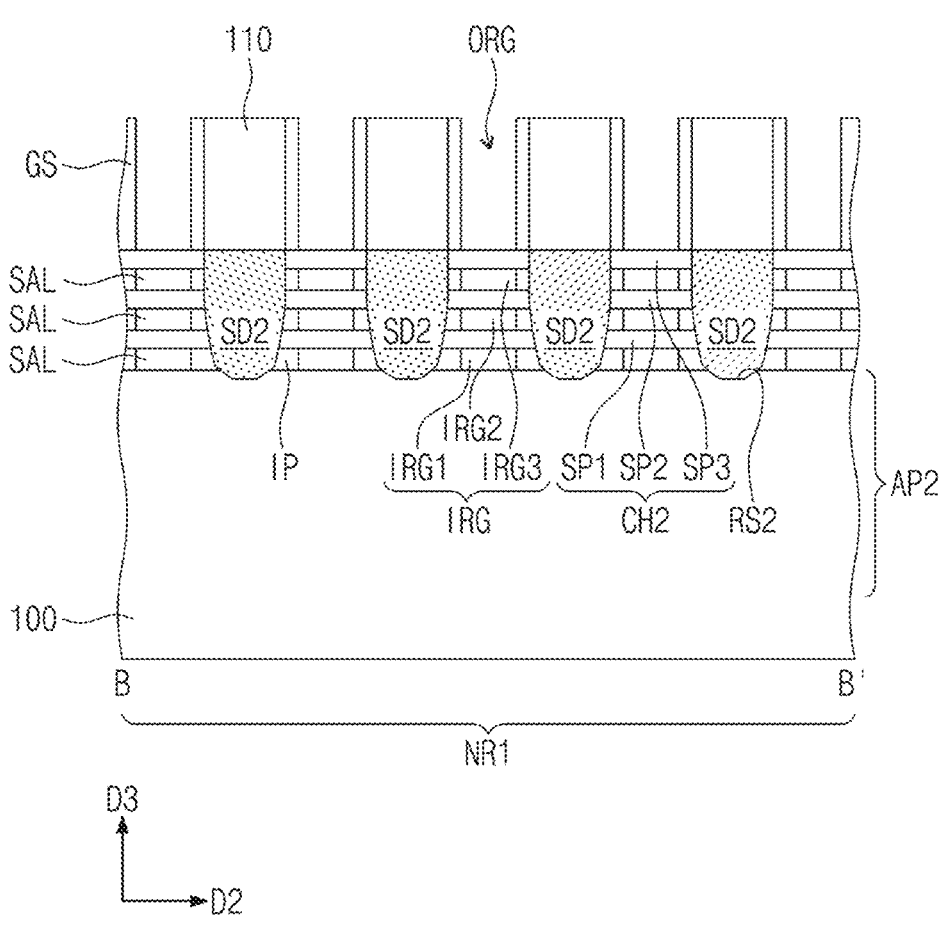
Figure 12C:
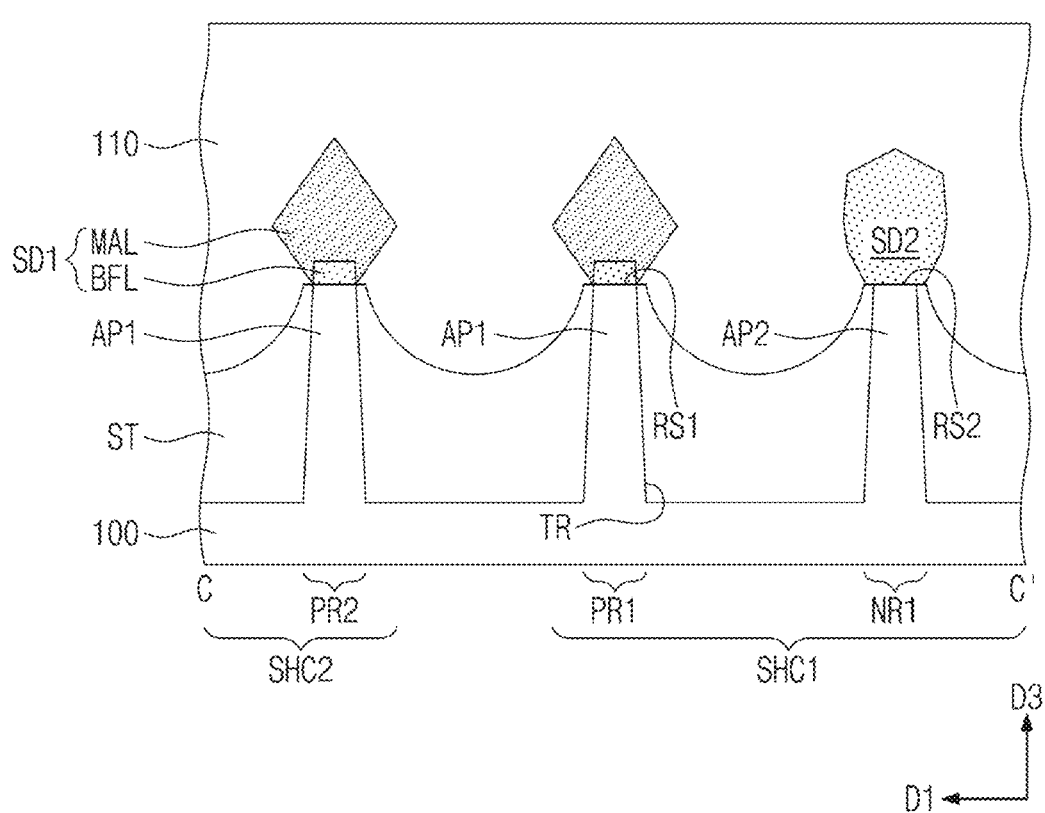
Figure 12D:
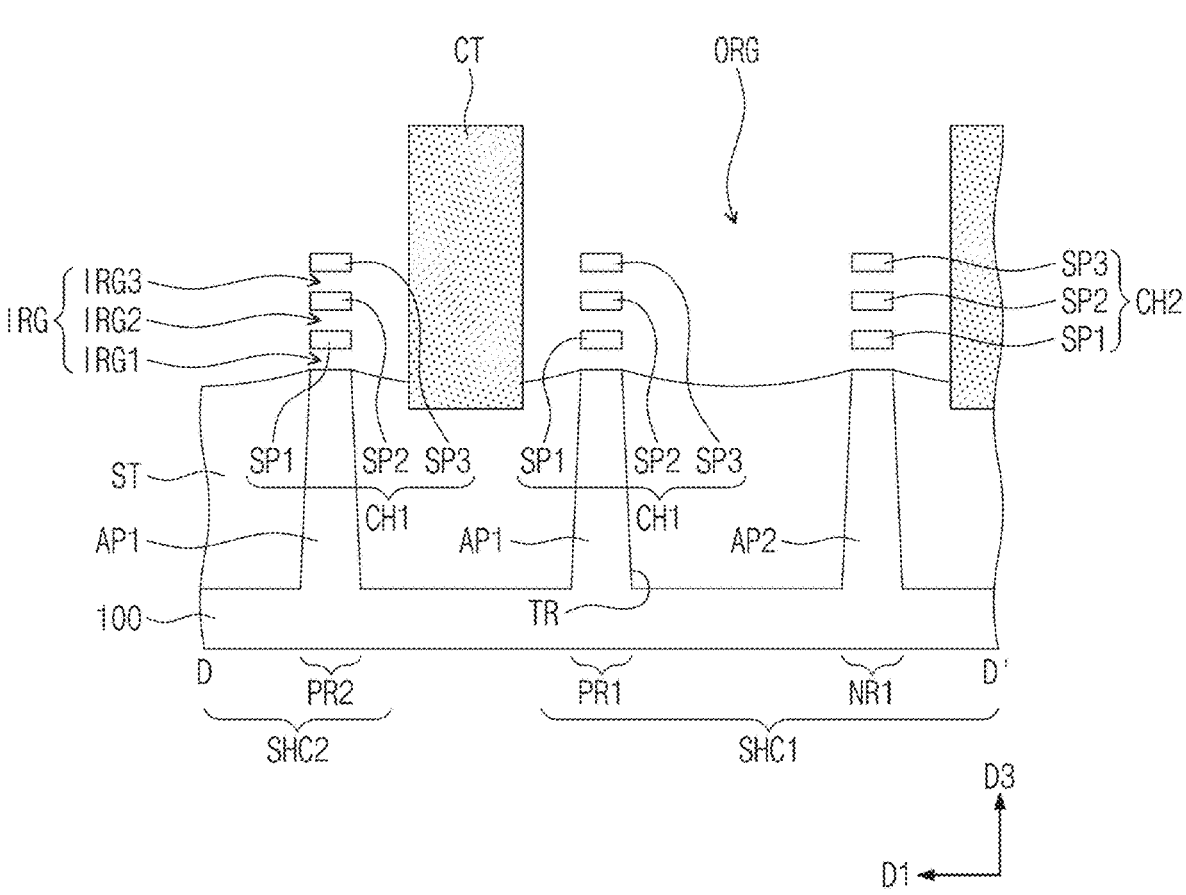
Figure 13A:
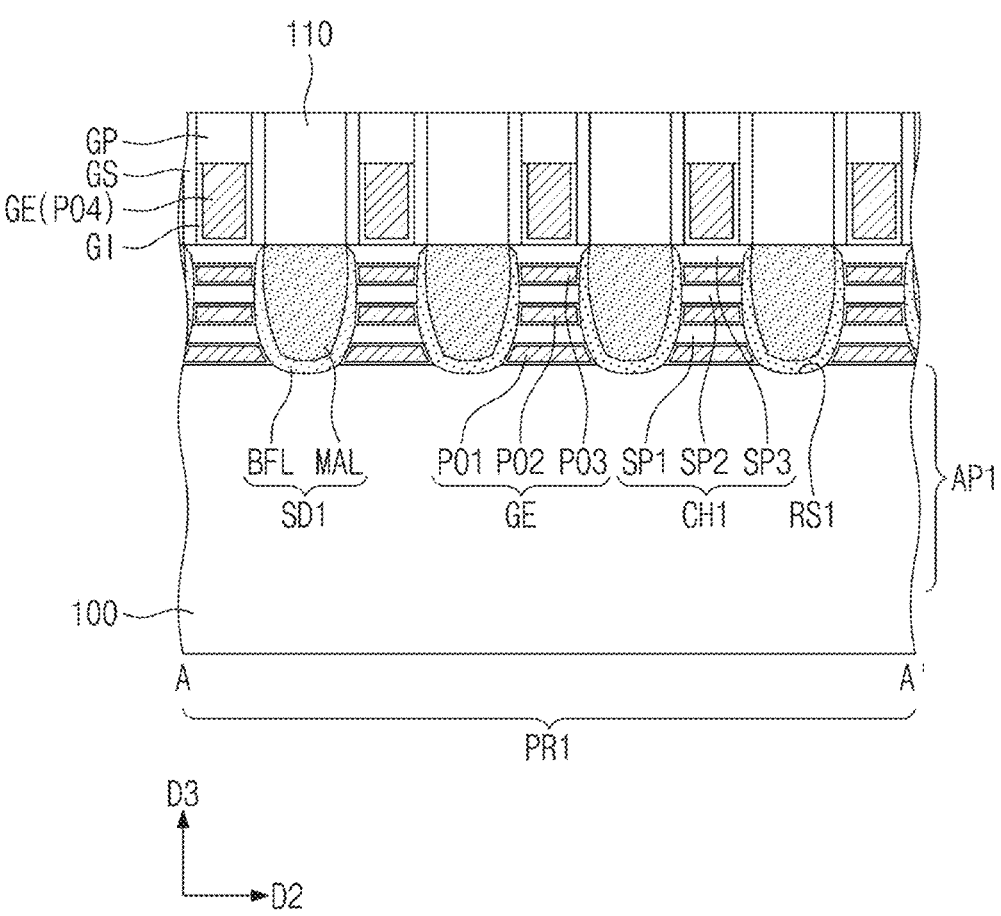
Figure 13B:
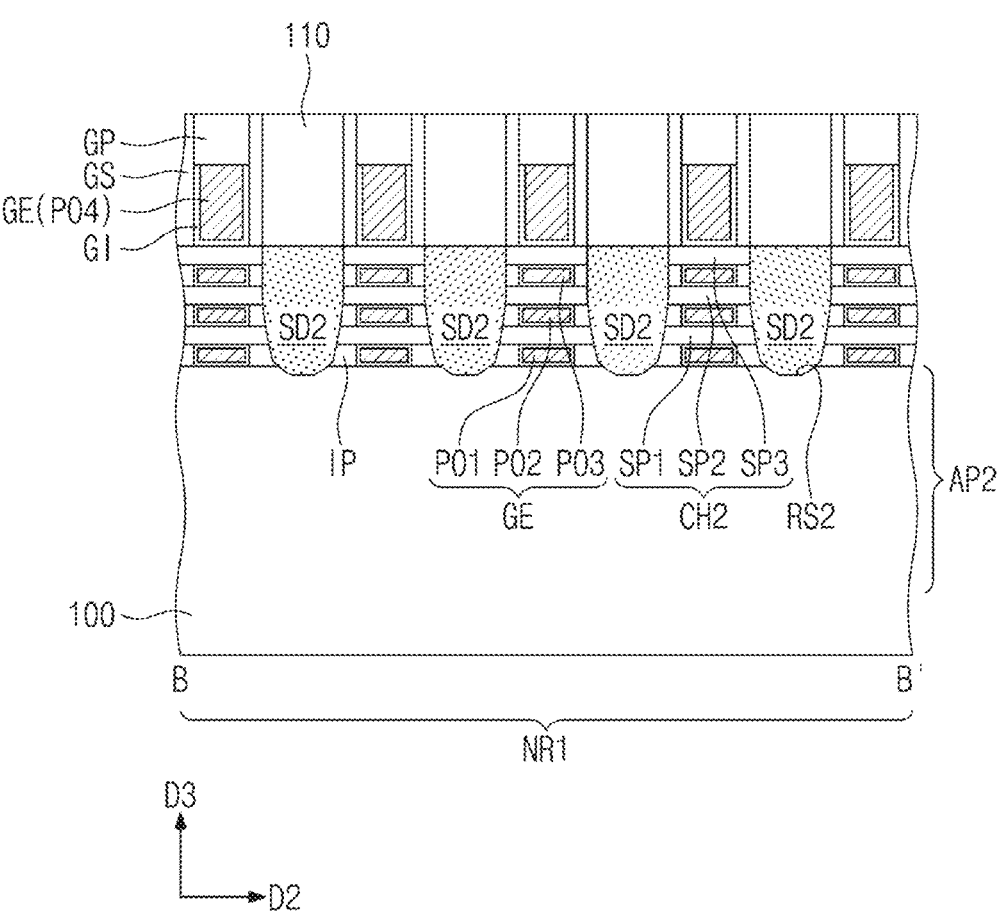
Figure 13C:
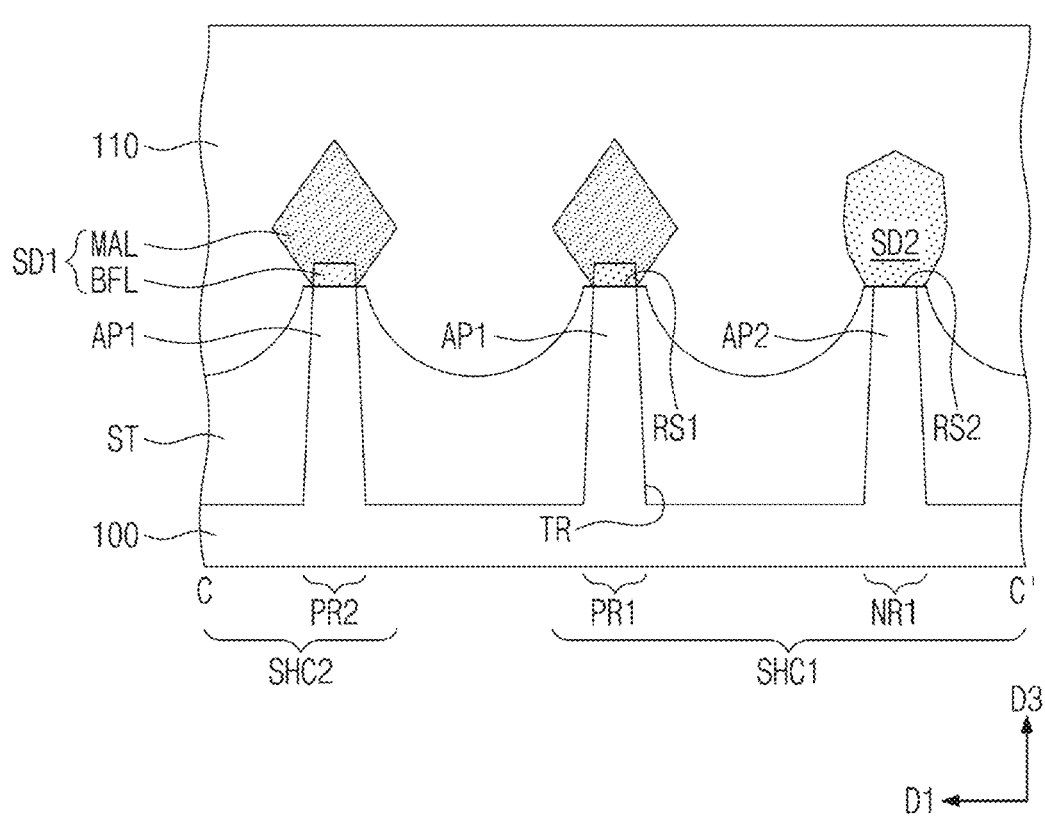
Figure 13D:
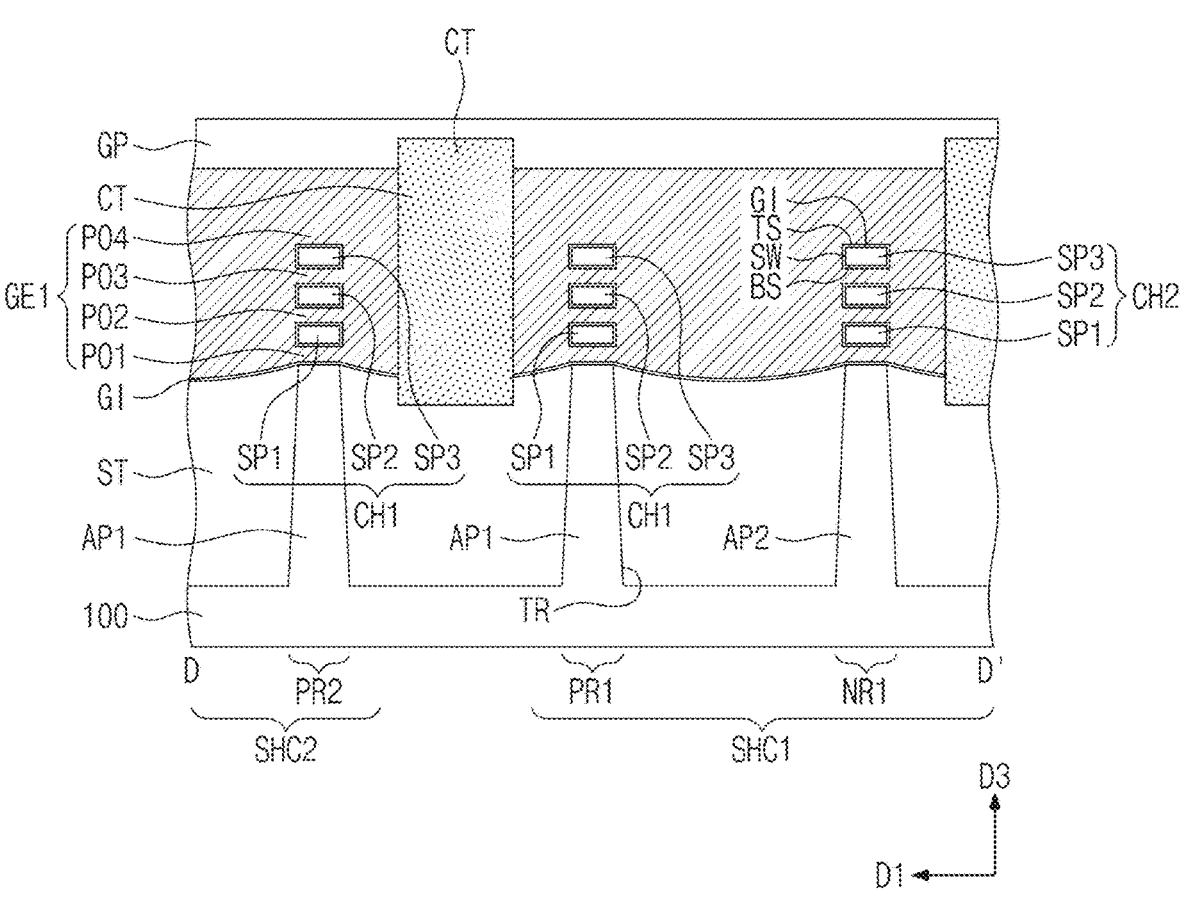
Figure 14A:
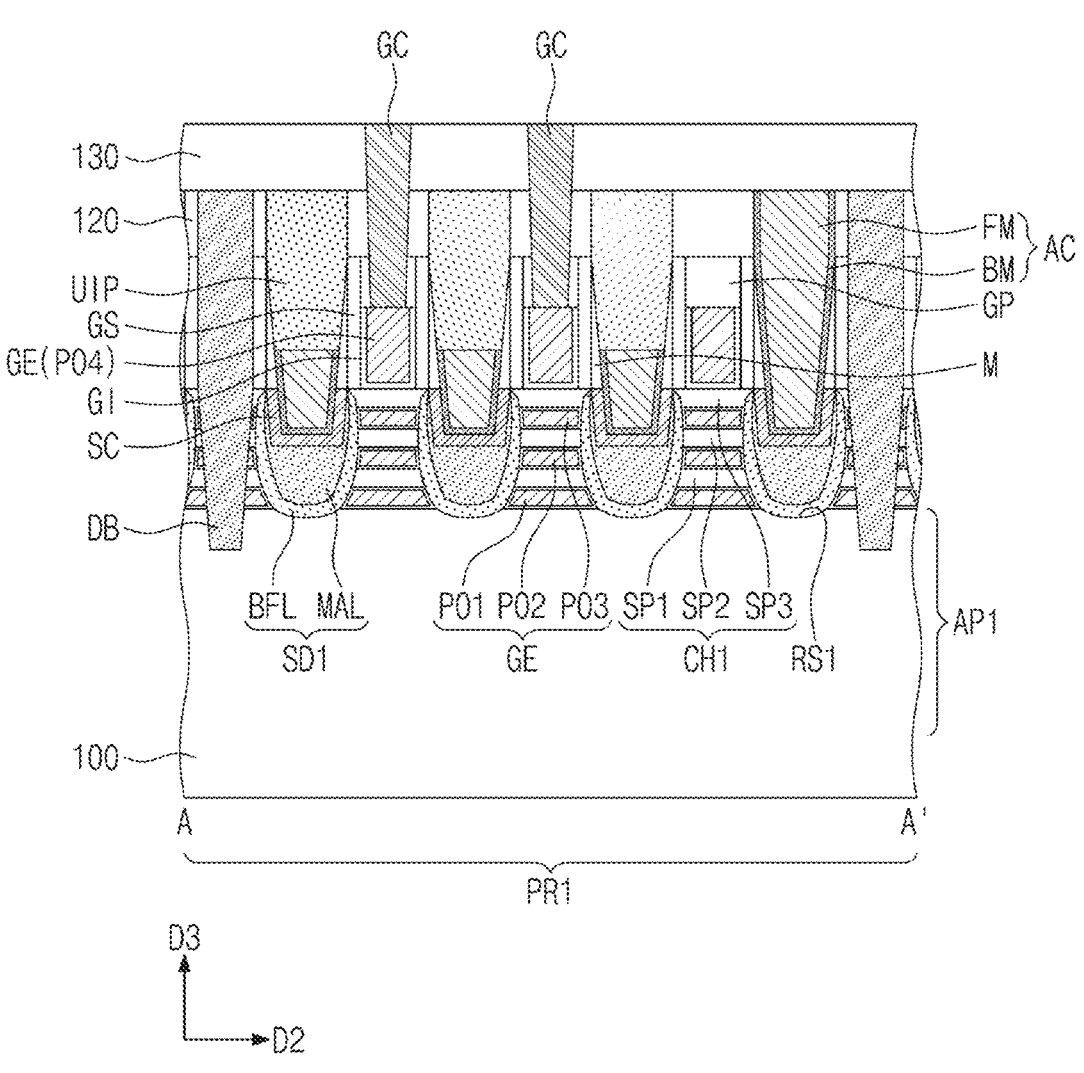
Figure 14B:
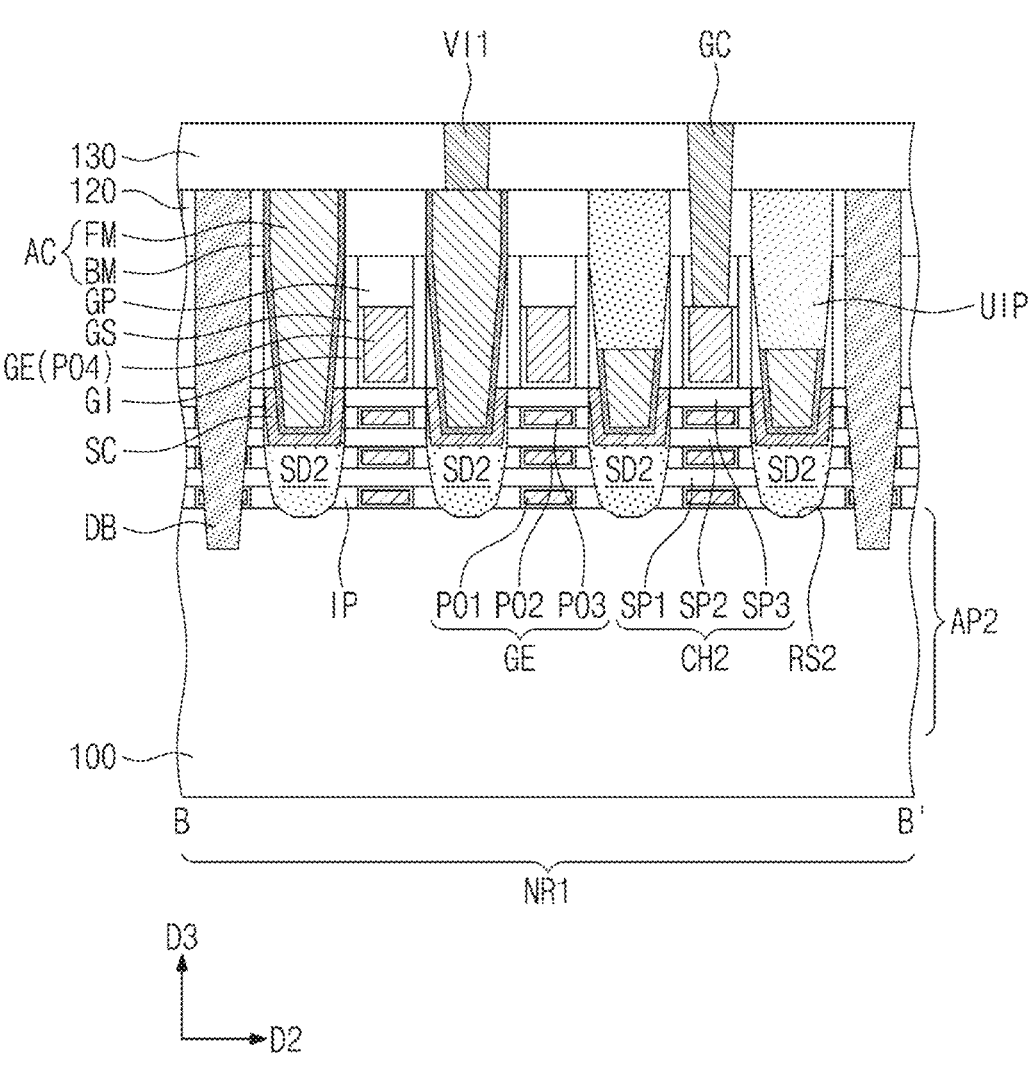
Figure 14C:
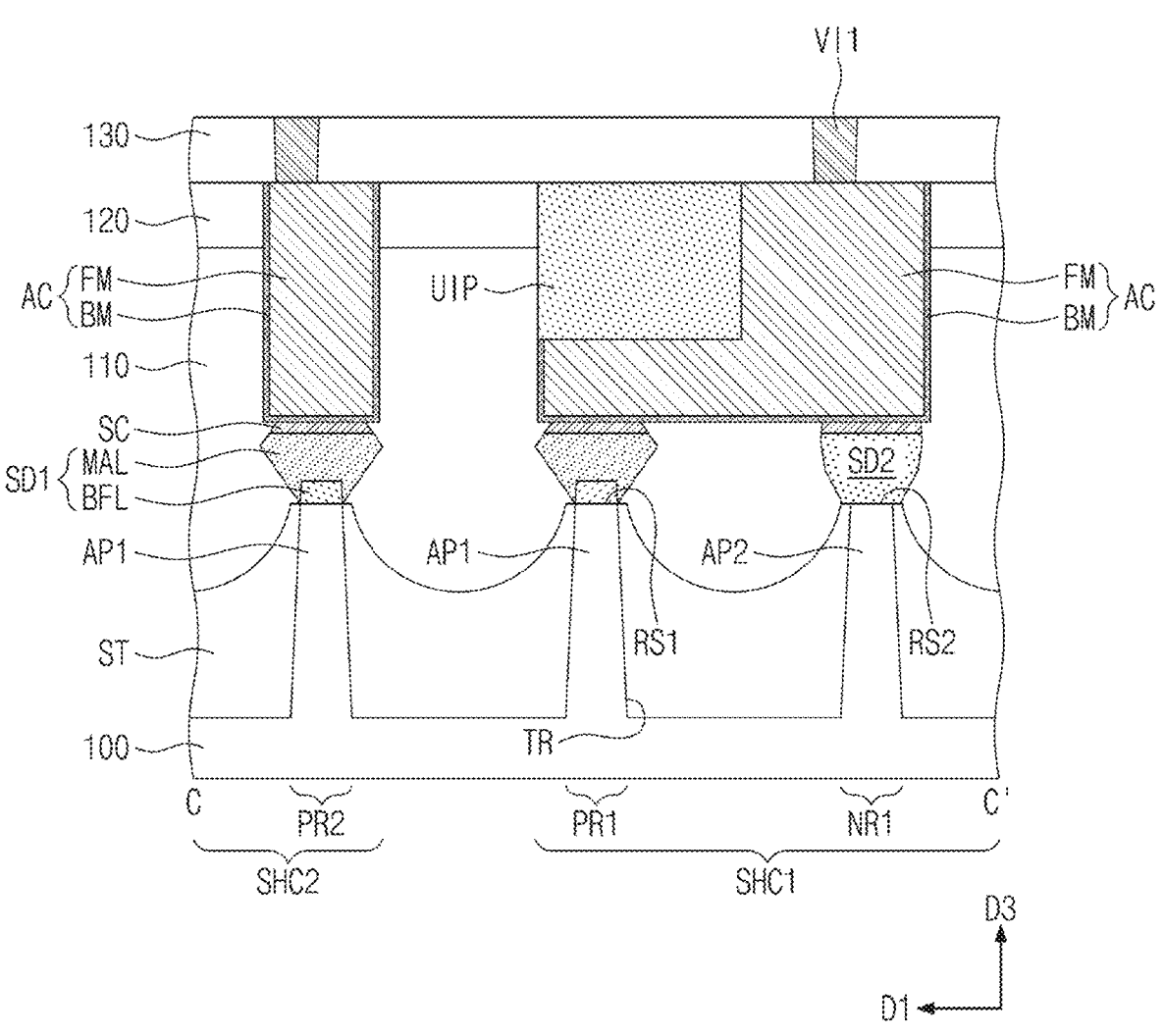
Figure 14D:
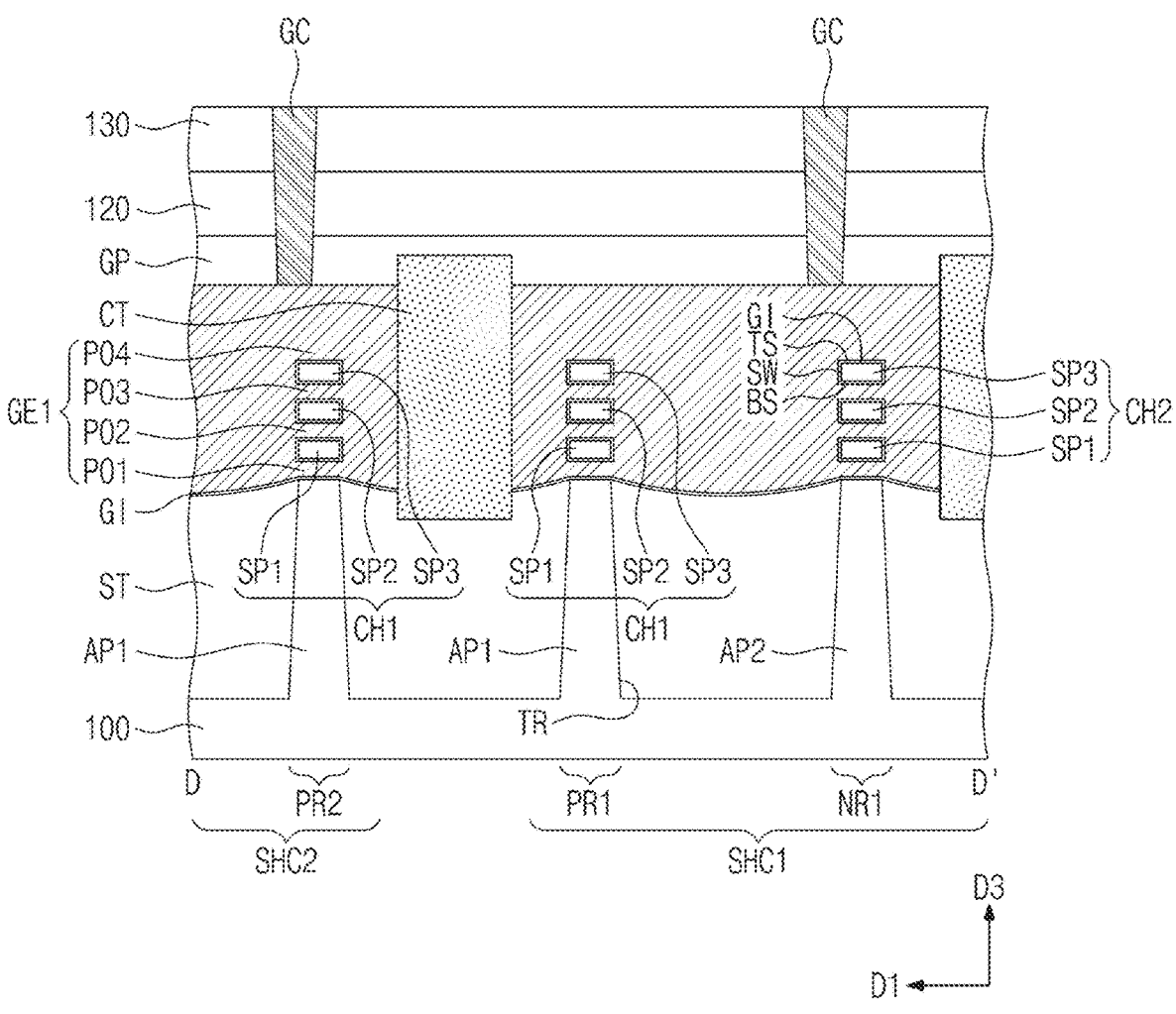

The sacrificial layers SAL exposed through the outer region ORG may be selectively removed to form inner regions IRG (e.g., see FIG. 12D). For example, by performing a process of selectively etching the sacrificial layers SAL, it may be possible to leave the first to third semiconductor patterns SP1, SP2, and SP3 and to remove only the sacrificial layers SAL. The etching process may be chosen to have a high etch rate for a material (e.g., SiGe) having a relatively high germanium concentration. For example, the etching process may be chosen to have a high etch rate for a silicon germanium layer whose germanium concentration is higher than 10 at %.

The sacrificial layers SAL on the first NMOSFET region NR1 and the first and second PMOSFET regions PR1 and PR2 may be removed during the etching process. The etching process may be a wet etching process. An etchant material, which is used in the etching process, may be chosen to quickly remove the sacrificial layer SAL having a relatively high germanium concentration. Meanwhile, the first source/drain pattern SD1 on the first and second PMOSFET regions PR1 and PR2 may be protected from the etching process by the buffer layer BFL having a relatively low germanium concentration.

Referring back to FIG. 12D, because the sacrificial layers SAL are selectively removed, only the first to third semiconductor patterns SP1, SP2, and SP3, which are stacked on each of the first and second active patterns AP1 and AP2, may be left. Empty regions, which are formed by removing the sacrificial layers SAL, may form first to third inner regions IRG1, IRG2, and IRG3, respectively.

For example, the first inner region IRG1 may be formed between the active pattern AP1 or AP2 and the first semiconductor pattern SP1, the second inner region IRG2 may be formed between the first semiconductor pattern SP1 and the second semiconductor pattern SP2, and the third inner region IRG3 may be formed between the second semiconductor pattern SP2 and the third semiconductor pattern SP3.

Referring to FIGS. 13A to 13D, the gate insulating layer GI may be conformally formed on the exposed first to third semiconductor patterns SP1, SP2, and SP3. The gate electrode GE may be formed on the gate insulating layer GI. The gate electrode GE may include the first to third inner electrodes PO1, PO2, and PO3, which are formed in the first to third inner regions IRG1, IRG2, and IRG3, and the outer electrode PO4, which is formed in the outer region ORG, respectively.

The gate electrode GE may be recessed to have a reduced height. Upper portions of the first and second gate cutting patterns CT1 and CT2 may be slightly recessed, during the recessing of the gate electrode GE. The gate capping pattern GP may be formed on the recessed gate electrode GE.

Referring to FIGS. 14A to 14D, the second interlayer insulating layer 120 may be formed on the first interlayer insulating layer 110. The second interlayer insulating layer 120 may include a silicon oxide layer. The active contacts AC may be formed to penetrate the second interlayer insulating layer 120 and the first interlayer insulating layer 110 and to be electrically connected to the first and second source/drain patterns SD1 and SD2.

The forming of the active contact AC may include forming the barrier metal BM and forming the filler metal FM on the barrier metal BM. The barrier metal BM may be conformally formed and may include a metal layer and a metal nitride layer. The filler metal FM may be formed of or include at least one of low resistance metals.

A pair of the division structures DB may be formed at both sides of each of the first and second single height cells SHC1 and SHC2. The division structure DB may penetrate the second interlayer insulating layer 120 and the gate electrode GE and may be extended into the active pattern AP1 or AP2. The division structure DB may be formed of or include an insulating material (e.g., silicon oxide or silicon nitride).

The third interlayer insulating layer 130 may be formed on the second interlayer insulating layer 120. The gate contact GC may be formed to penetrate the third interlayer insulating layer 130, the second interlayer insulating layer 120, and the gate capping pattern GP and may be connected to the gate electrode GE. The first via VI1 may be formed to penetrate the third interlayer insulating layer 130 and may be connected to the active contact AC. The gate contact GC and the first via VI1 may be formed using the same process.

Referring back to FIGS. 5 and 6A to 6D, the first metal layer M1 may be formed in the third interlayer insulating layer 130. For example, interconnection lines M1_R1, M1_R2, M1_R3, and M1_I, which are connected to the gate contact GC and the first via VI1, respectively, may be formed in an upper portion of the third interlayer insulating layer 130. The fourth interlayer insulating layer 140 may be formed on the third interlayer insulating layer 130. The second metal layer M2 may be formed in the fourth interlayer insulating layer 140.

Figure 16:
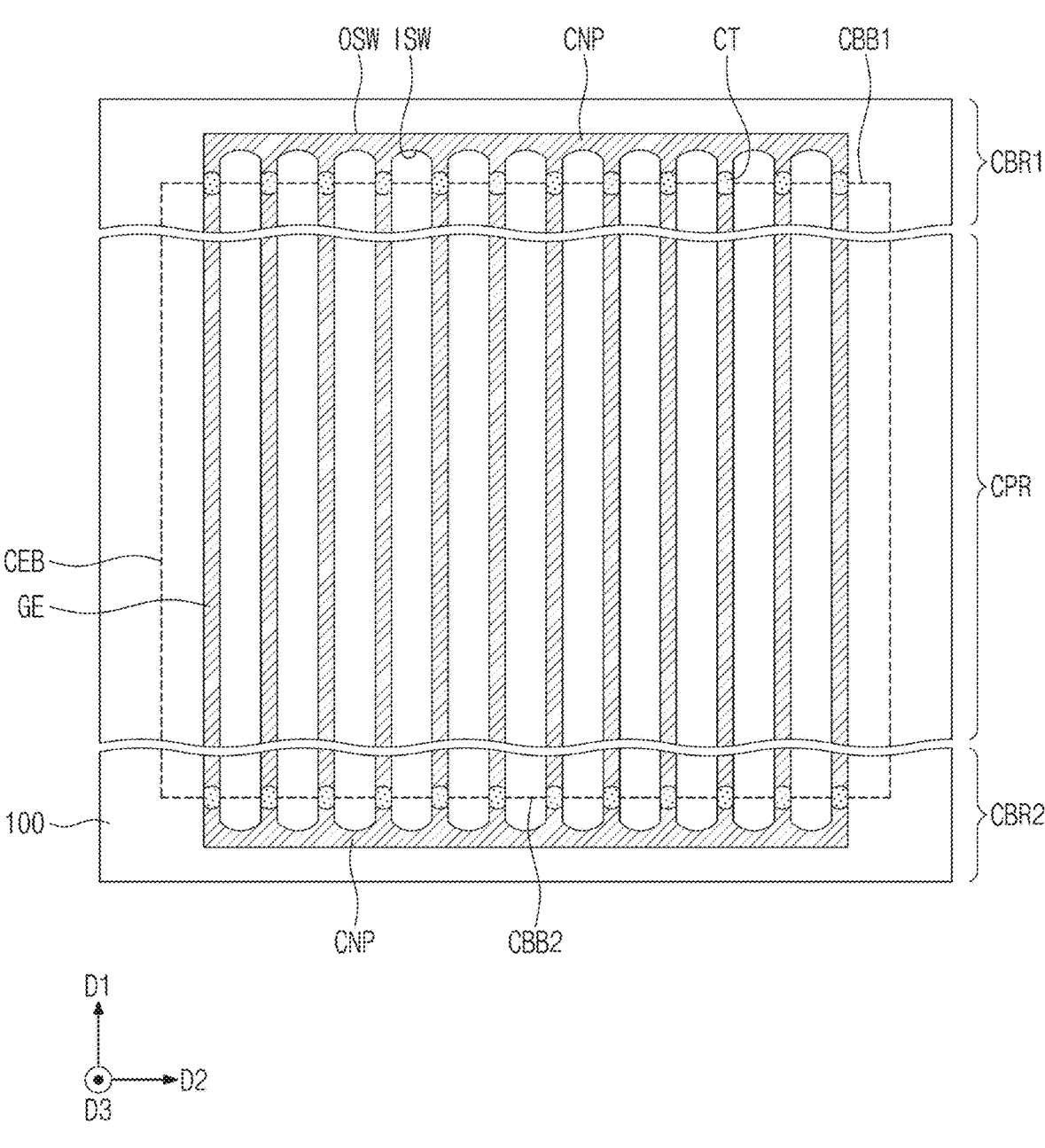
FIGS. 16, 17, and 18 are plan views, each of which illustrates a semiconductor device according to some example embodiments of the inventive concepts.
Figure 17:
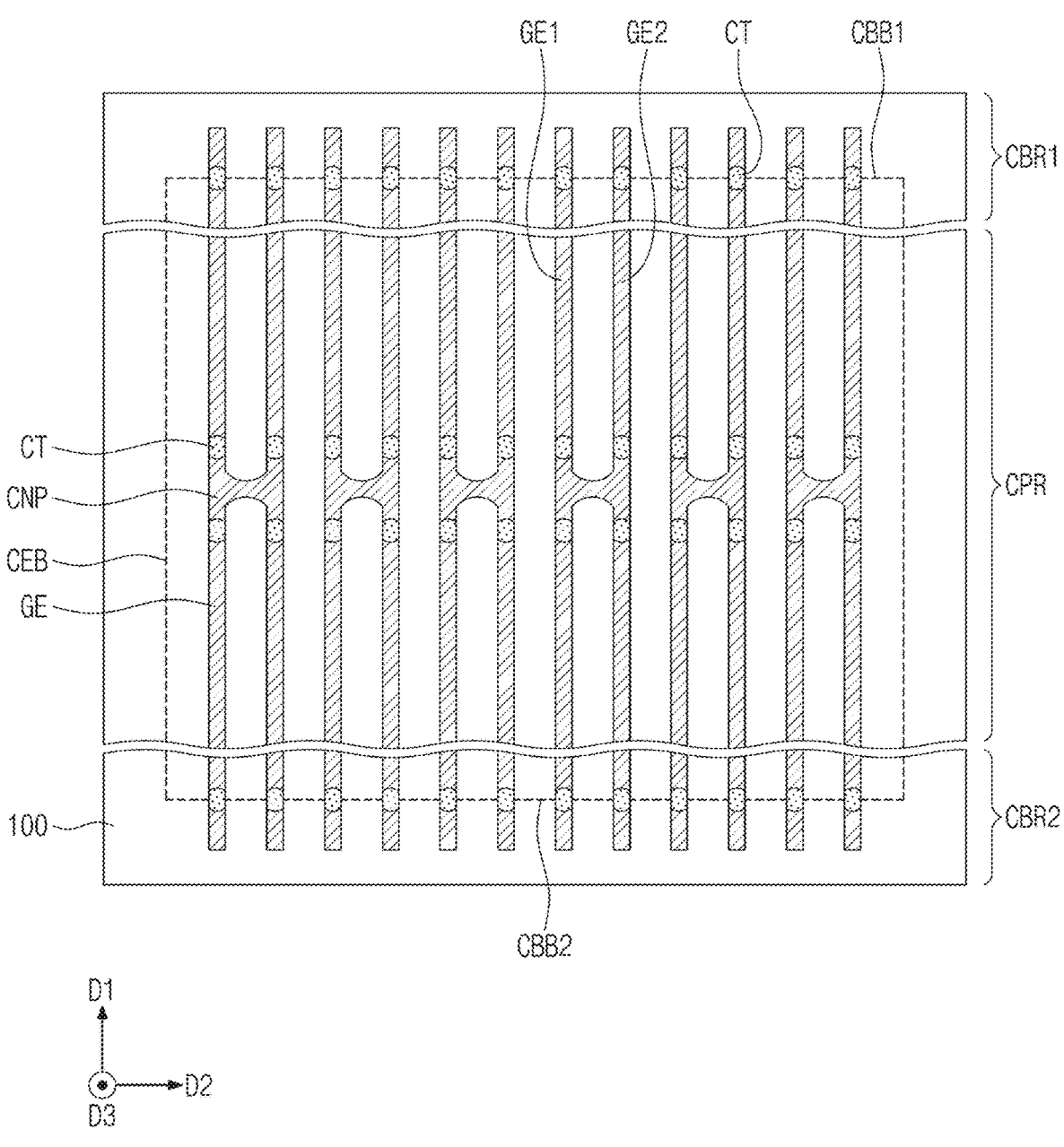
Figure 18:
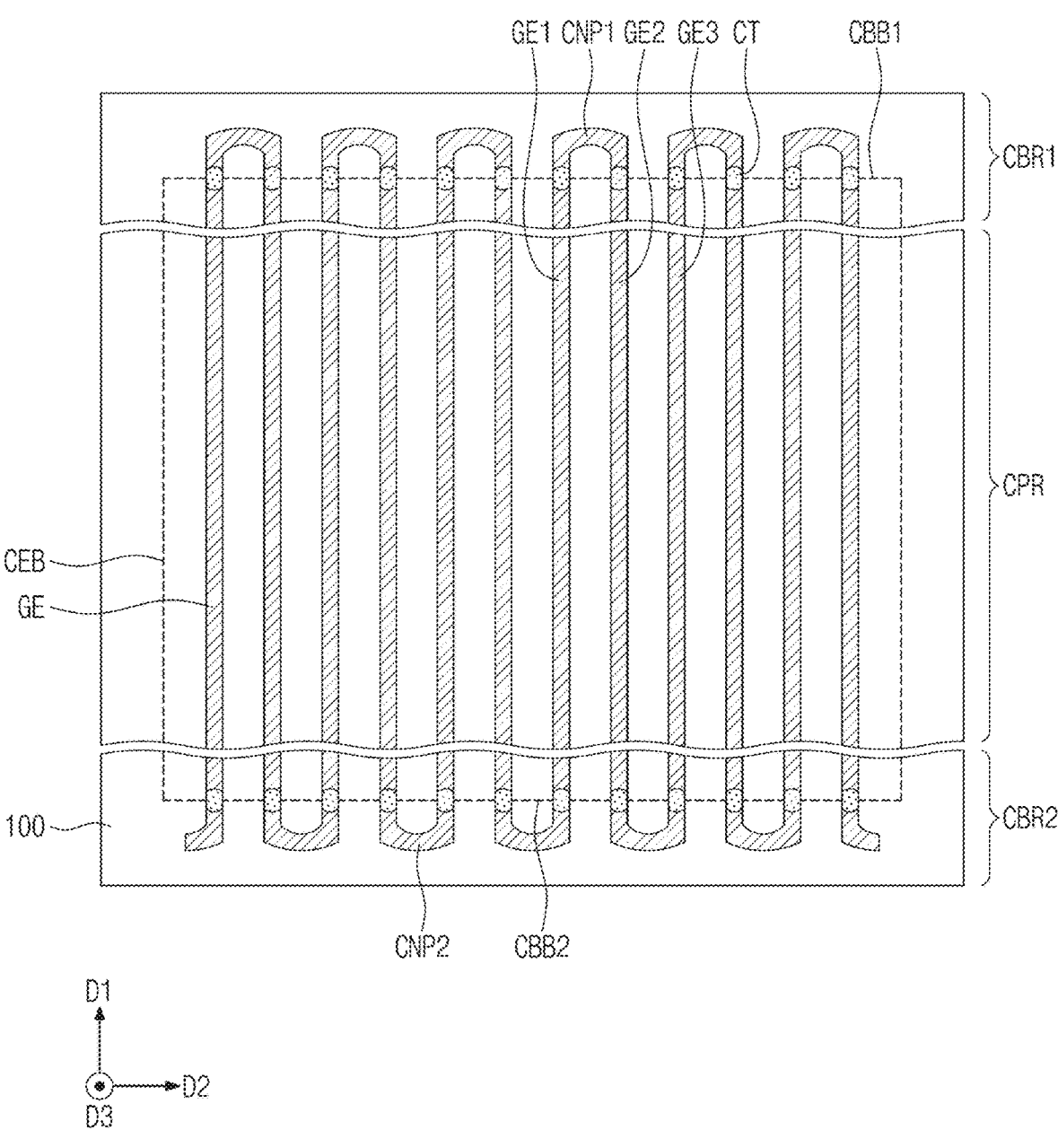
Figure 19A:
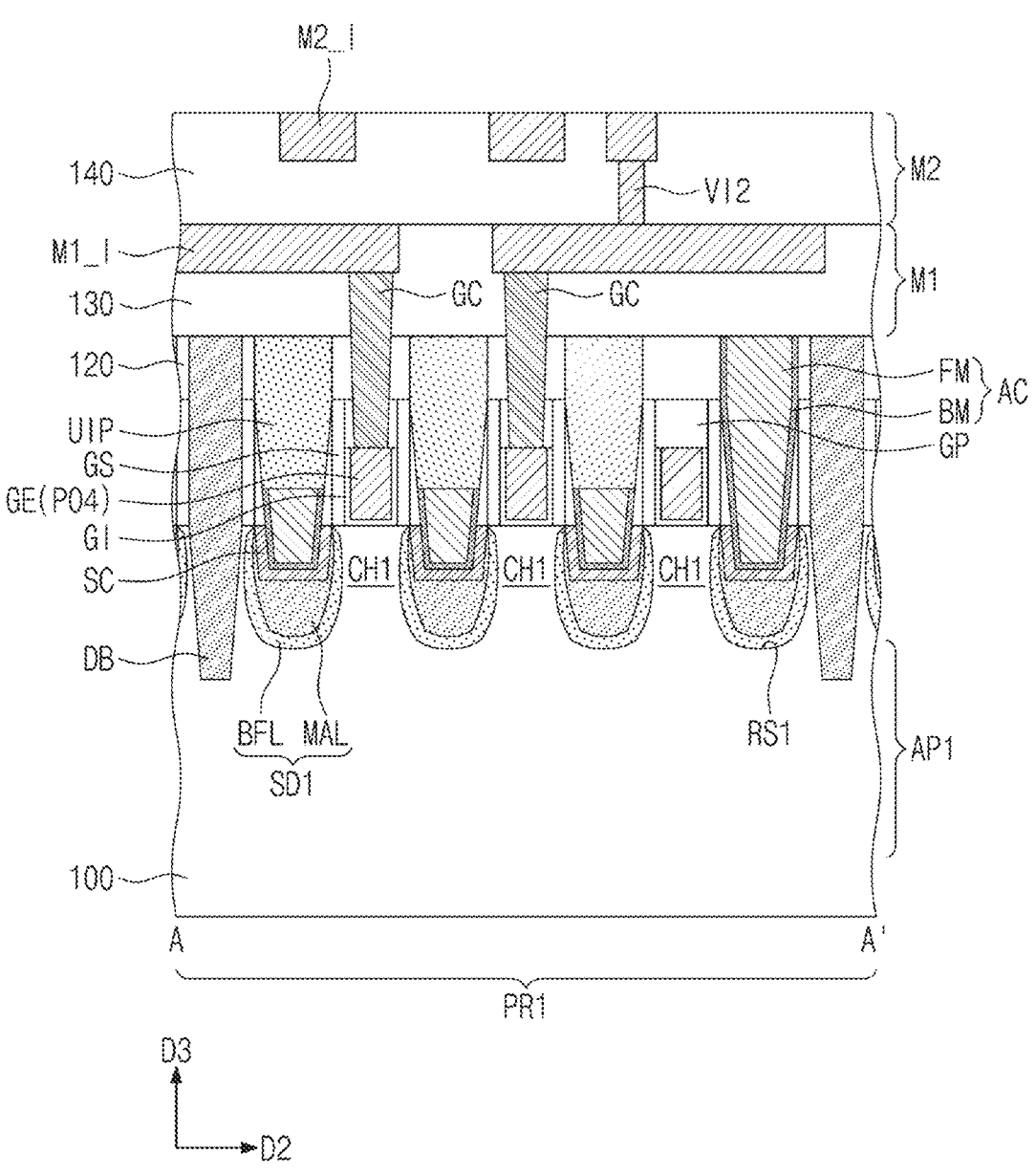
FIGS. 19A to 19D are sectional views, which are taken along the lines A-A', B-B', C-C', and D-D' of FIG. 5, respectively, to illustrate a semiconductor device according to an example embodiment of the inventive concepts.
Figure 19B:
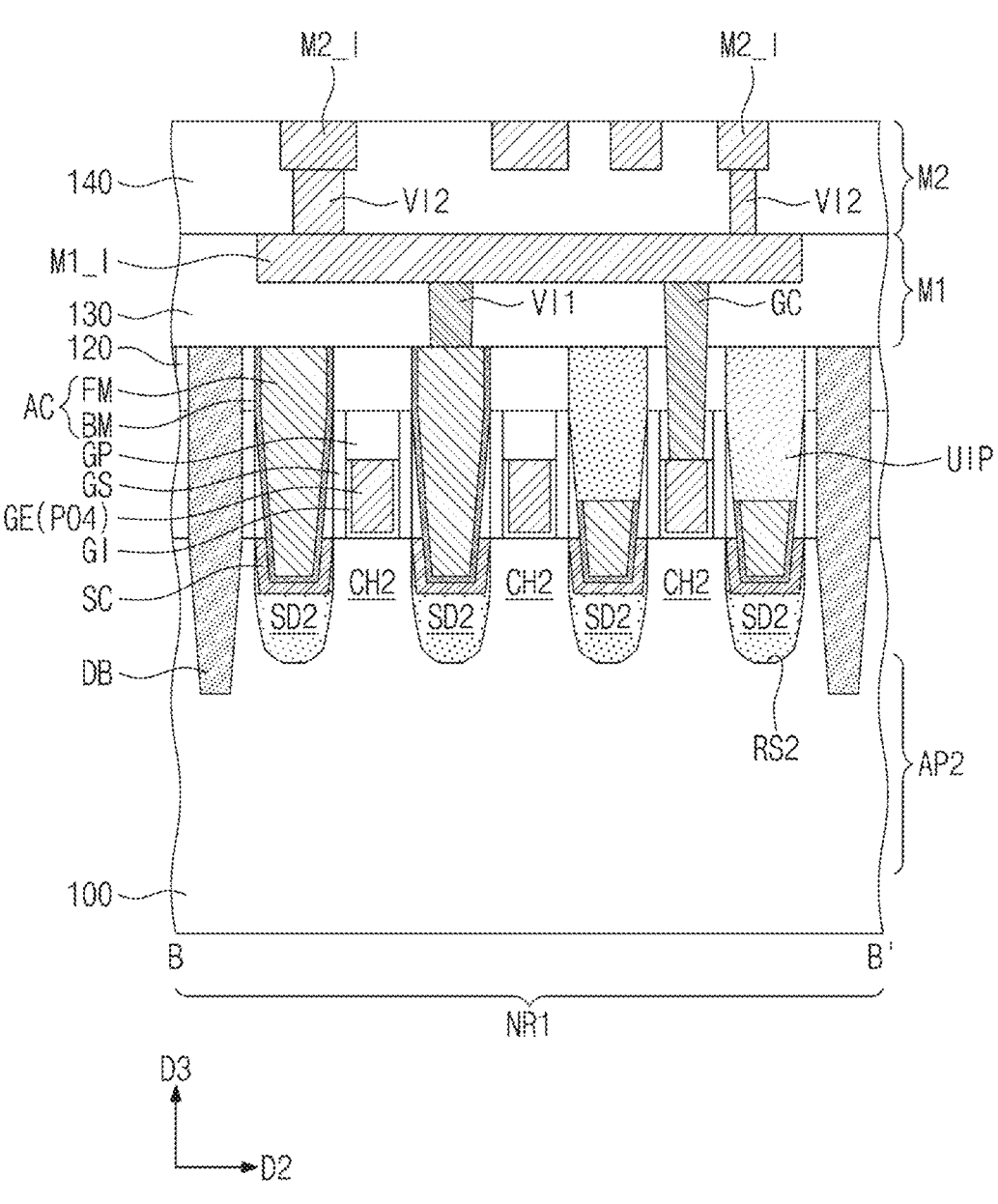
Figure 19C:
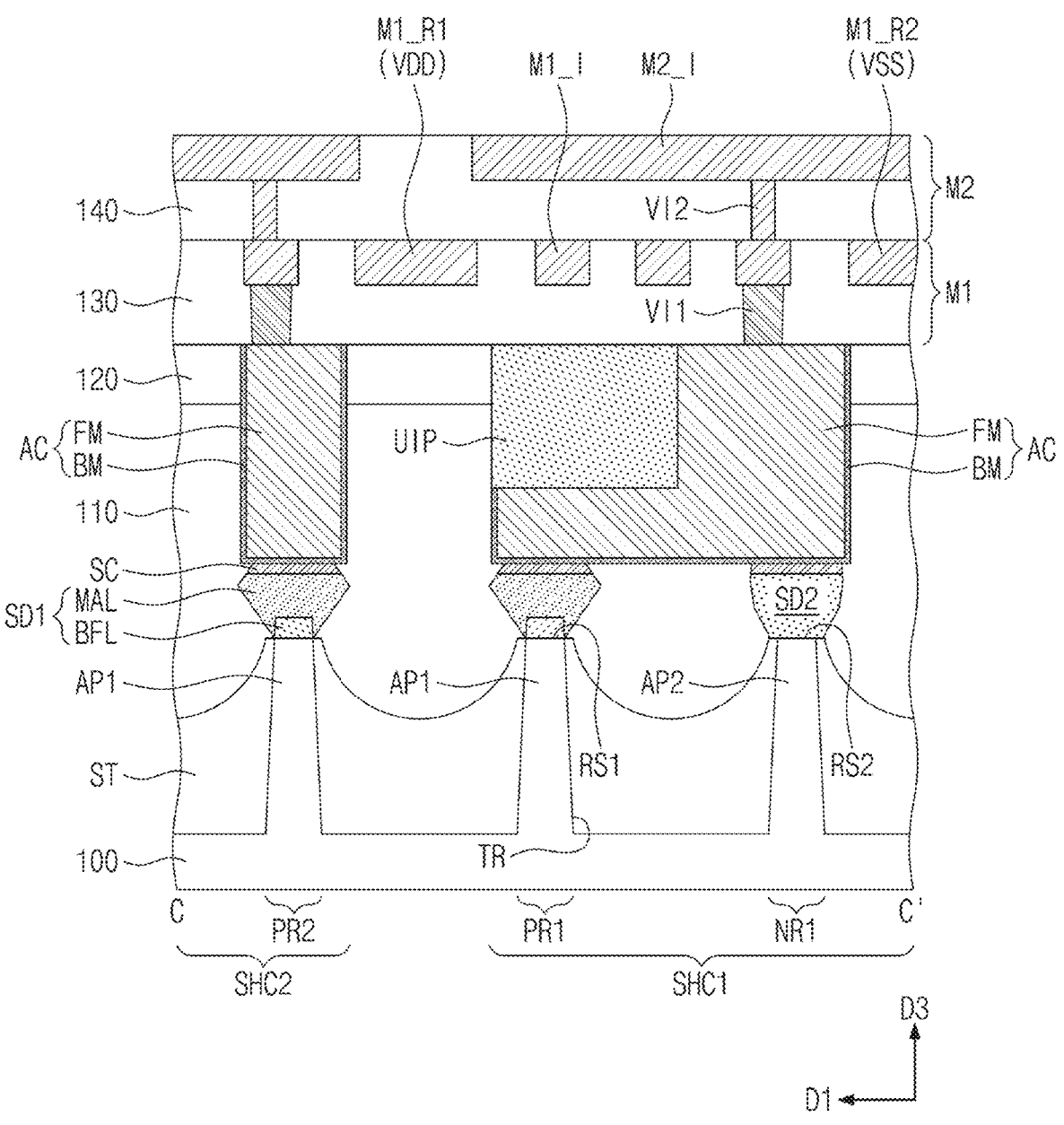
Figure 19D:
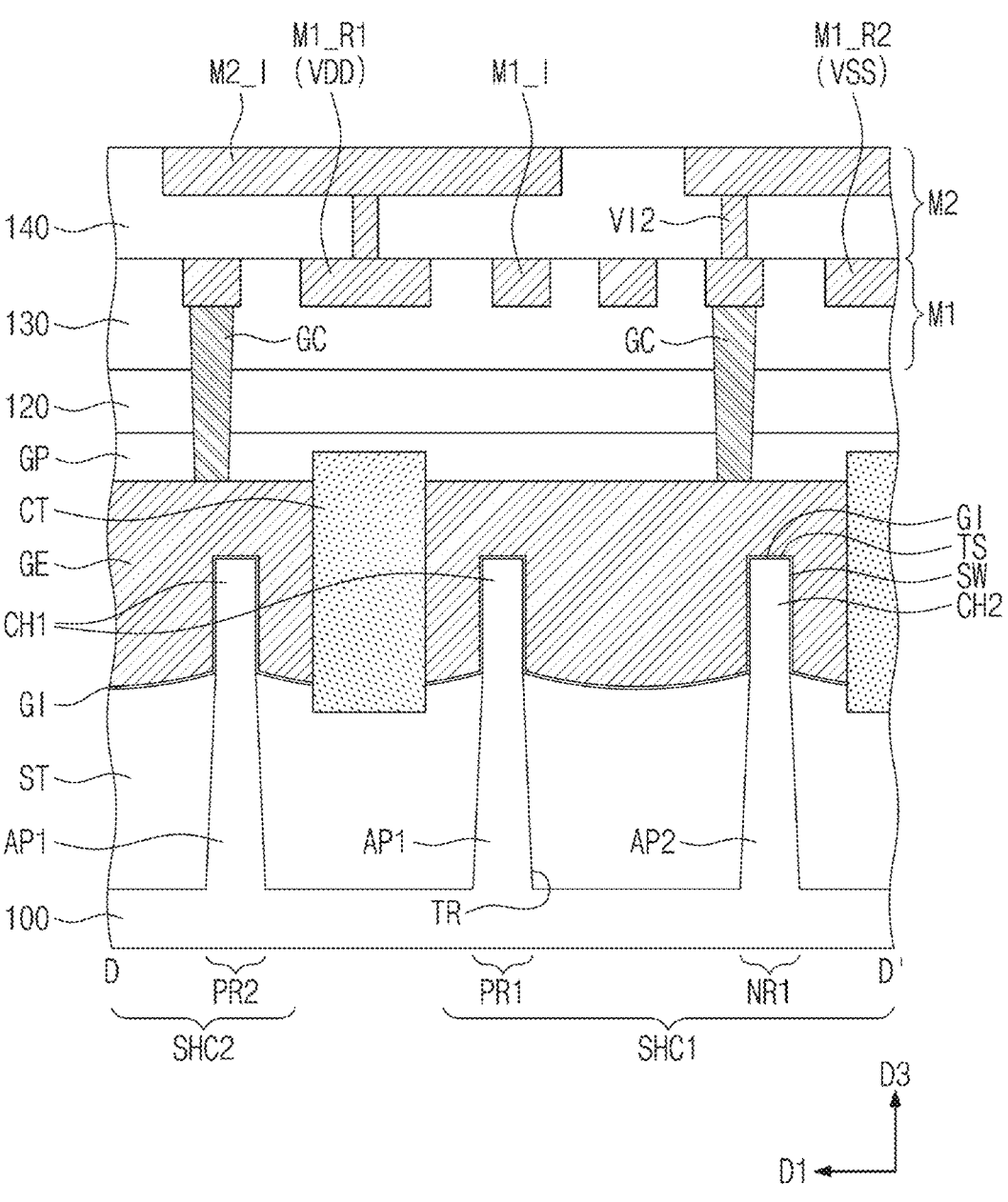

FIGS. 16, 17, and 18 are plan views, each of which illustrates a semiconductor device according to some example embodiments of the inventive concepts. In the description of the following example embodiments, elements previously described with reference to FIGS. 4, 5, and 6A to 6F may be identified by the same reference numbers without repeating overlapping descriptions thereof.

Referring to FIG. 16, the connection structure CNP on each of the first and second block border regions CBR1 and CBR2 may be extended in the second direction D2. The connection structure CNP may connect a plurality of gate electrodes GE, which are arranged in the second direction D2, to each other. The outer side surface OSW of the connection structure CNP may have a line shape, which is extended in the second direction D2. In the present example embodiment, the connection structure CNP may be a single supporter that is used to support all or some of the gate electrodes GE.

Referring to FIG. 17, the connection structure CNP may be provided on the cell disposing region CPR. The connection structure CNP may connect adjacent ones of the first and second gate electrodes GE1 and GE2 to each other. When viewed in a plan view, the connection structure CNP may have a shape of letter H. In the present example embodiment, each of the gate electrodes GE may have opposite ends, which are placed on the first and second block border regions CBR1 and CBR2, respectively. In other words, the connection structure CNP may be omitted from the first and second block border regions CBR1 and CBR2. In an example embodiment, the connection structure CNP may be formed on the cell disposing region CPR of FIG. 17 as well as the first and second block border regions CBR1 and CBR2.

Referring to FIG. 18, a first connection structure CNP1 may be provided on the first block border region CBR1, and a second connection structure CNP2 may be provided on the second block border region CBR2. The first to third gate electrodes GE1, GE2, and GE3 may be sequentially arranged in the second direction D2. The first connection structure CNP1 may connect the first and second gate electrodes GE1 and GE2 to each other. The second connection structure CNP2 may connect the second and third gate electrodes GE2 and GE3 to each other. Thus, no connection structure may be formed at a position of the second block border region CBR2 which is opposite to the first connection structure CNP1, and no connection structure may be formed at a position of the first block border region CBR1 which is opposite to the second connection structure CNP2.

FIGS. 19A to 19D are sectional views, which are respectively taken along lines A-A', B-B', C-C', and D-D' of FIG. 5 to illustrate a semiconductor device according to an example embodiment of the inventive concepts. For concise description, elements previously described with reference to FIGS. 5 and 6A to 6D may be identified by the same reference numbers without repeating overlapping descriptions thereof.

Referring to FIGS. 5 and 19A to 19D, the device isolation layer ST may define the first and second active patterns AP1 and AP2 in an upper portion of the substrate 100. The first active pattern AP1 may be defined on each of the first PMOSFET region PR1 and the second PMOSFET region PR2, and the second active pattern AP2 may be defined on the first NMOSFET region NR1.

The device isolation layer ST may cover a lower side surface of each of the first and second active patterns AP1 and AP2. An upper portion of each of the first and second active patterns AP1 and AP2 may be a protruding pattern, which is vertically extended above the device isolation layer ST (e.g., see FIG. 19D).

The first active pattern AP1 may include the first source/drain patterns SD1, which are provided in an upper portion thereof, and the first channel pattern CH1, which is provided between the first source/drain patterns SD1. The second active pattern AP2 may include the second source/drain patterns SD2, which are provided in an upper portion thereof, and the second channel pattern CH2, which is provided between the second source/drain patterns SD2.

Referring back to FIG. 19D, each of the first and second channel patterns CH1 and CH2 may not include the stack of the first to third semiconductor patterns SP1, SP2, and SP3 previously described with reference to FIGS. 6A to 6D. Each of the first and second channel patterns CH1 and CH2 may be shaped like a single semiconductor pillar that protrudes above the device isolation layer ST (e.g., see FIG. 19D).

The gate electrode GE may be provided on the top surface TS and the opposite side surfaces SW of each of the first and second channel patterns CH1 and CH2. In other words, the transistor according to the present example embodiment may be a three-dimensional field-effect transistor (e.g., Fin-FET), in which the gate electrode GE is provided to three-dimensionally surround the channel patterns.

The first interlayer insulating layer 110 and the second interlayer insulating layer 120 may be provided on the substrate 100. The active contacts AC may be provided to penetrate the first and second interlayer insulating layers 110 and 120 and may be connected to the first and second source/drain patterns SD1 and SD2, respectively. The first via VI1 may be provided on the active contact AC. The gate contact GC may be provided to penetrate the second interlayer insulating layer 120 and the gate capping pattern GP and to be connected to the gate electrode GE. The active contact AC, the gate contact GC, and the first via VI1 may be configured to have the same or substantially similar features as those described with reference to FIGS. 5 and 6A to 6D.

The third interlayer insulating layer 130 and the fourth interlayer insulating layer 140 may be provided on the second interlayer insulating layer 120. The first metal layer M1 may be provided in the third interlayer insulating layer 130. The second metal layer M2 may be provided in the fourth interlayer insulating layer 140. The first and second metal layers M1 and M2 may be configured to have substantially the same features as those described with reference to FIGS. 5 and 6A to 6D.

Figure 20:
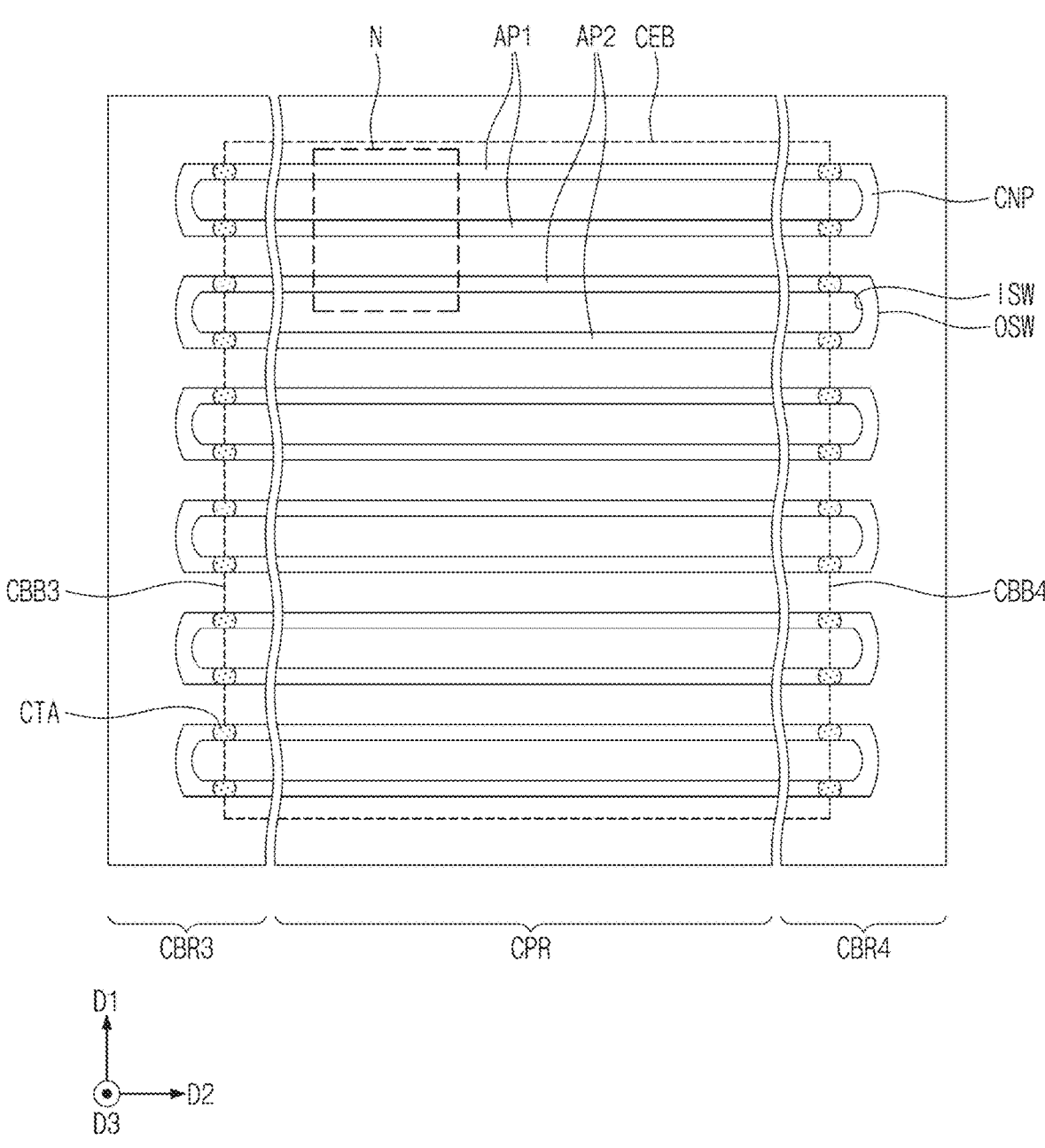
FIGS. 20 and 21 are plan views, each of which illustrates a semiconductor device according to some example embodiments of the inventive concepts.
Figure 21:
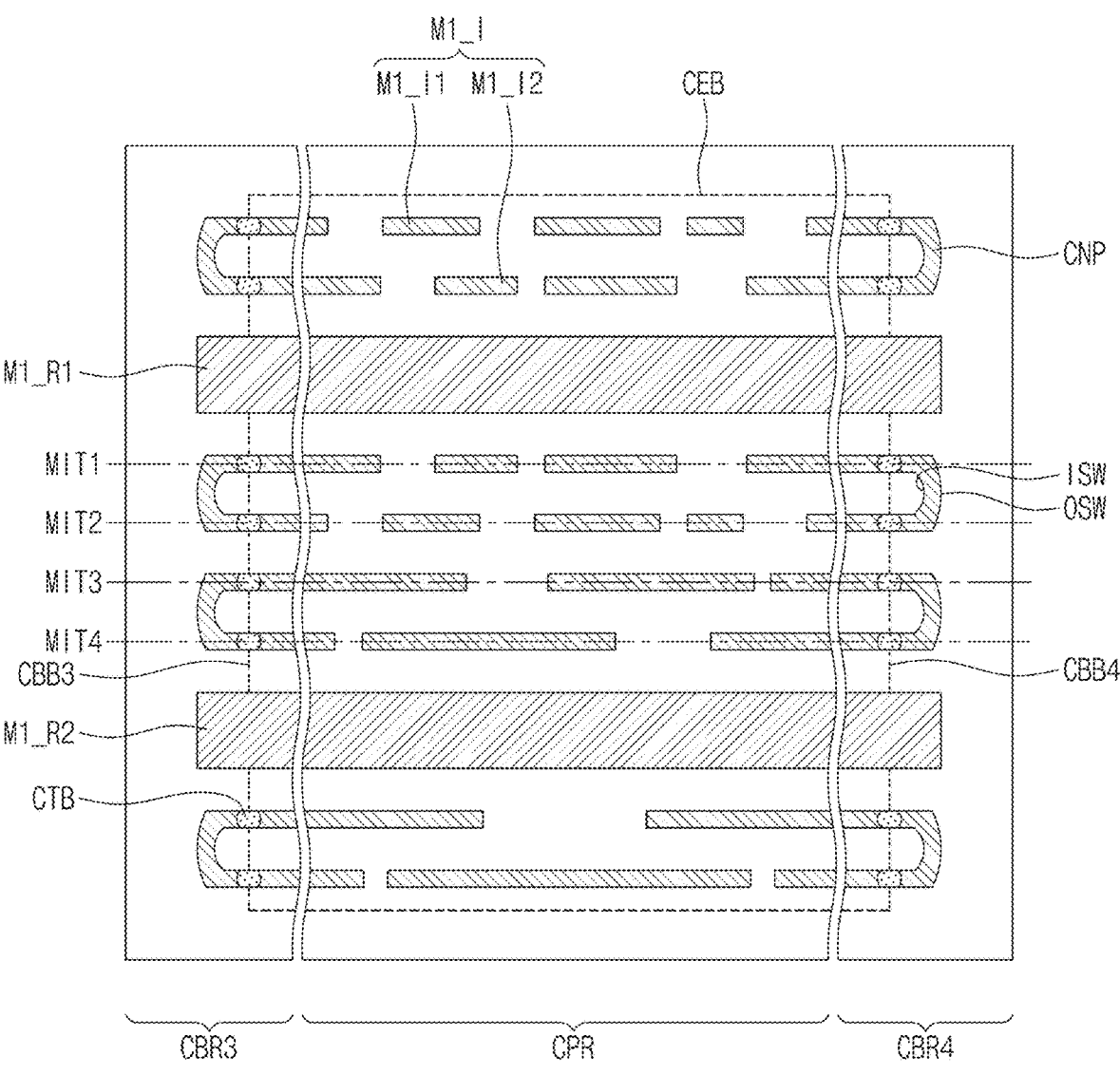

FIGS. 20 and 21 are plan views, each of which illustrates a semiconductor device according to some example embodiments of the inventive concepts. In the description of the following example embodiments, elements previously described with reference to FIGS. 4, 5, and 6A to 6F may be identified by the same reference numbers without repeating overlapping descriptions thereof.

Referring to FIG. 20, the cell block CEB may include the cell disposing region CPR and third and fourth block border regions CBR3 and CBR4, which are provided at both sides of the cell disposing region CPR and, respectively. The third block border region CBR3 and the fourth block border region CBR4 may be opposite to each other in the second direction D2, with the cell disposing region CPR interposed therebetween. The logic cells described above may be two-dimensionally disposed in the cell disposing region CPR.

A plurality of first and second active patterns AP1 and AP2 may be provided on the cell block CEB. The first and second active patterns AP1 and AP2 may be defined by the trench TR formed on the upper portion of the substrate 100 as described above (see FIG. 6C). Each of the first and second active patterns AP1 and AP2 may be the upper portion of the substrate 100 protruding in the form of a fin.

The first and second active patterns AP1 and AP2 may be extended parallel to each other in the second direction D2. The first and second active patterns AP1 and AP2 may be arranged along the first direction D1 at a specific pitch. The first and second active patterns AP1 and AP2 may be extended from the third block border region CBR3 to the fourth block border region CBR4.

In an example embodiment, a connection structure CNP may be provided for connecting a pair of adjacent first active patterns AP1 on a third block border region CBR3. The connection structure CNP may connect an end of one of the pair of first active patterns AP1 to an end of the other one of the pair of first active patterns AP1. The connection structure CNP may have a clip shape.

A third block boundary CBB3 may be located within the third block border region CBR3. On the third block boundary CBB3, a first cutting pattern CTA may be provided that penetrates each of the first active patterns AP1. The connection structure CNP may be located outside the third block boundary CBB3. The connection structure CNP may connect a pair of adjacent first cutting patterns CTA to each other. In an example embodiment, the first cutting patterns CTA may be omitted.

Similar to the foregoing, the connection structure CNP may be provided for connecting adjacent second active patterns AP2 on the third block border region CBR3.

On the fourth block border region CBR4, the connection structure CNP may be provided connecting a pair of adjacent first active patterns AP1. The connection structure CNP may connect an opposite end of one of the pair of first patterns AP1 to an opposite end of the other one of the pair of first active patterns AP1. The connection structure CNP on the fourth block border region CBR4 may have the same shape as the connection structure CNP on the third block border region CBR3.

A fourth block boundary CBB4 may be located within the fourth block border region CBR4. On the fourth block boundary CBB4, a first cutting pattern CTA may be provided that penetrates each of the first active patterns AP1. The connection structure CNP may be located outside the fourth block boundary CBB4. The connection structure CNP may connect a pair of adjacent first cutting patterns CTA to each other. In an example embodiment, the first cutting patterns CTA may be omitted.

Similar to the foregoing, a connection structure CNP may be provided for connecting adjacent second active patterns AP2 on the fourth block border region CBR4.

The connection structure CNP connecting the active patterns AP1 and AP2 may have a rounded shape. The connection structure CNP may include an inner side surface ISW and an outer side surface OSW opposite each other. The specific description of the connection structure CNP may be substantially the same or similar as described above with reference to FIG. 5.

The first and second active patterns AP1 and AP2 may have a line-and-space pattern as with the gate electrodes GE described above. In order to improve the structural stability of the first and second active patterns AP1 and AP2, they may also be formed in the same way as the gate electrodes GE described above.

In an example embodiment, the N region of FIG. 20 may correspond to the cell disposing region CPR shown in FIG. 5.

Referring to FIG. 21, a plurality of first interconnection line M1_I may be provided on the cell block CEB. The first interconnection line M1_I may be provided in the first metal layer M1 as described above (see FIG. 6C). Each of the first interconnection line M1_I may be a conductive pattern having a line form or a bar shape.

The first interconnection line M1_I may extend parallel to each other in the second direction D2. For example, the first interconnection line M1_I may be arranged along the first direction D1 at a constant pitch between the first power wiring M1_R1 and the second power wiring M1_R2.

The first to fourth wiring tracks MIT1-MIT4 may be defined between the first power wiring M1_R1 and the second power wiring M1_R2. The first to fourth wiring tracks MIT1-MIT4 may be extended in the second direction D2. The first to fourth wiring tracks MIT1-MIT4 may be arranged at a constant pitch along the first direction D1. The first to fourth wiring tracks MIT1-MIT4 may be extended from the third block border region CBR3 to the fourth block border region CBR4.

In an example embodiment, the first interconnection lines M1_I may include a first sub interconnection line M1_I1 and a second sub interconnection line M1_I2 adjacent to each other in the first direction D1. A plurality of first sub interconnection lines M1_I1 may be disposed on the first interconnection line track MIT1. A plurality of second sub interconnection lines M1_I2 may be disposed on the second interconnection line track MIT2.

A plurality of first sub interconnection lines M1_I1 may be disposed on the third interconnection line track MIT3. A plurality of second sub interconnection lines M1_I2 may be disposed on the fourth interconnection line track MIT4.

In an example embodiment, a connection structure CNP may be provided for connecting the first sub interconnection line M1_I1 and the second sub interconnection line M1_I2 adjacent to each other on the third block border region CBR3. The connection structure CNP may connect an end of the first sub interconnection line M1_I1 to an end of the second sub interconnection line M1_I2. The connection structure CNP may have a clip shape.

A third block boundary CBB3 may be located within the third block border region CBR3. On the third block boundary CBB3, a second cutting pattern CTB may be provided that penetrates each of the first and second sub interconnection lines M1_I1 and M1_I2. The connection structure CNP may be located outside the third block boundary CBB3. The connection structure CNP may connect a pair of adjacent second cutting patterns CTB to each other. In an example embodiment, the second cutting patterns CTB may be omitted.

On the fourth block border region CBR4, a connection structure CNP may be provided for connecting the first sub interconnection line M1_I1 and the second sub interconnection line M1_I2 adjacent to each other. The connection structure CNP may connect an opposite end of the first sub interconnection line M1_I1 to an opposite end of the second sub interconnection line M1_I2. The connection structure CNP on the fourth block border region CBR4 may have the same shape as the connection structure CNP on the third block border region CBR3.

A fourth block boundary CBB4 may be located within the fourth block border region CBR4. On the fourth block boundary CBB4, a second cutting pattern CTB may be provided that penetrates each of the first and second sub interconnection line M1_I1 and M1_I2. The connection structure CNP may be located outside the fourth block boundary CBB4. The connection structure CNP may connect a pair of adjacent second cutting patterns CTBs to each other. In an example embodiment, the second cutting patterns CTB may be omitted.

The connection structure CNP connecting the first and second sub interconnection lines M1_I1 and M1_I2 may have a rounded shape. The connection structure CNP may include an inner side surface ISW and an outer side surface OSW opposite each other. The specific description of the connection structure CNP may be substantially the same or similar as described with reference to FIG. 5 above.

The first interconnection lines M1_I may have a line-and-space pattern as well as the gate electrodes GE described above. In order to improve the structural stability of the first interconnection lines M1_I, they may also be formed in the same way as the gate electrodes GE described above.

Through the above-described embodiments, it has been illustrated that the connection structure CNP of the present invention can be applied to active patterns AP1 and AP2 and/or first interconnection lines M1_I. However, the present invention is not limited thereto, and can be applied to all line-and-space patterns provided in the semiconductor device. For example, the connection structure CNP may also be applied to interconnection lines in other metal layers (e.g., M2, M3, M4, M5, and so forth).

According to embodiments of the present invention, the structure of the active patterns AP1 and AP2 and the connection structure CNP of FIG. 20 may be modified to resemble any one of FIGS. 16, 17 and 18. The structure of the first interconnection lines M1_I and the connection structure CNP of FIG. 21 may be modified to resemble any one of FIGS. 16, 17 and 18.

According to some example embodiments of the inventive concepts, a connection structure may be provided to connect adjacent ones of gate electrodes to each other. The connection structure may support the gate electrodes having a small linewidth and thus may mechanically mitigate or prevent the gate electrodes from collapsing. Accordingly, it may be possible to reduce a process defect in a semiconductor device according to some example embodiments of the inventive concepts and to improve reliability characteristics of semiconductor device.

According to some example embodiments of the inventive concepts, because the gate electrodes and the connection structure are formed simultaneously using an EUV lithography process, it may be possible to simplify a fabrication process and to improve uniformity in electric characteristics of the semiconductor device.

While some example embodiments of the inventive concepts have been particularly shown and described, it will be understood by one of ordinary skill in the art that variations in form and detail may be made therein without departing from the spirit and scope of the attached claims.

What is claimed is:

1. A semiconductor device, comprising:
   a substrate including a cell disposing region and a first block border region;
   a plurality of gate electrodes on the cell disposing region and extending to the first block border region in a first direction, the plurality of gate electrodes being parallel to each other, the plurality of gate electrodes comprising a first gate electrode and a second gate electrode, which are adjacent to each other; and
   a first connection structure on the first block border region,
   wherein the first connection structure is configured to physically connect the first gate electrode and the second gate electrode to each other,
   the first connection structure comprises a rounded inner side surface and a rounded outer side surface,
   the rounded outer side surface comprises a first outer side surface, a second outer side surface, and a third outer side surface,
   the first outer side surface extends in a second direction crossing the first direction,
   the third outer side surface extends in the first direction,
   the second outer side surface connects the first outer side surface to the third outer side surface,
   the first outer side surface has a first length,
   a distance between the first gate electrode and the second gate electrode is a first pitch, and
   a ratio of the first length to the first pitch ranges from 0.87 to 1.

2. The semiconductor device of claim 1, wherein a minimum distance between the first outer side surface and the rounded inner side surface in the first direction is a second length,
   a length of the second outer side surface in the first direction is a third length, and
   a ratio of the third length to the second length ranges from 0.44 to 0.49.

3. The semiconductor device of claim 1, wherein the first length ranges from 47 nm to 53 nm.

4. The semiconductor device of claim 1, wherein a curvature radius of the rounded outer side surface is larger than a curvature radius of the rounded inner side surface.

5. The semiconductor device of claim 1, further comprising:

a second connection structure on a second block border region of the substrate, wherein the plurality of gate electrodes further comprises a third gate electrode adjacent to the second gate electrode, and the second connection structure is configured to physically connect the second gate electrode and the third gate electrode to each other.

6. The semiconductor device of claim 1, wherein the first gate electrode, the second gate electrode, and the first connection structure include a same metallic material.

7. The semiconductor device of claim 1, further comprising:

a first gate cutting pattern between the first gate electrode and the first connection structure; and a second gate cutting pattern between the second gate electrode and the first connection structure, wherein the first gate cutting pattern and the second gate cutting pattern are placed on a block border in the first block border region.

8. The semiconductor device of claim 7, wherein the first connection structure is placed outside the block border.

9. The semiconductor device of claim 1, further comprising:

an active pattern on the cell disposing region; and channel patterns and source/drain patterns on the active pattern, wherein the plurality of gate electrodes are on the channel patterns, respectively.

10. The semiconductor device of claim 9, wherein the active pattern comprises nanosheets, which are stacked, wherein each of the plurality of gate electrodes comprises an inner electrode interposed between the nanosheets, and an outer electrode on the nanosheets.

11. A semiconductor device, comprising:

a substrate including a cell disposing region and a block border region;

an active pattern on the cell disposing region;

channel patterns and source/drain patterns on the active pattern;

gate electrodes on the channel patterns, respectively, the gate electrodes extending from the cell disposing region to the block border region; and a connection structure on the block border region, wherein the connection structure is configured to physically connect the gate electrodes to each other, the connection structure comprises a rounded inner side surface and a rounded outer side surface, and a curvature radius of the rounded outer side surface is larger than a curvature radius of the rounded inner side surface.

12. The semiconductor device of claim 11, wherein the connection structure comprises a same metallic material as the gate electrodes.

13. The semiconductor device of claim 11, further comprising:

gate spacers on opposite side surfaces of each of the gate electrodes, wherein the gate spacers extend along the gate electrodes and are on the rounded outer side surface and the rounded inner side surface, respectively.

14. The semiconductor device of claim 11, further comprising:

gate cutting patterns between the connection structure and the gate electrodes, respectively, wherein the gate cutting patterns are configured to electrically separate the connection structure from the gate electrodes.

15. The semiconductor device of claim 11, further comprising:

gate contacts electrically connected to the gate electrodes, respectively;

active contacts electrically connected to the source/drain patterns, respectively; and a metal layer on the gate contacts and the active contacts.

16. A semiconductor device, comprising:

a substrate including a cell disposing region and a block border region, the cell disposing region comprising a PMOSFET region and an NMOSFET region;

a first active pattern on the PMOSFET region and a second active pattern on the NMOSFET region;

a first channel pattern and a first source/drain pattern on the first active pattern;

a second channel pattern and a second source/drain pattern on the second active pattern;

a gate electrode extending in a first direction to cross the first channel pattern and the second channel pattern;

a connection structure on the block border region;

a gate insulating layer interposed between the gate electrode and the first channel pattern and the second channel pattern;

gate spacers on opposite side surfaces of the gate electrode, respectively;

a gate capping pattern on a top surface of the gate electrode;

a gate cutting pattern penetrating the gate electrode;

a gate contact electrically connected to the gate electrode;

an active contact electrically connected to at least one of the first source/drain pattern and the second source/drain pattern;

a first metal layer on the gate contact and the active contact, the first metal layer comprising first interconnection lines, the first interconnection lines connected to the gate contact and the active contact, respectively; and a second metal layer on the first metal layer, wherein the second metal layer comprises second interconnection lines, the second interconnection lines electrically connected to the first interconnection lines, the gate electrode comprises a first gate electrode and a second gate electrode, which are adjacent to each other, the connection structure is configured to physically connect the first gate electrode and the second gate electrode to each other, the connection structure comprises a rounded inner side surface and a rounded outer side surface, and the gate spacers extend along the first gate electrode and the second gate electrode and are on the rounded outer side surface and the rounded inner side surface, respectively.

17. The semiconductor device of claim 16, wherein a curvature radius of the rounded outer side surface is larger than a curvature radius of the rounded inner side surface.

18. The semiconductor device of claim 16, wherein the rounded outer side surface comprises a first outer side surface, a second outer side surface, and a third outer side surface, the first outer side surface extends in a second direction crossing the first direction, the third outer side surface extends in the first direction, the second outer side surface connects the first outer side surface to the third outer side surface, the first outer side surface has a first length, a distance between the first gate electrode and the second gate electrode is a first pitch, and a ratio of the first length to the first pitch ranges from 0.87 to 1.

19. The semiconductor device of claim 18, wherein a minimum distance between the first outer side surface and the rounded inner side surface is a second length, a length of the second outer side surface in the first direction is a third length, and a ratio of the third length to the second length ranges from 0.44 to 0.49.

20. The semiconductor device of claim 16, wherein the gate cutting pattern comprises:

a first gate cutting pattern between the first gate electrode and the connection structure; and a second gate cutting pattern between the second gate electrode and the connection structure, wherein the first gate cutting pattern and the second gate cutting pattern are configured to electrically separate the connection structure from the first gate electrode and the second gate electrode.

* * * * *